(12) United States Patent
Muto et al.

(10) Patent No.: US 9,024,423 B2
(45) Date of Patent: May 5, 2015

(54) SEMICONDUCTOR DEVICE FOR A DC-DC CONVERTER

(75) Inventors: Akira Muto, Kanagawa (JP); Yuichi Machida, Tokyo (JP); Nobuya Koike, Kanagawa (JP); Atsushi Fujiki, Kanagawa (JP); Masaki Tamura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 577 days.

(21) Appl. No.: 12/767,071

(22) Filed: Apr. 26, 2010

(65) Prior Publication Data

US 2010/0308421 A1    Dec. 9, 2010

(30) Foreign Application Priority Data

Jun. 5, 2009 (JP) ................................ 2009-136611

(51) Int. Cl.
*H01L 23/02* (2006.01)
*H01L 25/07* (2006.01)
(Continued)

(52) U.S. Cl.
CPC ........ *H01L 25/074* (2013.01); *H01L 23/49537* (2013.01); *H01L 23/49562* (2013.01); *H01L 23/49575* (2013.01); *H01L 23/49582* (2013.01); *H01L 21/565* (2013.01); *H01L 2224/32245* (2013.01); *H01L 2224/73253* (2013.01); *H01L 2924/13091* (2013.01); *H01L 2224/33181* (2013.01); *H01L 23/3107* (2013.01)

(58) Field of Classification Search
CPC ................. H01L 2924/00; H01L 2224/49171; H01L 2224/49174; H01L 24/33; H01L 25/074; H01L 23/49562

USPC ................. 257/684, 686, E25.013, E25.006, 257/E25.021, E21.614, 299, 777, E27.137
See application file for complete search history.

(56) References Cited

U.S. PATENT DOCUMENTS 6,882,047 B2    4/2005  Hata et al.
7,485,954 B2    2/2009  Havanur
(Continued)

FOREIGN PATENT DOCUMENTS

CN    101140926 A    3/2008
DE    10301091 A1 *  7/2004
(Continued)

OTHER PUBLICATIONS

English Translation for DE 103 01 091 A1.*
(Continued)

*Primary Examiner* — Kenneth Parker
*Assistant Examiner* — David Chen
(74) *Attorney, Agent, or Firm* — Mattingly & Malur, P.C.

(57) ABSTRACT

A semiconductor chip in which a power MOSFET is placed above a semiconductor chip in which another power MOSFET is formed and they are sealed with an encapsulation resin. The semiconductor chips are so arranged that the upper semiconductor chip does not overlap with a gate pad electrode of the lower semiconductor chip in a plan view. The semiconductor chips are identical in size and the respective source pad electrodes and gate pad electrodes of the lower semiconductor chip and the upper semiconductor chip are identical in shape and arrangement. The lower semiconductor chip and the upper semiconductor chip are arranged with their respective centers displaced from each other. Accordingly, the size of a semiconductor device can be reduced.

23 Claims, 41 Drawing Sheets

(51) Int. Cl.
*H01L 23/495* (2006.01)
*H01L 21/56* (2006.01)
*H01L 23/31* (2006.01)

(56) References Cited

U.S. PATENT DOCUMENTS

| | | |
|---|---|---|
| 2002/0093094 A1* | 7/2002 | Takagawa et al. ............ 257/723 |
| 2006/0175700 A1* | 8/2006 | Kagii et al. .................. 257/706 |
| 2007/0228534 A1 | 10/2007 | Uno et al. |

FOREIGN PATENT DOCUMENTS

| | | |
|---|---|---|
| JP | 2003-124436 A | 4/2003 |
| JP | 2007-266218 A | 10/2007 |
| JP | 2008-235589 A | 10/2008 |

OTHER PUBLICATIONS

English Translation for DE 103 01 091 A1, Jul. 2004.*
Chinese Office Action received in Chinese Application No. 201010198397 dated Jun. 16, 2014.

* cited by examiner

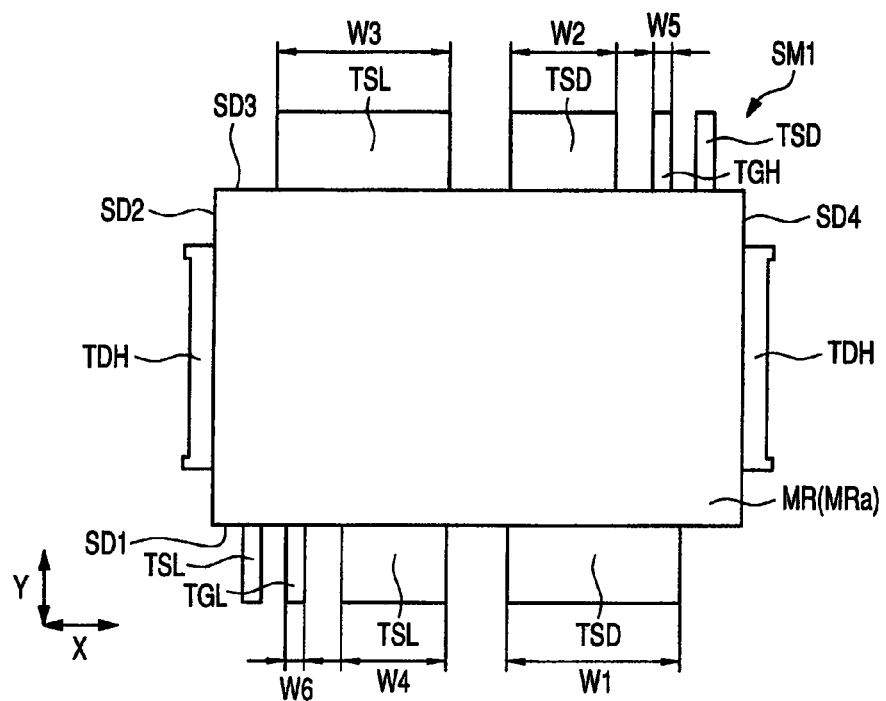
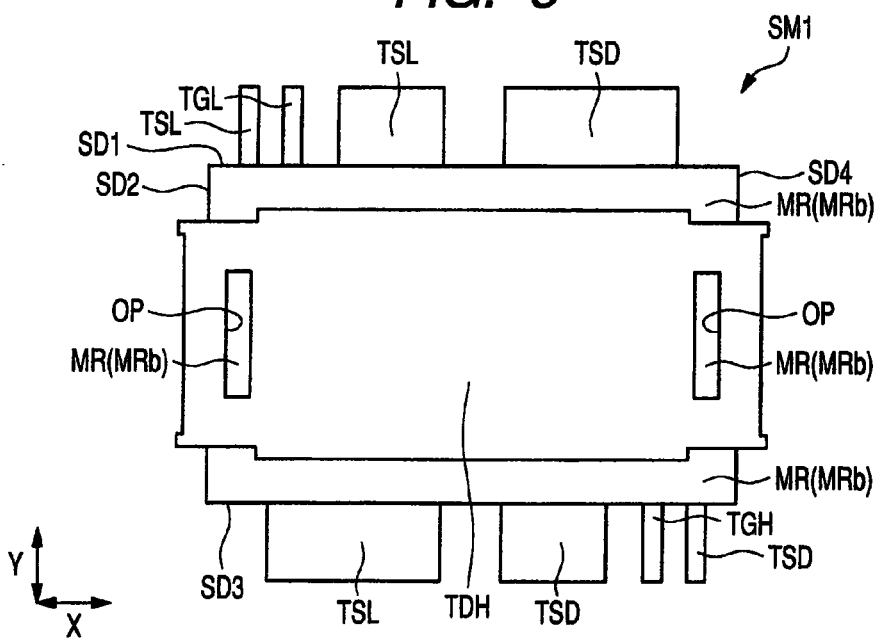

SEMICONDUCTOR DEVICE FOR A DC-DC CONVERTER

CROSS-REFERENCE TO RELATED APPLICATIONS

The disclosure of Japanese Patent Application No. 2009-136611 filed on Jun. 5, 2009 including the specification, drawings and abstract is incorporated herein by reference in its entirety.

BACKGROUND OF THE INVENTION

The present invention relates to semiconductor devices and in particular to a technology effectively applicable to semiconductor devices in the form of a resin sealed semiconductor package.

Various types of semiconductor packages are used and among them, there is a resin sealed semiconductor package in which a semiconductor chip is sealed with an encapsulation resin portion. In resin sealed semiconductor packages, a semiconductor chip is sealed in an encapsulation resin portion; therefore, the reliability of the semiconductor chip can be enhanced. When a terminal is exposed in the back surface of the encapsulation resin portion, the resin sealed semiconductor package can be surface mounted.

To achieve the miniaturization of a power supply circuit or the like and measures for high-speed response, in recent years, the frequency of power MOSFETs (Metal Oxide Semiconductor Field Effect Transistors) used in power supply circuits has been more and more increased. Especially, the CPUs, DSPs, and the like of desktop and notebook personal computers, servers, game machines, and the like are on trends to large current and high frequencies. For this reason, technological development has been promoted so that power MOSFETS comprising non-isolated DC-DC converters for controlling power supplies to these CPUs (Central Processing Units) and DSPs (Digital Signal Processors) can also cope with large current and high frequencies.

In the DC-DC converter in wide use as an example of a power supply circuit, a power MOSFET for high-side switch and a power MOSFET for low-side switch are coupled in series. The power MOSFET for high-side switch has a switch function for control of the DC-DC converter and the power MOSFET for low-side switch has a switch function for synchronous rectification. Power supply voltage is converted by alternately turning on and off these two power MOSFETs in synchronization with each other.

Japanese Unexamined Patent Publication No. 2003-124436 (Patent Document 1) describes a technology related to a semiconductor device obtained by setting the following chips in one sealing body: a chip including the high-side power MOS circuit portion of the DC-DC converter and a chip including the low-side power MOS circuit portion.

Japanese Unexamined Patent Publication No. 2007-266218 (Patent Document 2) describes a technology related to a semiconductor device obtained by encapsulating the following chips in one package: a semiconductor chip in which a power MOSFET for high-side switch is formed; a semiconductor chip in which a power MOSFET for low-side switch is formed; and a semiconductor chip in which a control circuit controlling their operation is formed.

[Patent Document 1] Japanese Unexamined Patent Publication No. 2003-124436

[Patent Document 2] Japanese Unexamined Patent Publication No. 2007-266218

SUMMARY OF THE INVENTION

The investigation by the present inventors has revealed the following:

When multiple power MOSFET chips (semiconductor chips in which a power MOSFET is formed) are used as in, for example, DC-DC converters, a common practice is to individually package the individual power MOSFET chips. In this case, however, a semiconductor package is formed with respect to each power MOSFET chip and, as a result, the number of semiconductor packages used is increased. This increases the mounting area (area required for mounting semiconductor packages) in a mounting board over which these semiconductor packages are mounted. This incurs increase in the size of an electronic device using multiple power MOSFET chips. Since semiconductor packages are coupled together through the wiring of the mounting board, the parasitic inductance of the wiring of the mounting board is increased and this leads to degraded power supply efficiency.

To cope with this, multiple power MOSFET chips could be laterally arranged and packaged. When two power MOSFET chips are laterally arranged and packaged, for example, one semiconductor package is formed for two power MOSFET chips. This makes it possible to reduce the number of semiconductor packages mounted over a mounting board. Since the power MOSFET chips are laterally arranged in this case, however, the plane area of the entire semiconductor packages is increased. For this reason, the mounting area (area required for mounting semiconductor packages) in the mounting board over which the semiconductor packages are mounted is increased and this incurs increase in the size of an electronic device using multiple power MOSFET chips.

For this reason, it is desired to reduce the size (area) of a semiconductor device, obtained by packaging multiple power MOSFET chips, as much as possible.

It is an object of the invention to enhance the characteristics of a semiconductor device and in particular to provide a technology that makes it possible to miniaturize a semiconductor device.

The above and other objects and novel features of the invention will be apparent from the description in this specification and the accompanying drawings.

The following is a brief description of the gist of the representative elements of the invention laid open in this application:

According to an embodiment of the invention, a semiconductor device obtained by placing a second semiconductor chip in which a power MOSFET is formed above a first semiconductor chip in which another power MOSFET is formed and sealing them with resin is provided. The invention is characterized in that the semiconductor chips are so arranged that the second semiconductor chip does not overlap with the electrode for the gate of the first semiconductor chip over the first semiconductor chip.

In the above semiconductor device, it is desirable that the first semiconductor chip and the second semiconductor chip are so arranged that their respective centers are displaced from each other.

In the above semiconductor device, it is desirable that the first semiconductor chip and the second semiconductor chip should be identical in size and their respective electrodes for source and electrodes for gate should be identical in shape and arrangement.

Further, in the above semiconductor device, it is preferable that the power MOSFETs of the first and second semiconductor devices should be respectively used as the high-side MOSFET and low-side MOSFET of a DC-DC converter.

The following is a brief description of the gist of the effect obtained by the representative elements of the invention laid open in this application:

According to a typical embodiment, the characteristics of a semiconductor device can be enhanced.

BRIEF DESCRIPTION OF THE DRAWINGS

FIG. 5 is a top view of a semiconductor device in an embodiment of the invention;

FIG. 6 is a bottom view (back side back view) of a semiconductor device in an embodiment of the invention;

DETAILED DESCRIPTION OF THE PREFERRED EMBODIMENTS

Figure 1:
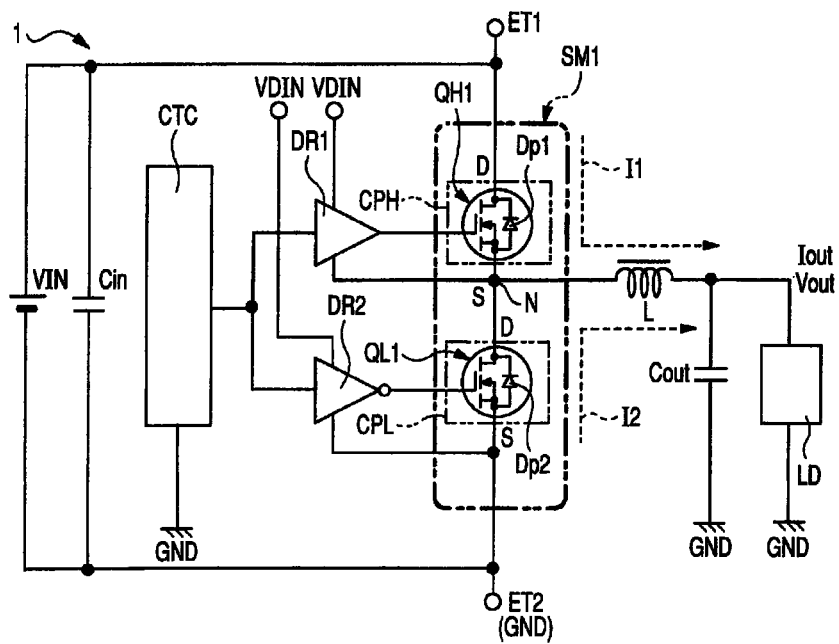
FIG. 1 is a circuit diagram illustrating an example of a DC-DC converter including a semiconductor device in an embodiment of the invention.

In the following description, each embodiment will be divided into multiple sections if necessary for the sake of convenience. Unless explicitly stated otherwise, they are not unrelated to one another and they are in such a relation that one is a modification, details, supplementary explanation, or the like of part or all of the other. When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies and the number may be above or below that specific number. In the following description of embodiments, needless to add, their constituent elements (including elemental steps and the like) are not always indispensable unless explicitly stated otherwise or they are obviously indispensable in principle. Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

Hereafter, detailed description will be given of embodiments of the invention with reference to the drawings. In all the drawings for explaining embodiments, members having the same function will be marked with the same reference numerals and the repetitive description thereof will be omitted. With respect to the following embodiments, description will not be repeated about an identical or similar part unless necessary.

In every drawing used in the description of embodiments, hatching may be omitted to facilitate visualization even though it is a sectional view. Further, hatching may be provided to facilitate visualization even though it is a plan view.

In this specification, a field effect transistor will be described as MOSFET (Metal Oxide Semiconductor Field Effect Transistor) or simply as MOS. However, this is not intended to exclude non-oxide films from gate oxide films.

First Embodiment

<Circuitry of DC-DC Converter>

Description will be given of a semiconductor device in an embodiment of the invention with reference to the drawings.

Figure 2:
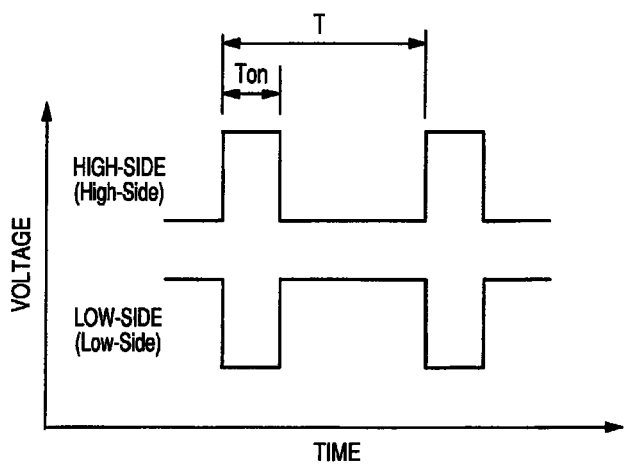
FIG. 2 is a basic operating waveform chart of the DC-DC converter in FIG. 1.

FIG. 1 is a circuit diagram illustrating an example of a DC-DC converter, a non-isolated DC-DC converter (DC-DC converter) 1 in this example, having a semiconductor device (semiconductor package) SM1 in this embodiment of the invention; and FIG. 2 is a basic operating waveform chart of the non-isolated DC-DC converter 1 in FIG. 1.

This non-isolated DC-DC converter 1 is used in the power supply circuit of an electronic device, such as a desktop personal computer, a notebook personal computer, a server, a game machine, or the like. It includes the semiconductor device SM1, two driver circuits (drive circuits) DR1, DR2, a control circuit CTC, an input capacitor Cin, an output capacitor Cout, and a coil L. Reference code VIN denotes input power supply; GND denotes reference potential (for example, ground potential of 0V); Iout denotes output current; and Vout denotes output voltage.

The semiconductor device SM1 includes two power MOSFETs (Metal Oxide Semiconductor Field Effect Transistors: hereafter, simply abbreviated as power MOSs) QH1, QL1. These power MOSFETs QH1, QL1 are sealed (enclosed) in one semiconductor device SM1.

The driver circuits (drive circuits) DR1, DR2 respectively control the potential of the gate terminals of the power MOSs QH1, QL1 according to a pulse width modulation (PWM) signal supplied from the control circuit CTC and thereby control the operation of the power MOSs QH1, QL1. The output of one driver circuit DR1 is electrically coupled to the gate terminal of the power MOS QH1. The output of the other driver circuit DR2 is electrically coupled to the gate terminal of the power MOS QL1. Reference code VDIN denotes the input power supply of each of the driver circuits DR1, DR2.

The power MOSs QH1, QL1 are coupled in series between the following terminals of the input power supply VIN: the terminal (first power supply terminal) ET1 for supplying high potential (first power supply potential) and the terminal (second power supply terminal) ET2 for supplying reference potential (second power supply potential) GND. That is, the power MOS QH1 has its source-drain path coupled in series between the terminal ET1 for high potential supply of the input power supply VIN and an output node (output terminal) N; and the power MOS QL1 has its source-drain path coupled in series between the output node N and the terminal ET2 for reference potential GND supply. Reference code Dp1 denotes the parasitic diode (internal diode) of the power MOS QH1 and Dp2 denotes the parasitic diode (internal diode) of the power MOS QL1. Reference code D denotes the drain of each of the power MOSs QH1, QL1 and S denotes the source of each of the power MOSs QH1, QL1.

The power MOS (field effect transistor, power transistor) QH1 is a field effect transistor for high-side switch (high potential side: first operating voltage; hereafter, simply referred to as high side) and has a switch function for storing energy in the above coil L. The coil L is an element that supplies power to the output of the non-isolated DC-DC converter 1 (the input of a load LD).

This power MOS QH1 for high side is formed in a semiconductor chip (semiconductor chip for high side) CPH. This power MOS QH1 is formed of, for example, an n-channel field effect transistor. In this example, a channel of this field effect transistor is formed in the direction of the thickness of the semiconductor chip CPH. In this case, it is possible to increase the channel width per unit area and reduce on-resistance as compared with the following field effect transistors: field effect transistors whose channel is formed along the main surface of the semiconductor chip CPH (surface orthogonal to the direction of the thickness of the semiconductor chip CPH). Therefore, it is possible to reduce the size of each element and miniaturize the semiconductor device SM1.

Meanwhile, the power MOS (field effect transistor, power transistor) QL1 is a field effect transistor for low-side switch (low potential side: second operating voltage; hereafter, simply referred to as low side). It has a function of reducing the resistance of the transistor in synchronization with a frequency from the control circuit CTC and carries out rectification. That is, the power MOS QL1 is a transistor for rectification of the non-isolated DC-DC converter 1.

This power MOS QL1 for low side is formed in a semiconductor chip (semiconductor chip for low side) CPL different from the semiconductor chip CPH. The power MOS QL1 is formed of, for example, an n-channel power MOS and its channel is formed in the direction of the thickness of the semiconductor chip CPL similarly with the power MOS QH1. The reason why the power MOS whose channel is formed in the direction of the thickness of the semiconductor chip CPL is used is as follows: as indicated by the basic operating waveform of the non-isolated DC-DC converter 1 in FIG. 2, the on-time (time for which voltage is applied) of the power MOS QL1 for low side is longer than the on-time of the power MOS QH1 for high side; it seems that loss due to on-resistance is larger than switching loss. For this reason, the channel width per unit area can be made larger in cases where a field effect transistor whose channel is formed in the direction of the thickness of the semiconductor chip CPL is used than in the following cases: cases where a field effect transistor whose channel is formed along the main surface of the semiconductor chip CPL is used. That is, the on-resistance can be reduced by forming the power MOS QL1 for low side of a field effect transistor whose channel is formed in the direction of the thickness of the semiconductor chip CPL; therefore, the voltage conversion efficiency can be enhanced even though the current passed through the non-isolated DC-DC converter 1 is increased. In FIG. 2, reference code Ton denotes the pulse width of the power MOS QH1 for high side when it is on; and T denotes its pulse period.

The power MOS QH1 for high side can be considered as the high-side MOSFET (MOSFET for high side) of a DC-DC converter (non-isolated DC-DC converter 1 in this example); and the power MOS QL1 for low side can be considered as the low-side MOSFET (MOSFET for low side) of a DC-DC converter (non-isolated DC-DC converter 1 in this example). The above driver circuits DR1, DR2 can be considered as the driver circuits (drive circuits) of the power MOSs QH1, QL1.

The control circuit CTC is a circuit that controls the operation of the power MOSs QH1, QL1 and is comprised of, for example, a PWM (Pulse Width Modulation) circuit. This PWM circuit compares a command signal with the amplitude of a triangular wave and outputs a PWM signal (control signal). The output voltage of the power MOSs QH1, QL1 (that is, the width of the voltage switch on (on-time) of the power MOSs QH1, QL1) is controlled by this PWM signal. (That is, the output voltage of the non-isolated DC-DC converter 1 is controlled by the PWM signal.)

The output of this control circuit CTC is electrically coupled to the input of each of the driver circuits DR1, DR2. The respective outputs of the driver circuits DR1, DR2 are respectively electrically coupled to the gate terminal of the power MOS QH1 and the gate terminal of the power MOS QL1.

The above input capacitor Cin is a power supply that temporarily stores energy (electric charge) supplied from the input power supply VIN and supplies the stored energy to the main circuit of the non-isolated DC-DC converter 1. It is electrically coupled in parallel with the input power supply VIN. The above output capacitor Cout is electrically coupled between output wiring coupling the coil L and the LD and the terminal for supplying reference potential GND.

The wiring of the non-isolated DC-DC converter 1 coupling the source of the power MOS QH1 and the drain of the power MOS QL1 is provided with the above output node N that outputs power supply potential for output to the outside. This output node N is electrically coupled with the coil L through the output wiring and is further electrically coupled with the load LD through the output wiring. Examples of this load LD include hard disk drive (HDD), ASIC (Application Specific Integrated Circuit), FPGA (Field Programmable Gate Array), expansion card (PCI CARD), memory (DDR memory, DRAM (Dynamic RAM), flash memory, and the like), CPU (Central Processing Unit), and the like.

In this non-isolated DC-DC converter 1, power supply voltage is converted by alternately turning on and off the power MOSs QH1, QL1 in synchronization with each other. More specific description will be given. When the power MOS QH1 for high side is on, a current (first current) I1 flows from the terminal ET1 to the output node N through the power MOS QH1. Meanwhile, when the power MOS QH1 for high side is off, a current I2 is passed by the back electromotive voltage of the coil L. Voltage drop can be reduced by turning on the power MOS QL1 for low side while this current I2 is flowing.

<Structure of Semiconductor Device>

Figure 3:
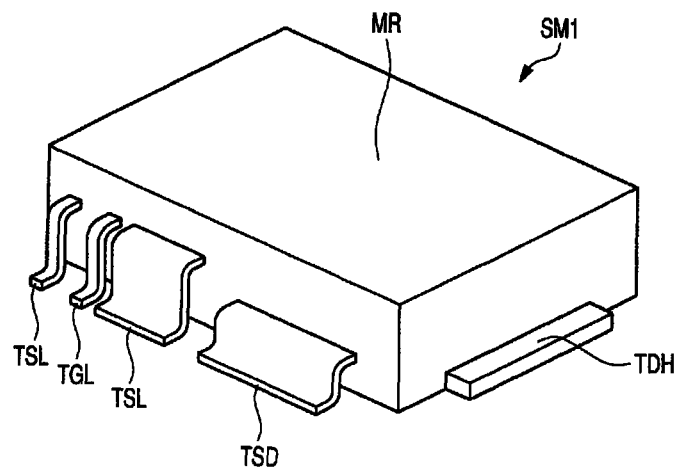
FIG. 3 is a perspective view of a semiconductor device in an embodiment of the invention.
Figure 4:
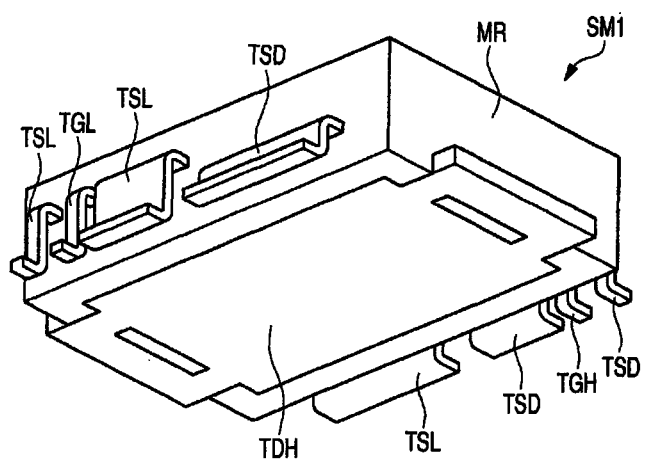
FIG. 4 is a perspective view of a semiconductor device in an embodiment of the invention.
Figure 7:
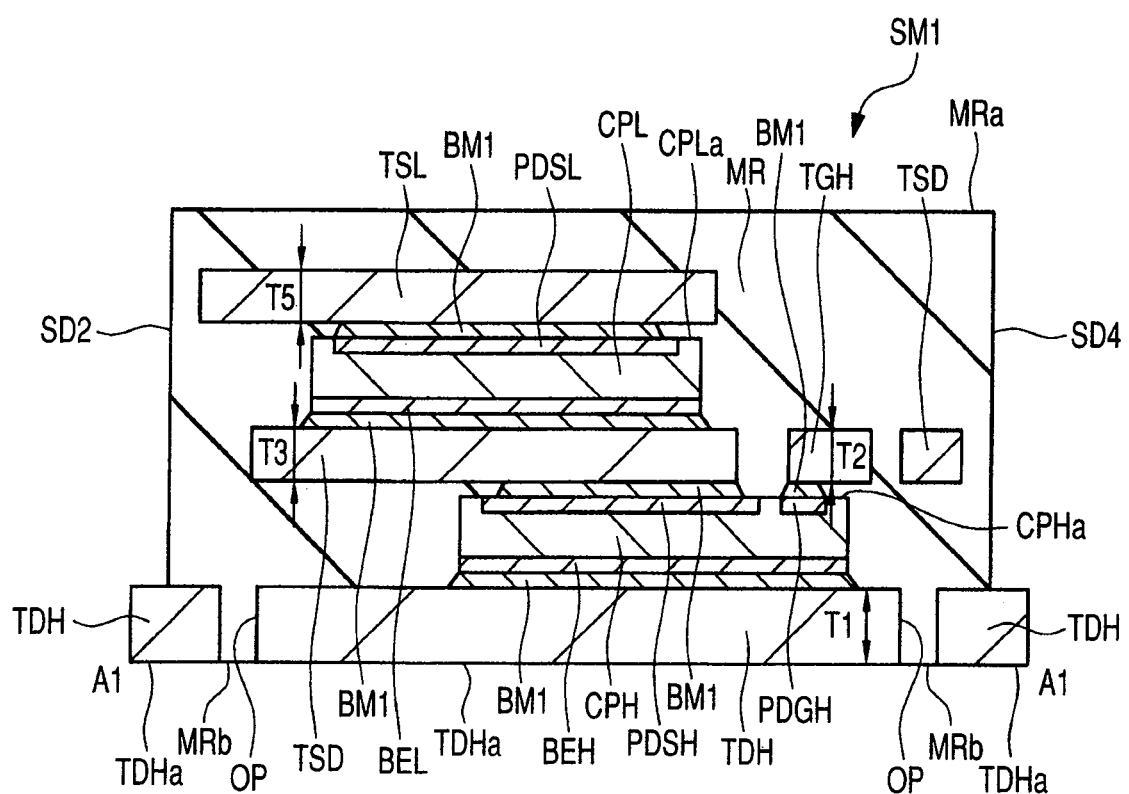
FIG. 7 is a sectional view of a semiconductor device in an embodiment of the invention.
Figure 8:
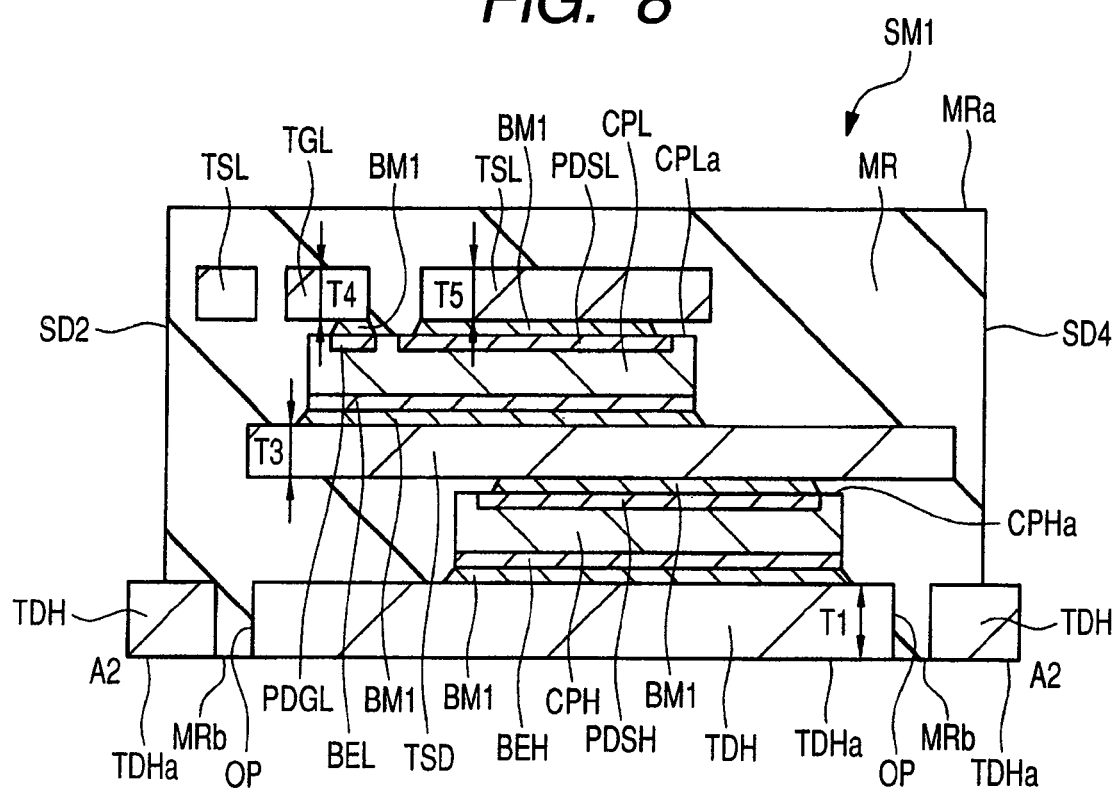
FIG. 8 is a sectional view of a semiconductor device in an embodiment of the invention.
Figure 9:
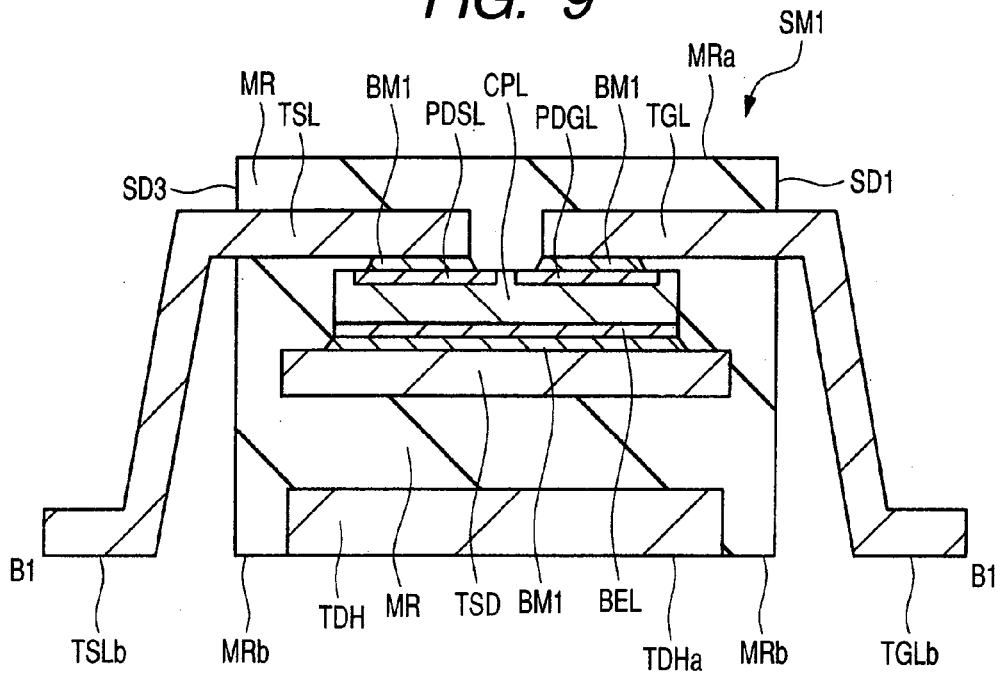
FIG. 9 is a sectional view of a semiconductor device in an embodiment of the invention.
Figure 10:
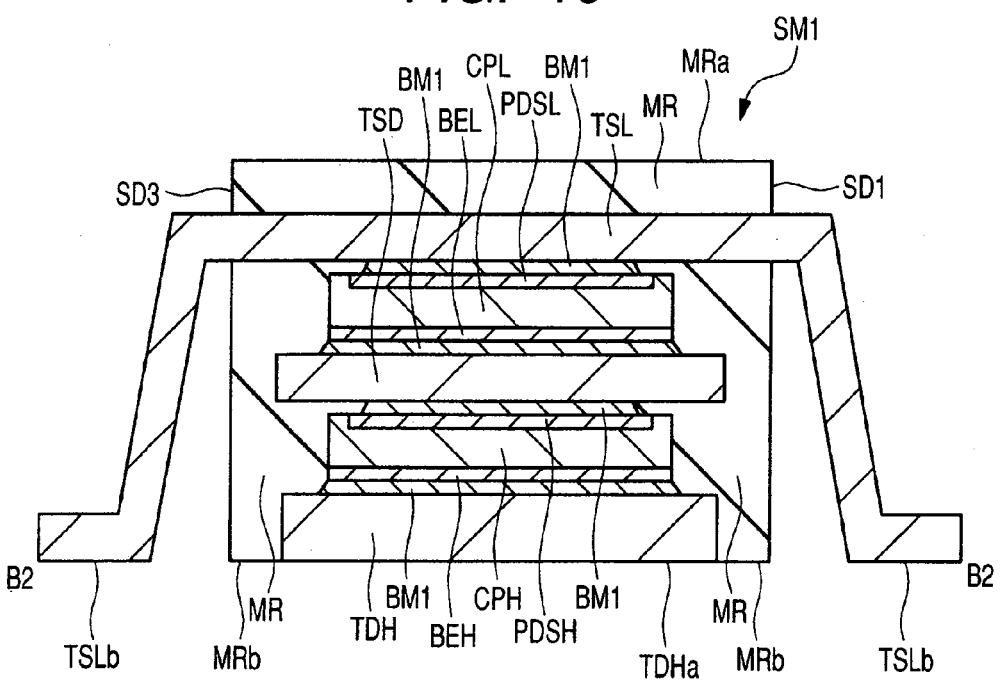
FIG. 10 is a sectional view of a semiconductor device in an embodiment of the invention.
Figure 11:
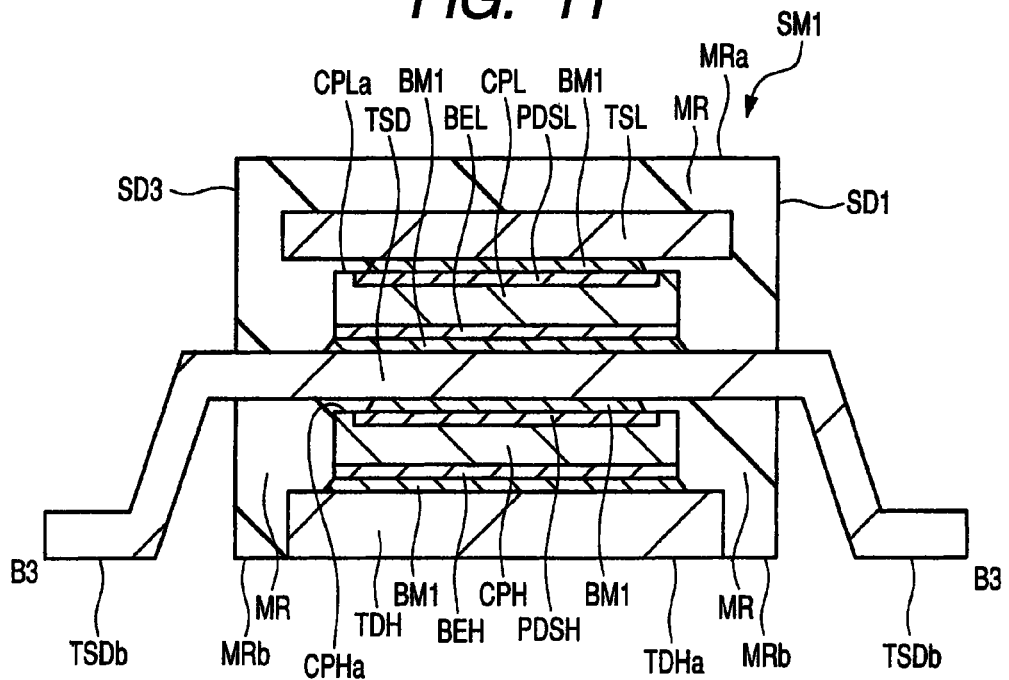
FIG. 11 is a sectional view of a semiconductor device in an embodiment of the invention.
Figure 12:
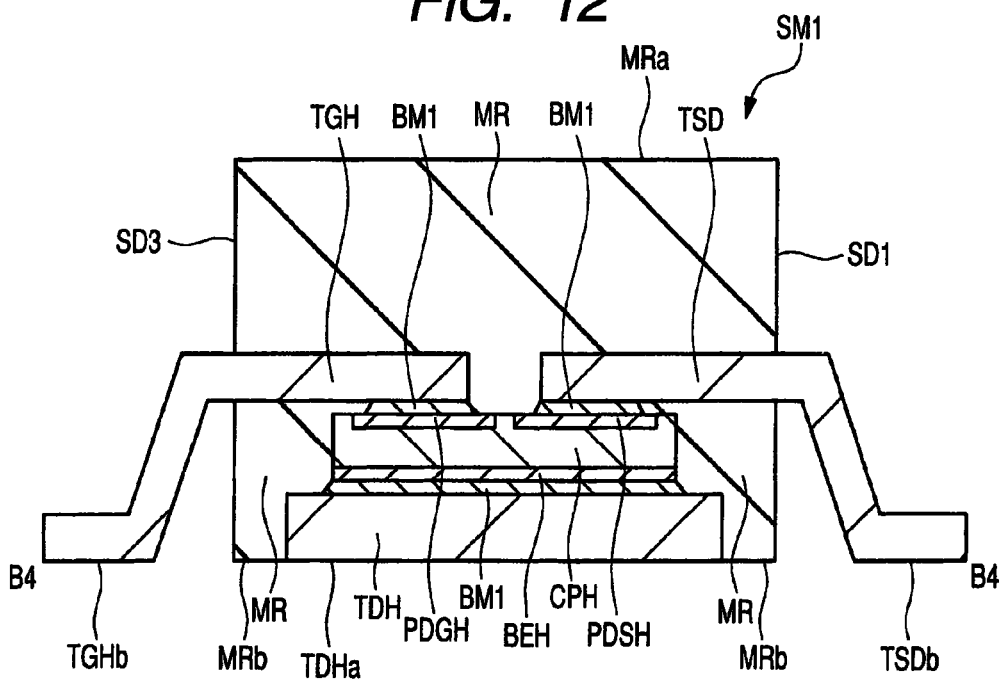
FIG. 12 is a sectional view of a semiconductor device in an embodiment of the invention.
Figure 13:
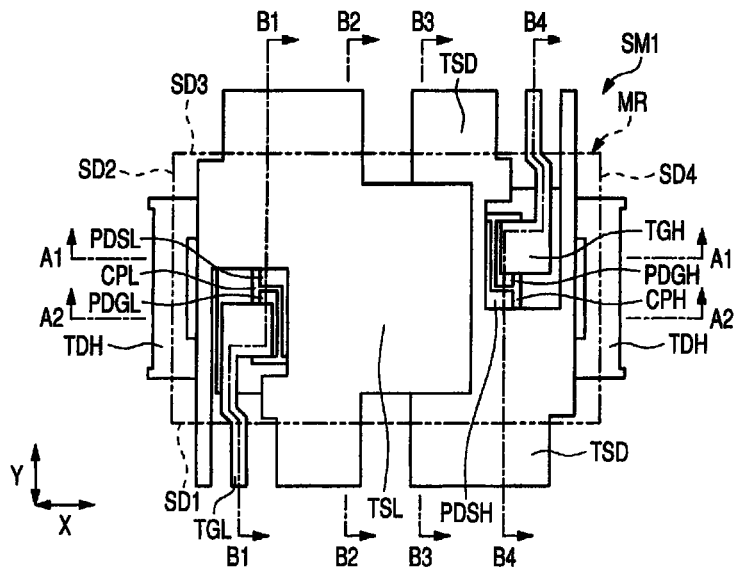
FIG. 13 is a planar transparent view of a semiconductor device in an embodiment of the invention.
Figure 14:
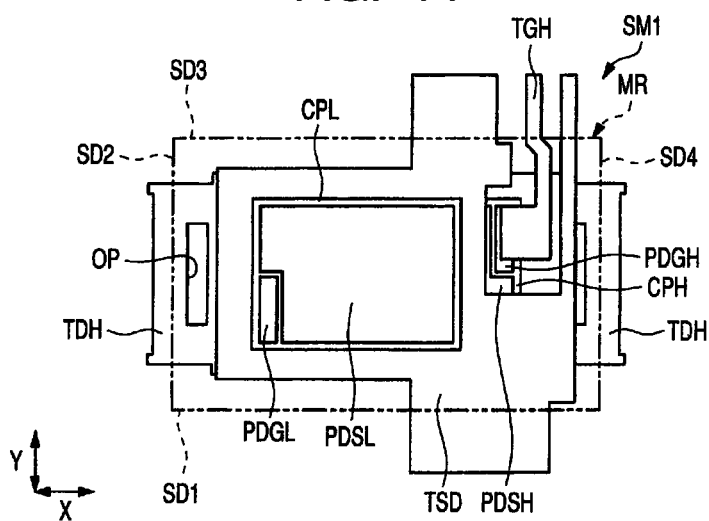
FIG. 14 is a planar transparent view of a semiconductor device in an embodiment of the invention.
Figure 15:
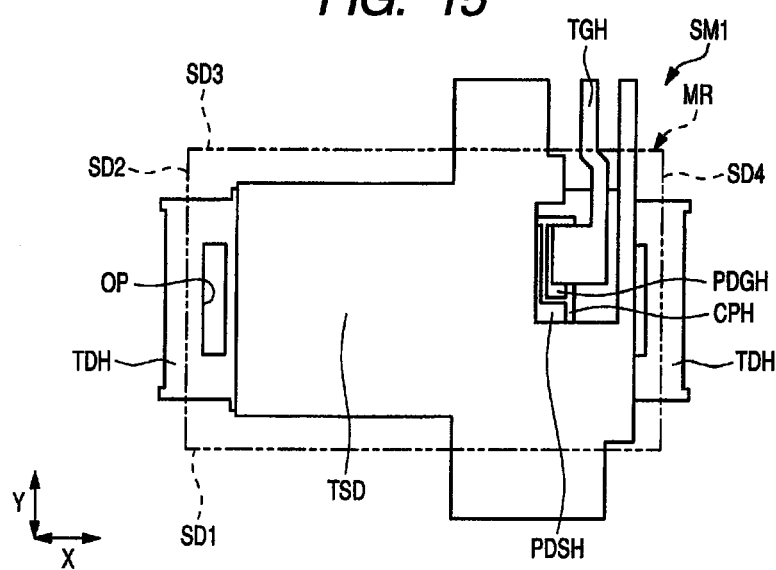
FIG. 15 is a planar transparent view of a semiconductor device in an embodiment of the invention.
Figure 16:
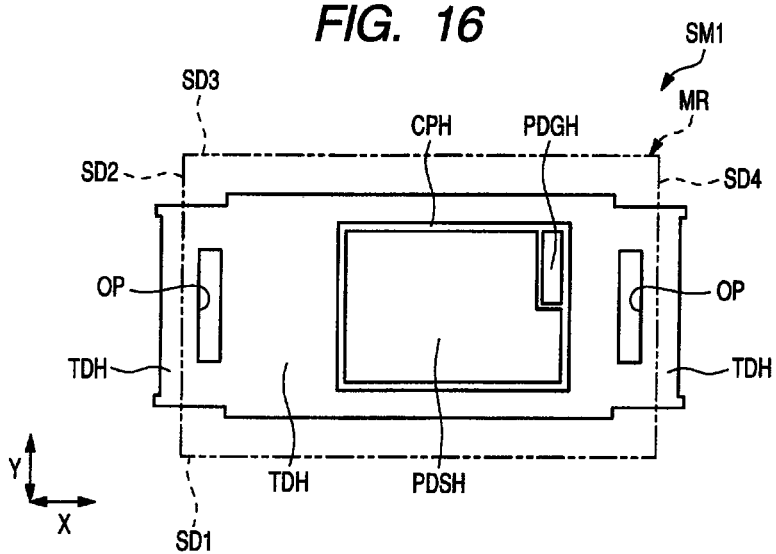
FIG. 16 is a planar transparent view of a semiconductor device in an embodiment of the invention.

FIG. 3 and FIG. 4 are perspective views of the semiconductor device SM1 in this embodiment; FIG. 5 is a top view (plan view) of the semiconductor device SM1; FIG. 6 is a bottom view (bottom plan view, back side back view, plan view) of the semiconductor device SM1; FIG. 7 to FIG. 12 are sectional views (lateral sectional views) of the semiconductor device SM1; and FIG. 13 to FIG. 16 are planar transparent views of the semiconductor device SM1. Among these drawings, FIG. 3 corresponds to a perspective view obtained when the semiconductor device SM1 is obliquely viewed from above; and FIG. 4 corresponds to a perspective view obtained when the semiconductor device SM1 is obliquely viewed from underneath. FIG. 7 substantially corresponds to the section taken along line A1-A1 of FIG. 13; FIG. 8 substantially corresponds to the section taken along line A2-A2 of FIG. 13; FIG. 9 substantially corresponds to the section taken along line B1-B1 of FIG. 13; FIG. 10 substantially corresponds to the section taken along line B2-B2 of FIG. 13; FIG. 11 substantially corresponds to the section taken along line B3-B3 of FIG. 13; and FIG. 12 substantially corresponds to the section taken along line B4-B4 of FIG. 13. FIG. 13 illustrates the semiconductor device SM1 with an encapsulation resin portion MR seen through; FIG. 14 illustrates the semiconductor device SM1 in FIG. 13 with a gate terminal TGL and a source terminal TSL further removed (seen through); FIG. 15 illustrates the semiconductor device SM1 in FIG. 14 with the semiconductor chip CPL further removed (seen through); FIG. 16 illustrates the semiconductor device SM1 in FIG. 15 with agate terminal TGH and a source-drain terminal TSD further removed (seen through). In FIG. 13 to FIG. 16, the outline of the encapsulation resin portion MR is indicated by alternate long and two short dashes line to facilitate understanding. Code X shown in each plan view indicates a first direction and code Y indicates a second direction orthogonal to the first direction X.

The semiconductor device (semiconductor package) SM1 in this embodiment is a resin sealed semiconductor package. That is, the semiconductor device SM1 is a semiconductor device in the form of a resin sealed semiconductor package.

In this embodiment, as mentioned above, the following chips are put together (packaged) in one semiconductor package to obtain one semiconductor device SM1: the semiconductor chip CPH in which the power MOS QH1 as a field effect transistor for high-side switch is formed; and the semiconductor chip CPL in which the power MOS QL1 as a field effect transistor for low-side switch is formed. This makes it possible to achieve miniaturization (area reduction) of the non-isolated DC-DC converter 1 and, in addition, reduce wiring parasitic inductance; therefore, it is also possible to achieve frequency enhancement and efficiency enhancement.

As mentioned above, the semiconductor device SM1 in this embodiment is a semiconductor device including a DC-DC converter (the non-isolated DC-DC converter 1 in this example). In other words, the semiconductor device SM1 is a semiconductor device comprising at least part of a DC-DC converter (the non-isolated DC-DC converter 1 in this example) and includes at least part of the DC-DC converter (the non-isolated DC-DC converter 1 in this example).

Concrete description will be given of the structure of the semiconductor device SM1 with reference to FIG. 3 to FIG. 16.

The semiconductor device SM1 in this embodiment illustrated in FIG. 3 to FIG. 16 includes: the semiconductor chips CPH, CPL; the drain terminal TDH, gate terminals TGL, TGH, source terminal TSL, and source-drain terminal TSD formed of conductor; and the encapsulation resin portion (sealing portion, encapsulation resin) MR sealing them.

The encapsulation resin portion MR is comprised of a resin material, such as thermosetting resin material, and the like and may contain filler or the like. For example, epoxy resin containing filler and the like can be used to form the encapsulation resin portion MR. The semiconductor chips CPH, CPL, gate terminals TGL, TGH, source terminal TSL, drain terminal TDH, and source-drain terminal TSD are sealed and protected by the encapsulation resin portion MR.

The encapsulation resin portion MR has two main surfaces MRa, MRb positioned opposite to each other. The main surface MRa of the encapsulation resin portion MR is the upper surface (front surface) of the encapsulation resin portion MR (refer to FIG. 5); and the main surface MRb of the encapsulation resin portion MR is the back surface (bottom surface, under surface) of the encapsulation resin portion MR. The main surface MRb of the encapsulation resin portion MR, that is, the back surface (bottom surface, under surface) of the semiconductor device SM1 (refer to FIG. 6) is the mounting surface of the semiconductor device SM1.

The planar shape of the encapsulation resin portion MR is rectangular (oblong). As illustrated in FIG. 5 and FIG. 6, it has the following sides as viewed in a plane (that is, as viewed in a plane parallel to the main surface MRb of the encapsulation resin portion MR): sides SD1, SD3 that are parallel to the first direction X and opposed to each other; and sides SD2, SD4 that are parallel to the second direction Y orthogonal to the first direction X and opposed to each other.

The semiconductor chips CPL, CPH are obtained by, for example: forming various semiconductor elements or semiconductor integrated circuits in a semiconductor substrate (semiconductor wafer) comprised of single crystal silicon or the like; grinding the back surface of the semiconductor substrate as required; and then separating the semiconductor substrate into individual semiconductor chips CPL, CPH by dicing or the like. The semiconductor chip CPL and the semiconductor chip CPH are in rectangular planar shape. The semiconductor chips CPL, CPH are sealed in the encapsulation resin portion MR and neither of them is exposed from the encapsulation resin portion MR.

The semiconductor chip (first semiconductor chip) CPH has two main surfaces positioned opposite to each other: a front surface (main surface on the semiconductor element formation side) and a back surface (main surface on the opposite side to the front surface). The semiconductor chip CPH includes: a source pad electrode (front surface electrode) PDSH and a gate pad electrode (front surface electrode) PDGH formed in the front surface of the semiconductor chip CPH; and a back surface drain electrode (back surface electrode) BEH formed in the entire back surface of the semiconductor chip CPH. (Refer to FIG. 7 and the like.) The main surface of the semiconductor chip CPH on the side where the source pad electrode PDSH and the gate pad electrode PDGH are formed will be designated as the front surface CPHa of the semiconductor chip CPH; and the main surface of the semiconductor chip CPH on the back surface drain electrode BEH side will be designated as the back surface (reference code omitted) of the semiconductor chip CPH. The back surface (back surface drain electrode BEH) of the semiconductor chip CPH is opposed to the drain terminal TDH and the front surface CPHa of the semiconductor chip CPH is opposed to the gate terminal TGH and the source-drain terminal TSD.

The back surface drain electrode (first back surface drain electrode) BEH in the back surface of the semiconductor chip CPH is electrically coupled to the drain D of the power MOS QH1 for high side formed in the semiconductor chip CPH. That is, the back surface drain electrode BEH of the semiconductor chip CPH corresponds to the drain electrode of the power MOS QH1 for high side.

The gate pad electrode (first electrode for gate) PDGH in the front surface CPHa of the semiconductor chip CPH is electrically coupled to the gate electrode of the power MOS QH1 for high side formed in the semiconductor chip CPH. That is, the gate pad electrode PDGH of the semiconductor chip CPH corresponds to a pad (bonding pad, pad electrode) for the gate electrode of the power MOS QH1 for high side.

The source pad electrode (first electrode for source) PDSH in the front surface CPHa of the semiconductor chip CPH is electrically coupled to the source S of the power MOS QH1 for high side formed in the semiconductor chip CPH. That is, the source pad electrode PDSH of the semiconductor chip CPH corresponds to a pad (bonding pad, pad electrode) for the source electrode of the power MOS QH1 for high side.

The configuration of the semiconductor chip (second semiconductor chip) CPL is substantially the same as the configuration of the semiconductor chip CPH. More specific description will be given. The semiconductor chip CPL has two main surfaces positioned opposite to each other: a front surface (main surface on the semiconductor element formation side) and a back surface (main surface on the opposite side to the front surface). The semiconductor chip CPL includes: a source pad electrode (front surface electrode) PDSL and a gate pad electrode (front surface electrode) PDGL formed in the front surface of the semiconductor chip CPL; and a back surface drain electrode (back surface electrode) BEL formed in the entire back surface of the semiconductor chip CPL. (Refer to FIG. 7 and the like.) The main surface of the semiconductor chip CPL on the side where the source pad electrode PDSL and the gate pad electrode PDGL are formed will be designated as the front surface CPLa of the semiconductor chip CPL; and the main surface of the semiconductor chip CPL on the back surface drain electrode BEL side will be designated as the back surface (reference code omitted) of the semiconductor chip CPL. The back surface (back surface drain electrode BEL) of the semiconductor chip CPL is opposed to the source-drain terminal TSD and the front surface CPLa of the semiconductor chip CPL is opposed to the source terminal TSL and the gate terminal TGL.

The back surface drain electrode (second back surface drain electrode) BEL in the back surface of the semiconductor chip CPL is electrically coupled to the drain D of the power MOS QL1 for low side formed in the semiconductor chip CPL. That is, the back surface drain electrode BEL of the semiconductor chip CPL corresponds to the drain electrode of the power MOS QL1 for low side.

The gate pad electrode (second electrode for gate) PDGL in the front surface CPLa of the semiconductor chip CPL is electrically coupled to the gate electrode of the power MOS QL1 for low side formed in the semiconductor chip CPL. That is, the gate pad electrode PDGL of the semiconductor chip CPL corresponds to a pad (bonding pad, pad electrode) for the gate electrode of the power MOS QL1 for low side.

The source pad electrode (second electrode for source) PDSL in the front surface CPLa of the semiconductor chip CPL is electrically coupled to the source S of the power MOS QL1 for low side formed in the semiconductor chip CPL. That is, the source pad electrode PDSL of the semiconductor chip CPL corresponds to a pad (bonding pad, pad electrode) for the source electrode of the power MOS QL1 for low side.

The following terminals are comprised of conductor, preferably, metal material such as copper (Cu) or copper alloy: the gate terminals (terminals for gate, conductor portions for gate joining, conductor portions) TGL, TGH; the drain terminal (terminal for drain, conductor portion for drain joining, conductor portion) TDH; the source terminal (terminal for source, conductor portion for source joining, conductor portion) TSL; and the source-drain terminal (terminal for source and drain, conductor portion for source and drain joining, conductor portion) TSD. (Refer to FIG. 8 and the like.)

As seen from FIG. 7 to FIG. 12 as well, the semiconductor chip CPH is arranged between the drain terminal TDH positioned under the semiconductor chip CPH and the gate terminal TGH and source-drain terminal TSD positioned above the semiconductor chip CPH. The semiconductor chip CPH is placed so that the front surface CPHa of the semiconductor chip CPH faces upward (toward the gate terminal TGH and the source-drain terminal TSD). The semiconductor chip CPL is arranged between the source-drain terminal TSD positioned under the semiconductor chip CPL and the gate terminal TGL and source terminal TSL positioned above the semiconductor chip CPL. The semiconductor chip CPL is placed so that the front surface CPLa of the semiconductor chip CPL faces upward (toward the gate terminal TGL and the source terminal TSL). That is, the semiconductor chip CPH is placed over the drain terminal TDH; the gate terminal TGH and the source-drain terminal TSD are placed over the semiconductor chip CPH; the semiconductor chip CPL is placed over the source-drain terminal TSD; and the gate terminal TGL and the source terminal TSL are placed over the semiconductor chip CPL.

The following terminals are joined (bonded, coupled) through conductive bonding material BM1 as follows: (the upper surface of) the drain terminal TDH is joined (bonded, coupled) with the back surface drain electrode BEH of the semiconductor chip CPH; (the under surface of) the gate terminal TGH is joined (bonded, coupled) with the gate pad electrode PDGH in the front surface CPHa of the semiconductor chip CPH; and (the under surface of) the source-drain terminal TSD is joined (bonded, coupled) with the source pad electrode PDSH in the front surface CPHa of the semiconductor chip CPH. The following terminals are joined (bonded, coupled) through the conductive bonding material BM1 as follows: (the upper surface of) the source-drain terminal TSD is joined (bonded, coupled) with the back surface drain electrode BEL of the semiconductor chip CPL; (the under surface of) the gate terminal TGL is joined (bonded, coupled) with the gate pad electrode PDGL in the front surface CPLa of the semiconductor chip CPL; and (the under surface of) the source terminal TSL is joined (bonded, coupled) with the source pad electrode PDSL in the front surface CPLa of the semiconductor chip CPL.

For this reason, the back surface drain electrode BEH of the semiconductor chip CPH is electrically coupled to the drain terminal (terminal for drain) TDH through the conductive bonding material BM1. The gate pad electrode PDGH of the semiconductor chip CPH is electrically coupled to the gate terminal (first terminal for gate) TGH through the conductive bonding material BM1; and the source pad electrode PDSH of the semiconductor chip CPH is electrically coupled to the source-drain terminal (terminal for source-drain) TSD through the conductive bonding material BM1. The back surface drain electrode BEL of the semiconductor chip CPL is electrically coupled to the source-drain terminal (terminal for source-drain) TSD through the conductive bonding material BM1. The gate pad electrode PDGL of the semiconductor chip CPL is electrically coupled to the gate terminal (second terminal for gate) TGL through the conductive bonding material BM1; and the source pad electrode PDSL of the semiconductor chip CPL is electrically coupled to the source terminal (terminal for source) TSL through the conductive bonding material BM1. Therefore, the source-drain terminal TSD is electrically coupled to the source pad electrode PDSH of the semiconductor chip CPH through the bonding material BM1 and is also electrically coupled to the back surface drain electrode BEL of the semiconductor chip CPL through the bonding material BM1. The bonding material (adhesive) BM1 is conductive and is preferably prepared by curing solder or silver (Ag) paste.

The drain terminal TDH is not bent (not subjected to bending work) and is flat. The main surface TDHa of the drain terminal TDH corresponding to the under surface of the drain terminal TDH is exposed from the main surface MRb of the encapsulation resin portion MR. The main surface TDHa of the drain terminal TDH is its main surface on the opposite side to the side where the semiconductor chip CPH is placed (that is, the side opposed to the back surface of the semiconductor chip CPH). Part of the drain terminal TDH is slightly protruded from the portions of the lateral surface of the encapsulation resin portion MR corresponding to the sides SD2, SD4. The other part of the lateral surface of the drain terminal TDH is covered with and sealed in the encapsulation resin portion MR. Part of the upper surface of the drain terminal TDH (main surface on the opposite side to the main surface TDHa) is joined to the back surface drain electrode BEH of the semiconductor chip CPH through the conductive bonding material BM1. The other part of the upper surface of the drain terminal TDH is covered with and sealed in the encapsulation resin portion MR. As illustrated in FIG. 6 to FIG. 8, the drain terminal TDH is provided in its areas other than the area directly under the semiconductor chip CPH with an opening (hole portion, through hole) OP. The openings are extended from the upper surface of the drain terminal TDH to the main surface TDHa. The drain terminal TDH is made less prone to come off from the encapsulation resin portion MR by filling these openings OP with the encapsulation resin portion MR.

Part of each of the gate terminal TGH, source-drain terminal TSD, gate terminal TGL, and source terminal TSL is protruded from the lateral surface of the encapsulation resin portion MR and is bent outside the encapsulation resin portion MR. That is, each of the gate terminal TGH, source-drain terminal TSD, gate terminal TGL, and source terminal TSL is so formed that the following is implemented: its portion positioned in the encapsulation resin portion MR is flat; but it is bent at its portion protruded from the lateral surface of the encapsulation resin portion MR (its portion positioned outside the encapsulation resin portion MR, that is, an outer lead portion). (Refer to FIG. 9, FIG. 12, and the like.) In each of the gate terminal TGH, source-drain terminal TSD, gate terminal TGL, and source terminal TSL, a portion positioned outside the encapsulation resin portion MR will be designated as an outer lead portion.

The under surfaces of the following outer lead portions formed by bending are formed substantially flush with the main surface TDHa of the drain terminal TDH exposed in the main surface MRb of the encapsulation resin portion MR: the under surface TGHb of the outer lead portion of the gate terminal TGH and the under surface TSDb of the outer lead portion of the source-drain terminal TSD (refer to FIG. 12); and the under surface TGLb of the outer lead portion of the gate terminal TGL and the under surface TSLb of the outer lead portion of the source terminal TSL (refer to FIG. 9). These under surfaces, listed below, located in the same plane become the terminals for external coupling (external terminals) of the semiconductor device SM1: the under surface TGHb of the outer lead portion of the gate terminal TGH; the under surface TSDb of the outer lead portion of the source-drain terminal TSD; the under surface TGLb of the outer lead portion of the gate terminal TGL; the under surface TSLb of the outer lead portion of the source terminal TSL; and the main surface TDHa of the drain terminal TDH. For this reason, the semiconductor device SM1 can be surface mounted and the back surface of the semiconductor device SM1 (the main surface MRb of the encapsulation resin portion MR) is the mounting surface of the semiconductor device SM1.

Neither of the semiconductors chips CPH, CPL is exposed from the encapsulation resin portion MR at all. However, each of the drain terminal TDH, gate terminal TGH, source-drain terminal TSD, gate terminal TGL, and source terminal TSL has a portion exposed from the encapsulation resin portion MR. For this reason, the encapsulation resin portion MR can be considered as an encapsulation resin portion that seals the semiconductor chips CPH, CPL and part of the drain terminal TDH, gate terminal TGH, source-drain terminal TSD, gate terminal TGL, and source terminal TSL.

In the semiconductor device SM, the source-drain terminal TSD is joined to both of the following through the bonding material BM1 and electrically coupled thereto: the source pad electrode PDSH of the semiconductor chip CPH positioned underneath and the back surface drain electrode BEL of the semiconductor chip CPL positioned above. For this reason, the source pad electrode PDSH of the semiconductor chip CPH positioned underneath and the back surface drain electrode BEL of the semiconductor chip CPL positioned above are electrically coupled together through the bonding material BM1 and the source-drain terminal TSD. Therefore, the source-drain terminal TSD functions both as the source terminal of the semiconductor chip CPH positioned underneath and as the drain terminal of the semiconductor chip CPL positioned above. As a result, the source of the power MOS QH1 and the drain of the power MOS QL1 are electrically coupled together. This makes it possible to couple the power MOS QH1 formed in the semiconductor chip CPH positioned underneath and the power MOS QL1 formed in the semiconductor chip CPL positioned above in series.

When the terminals and semiconductor chips in the encapsulation resin portion MR of the semiconductor device SM1 are considered to be of laminar structure, they are placed as follows: the drain terminal TDH is placed in the first layer as the lowermost layer; the semiconductor chip CPH is placed in the second layer positioned thereabove; the gate terminal TGH and the source-drain terminal TSD are placed in the third layer positioned thereabove; the semiconductor chip CPL is placed in the fourth layer positioned thereabove; and the gate terminal TGL and the source terminal TSL are placed in the fifth layer positioned thereabove. The gate terminal TGL and source terminal TSL placed in the fifth layer are arranged in the same layer (the same height position). (Refer to FIG. 9.) However, they are separated so that they do not planarly overlap with each other and electrically isolated from each other by the encapsulation resin portion MR positioned in-between. The gate terminal TGH and source-drain terminal TSD placed in the third layer are arranged in the same layer (the same height position). However, they are separated so that they do not planarly overlap with each other and electrically isolated from each other by the encapsulation resin portion MR positioned in-between. (Refer to FIG. 12.)

"As viewed in a plane" cited in this specification means that something is viewed in a plane parallel to the main surface MRb of the encapsulation resin portion MR. (This main surface also corresponds to a plane substantially parallel to the front surfaces CPHa, CPLa of the semiconductor chips CPH, CPL or the back surfaces of the semiconductor chips CPH, CPL.) "Planarly overlap" or "do not planarly overlap" cited here means that some things "planarly overlap" or "do not overlap" with each other as viewed (projected and viewed) in a plane parallel to the main surface MRb of the encapsulation resin portion MR. Therefore, when the direction substantially perpendicular to the main surface MRb of the encapsulation resin portion MR is taken as the vertical direction, these phrases are defined as follows: when some member is positioned directly below (or directly above) another member, these members planarly overlap with each other; and when some member is not positioned directly under (or directly above) another member, these members do not planarly overlap with each other.

The semiconductor chip CPH is placed (arranged) over the drain terminal TDH with the bonding material BM1 in-between and the semiconductor chip CPH is planarly embraced in the drain terminal TDH. The gate terminal TGH and the source-drain terminal TSD are placed (arranged) over the semiconductor chip CPH with the bonding material BM1 in-between. Part of the gate terminal TGH and part of the source-drain terminal TSD planarly overlap with the semiconductor chip CPH. More specific description will be given. Part of the gate terminal TGH planarly overlaps with the gate pad electrode PDGH of the semiconductor chip CPH. In this overlap area, the gate terminal TGH and the gate pad electrode PDGH of the semiconductor chip CPH are joined together through the bonding material BM1. Part of the source-drain terminal TSD planarly overlaps with the source pad electrode PDSH of the semiconductor chip CPH. In this overlap area, the source-drain terminal TSD and the source pad electrode PDSH of the semiconductor chip CPH are joined together through the bonding material BM1.

The semiconductor chip CPL is placed (arranged) over the source-drain terminal TSD with the bonding material BM1 in-between and the semiconductor chip CPL is planarly embraced in the source-drain terminal TSD. The gate terminal TGH does not planarly overlap with the semiconductor chip CPL. (Refer to FIG. 7 and the like.) Since the gate terminal TGH does not planarly overlap with the semiconductor chip CPL, the gate terminal TGH is not in contact with the semiconductor chip CPL (especially, the back surface drain electrode BEL). The back surface drain electrode BEL of the semiconductor chip CPL is electrically coupled with the source-drain terminal TSD through the conductive bonding material BM1 but it is not electrically coupled with the gate terminal TGH.

The gate terminal TGL and the source terminal TSL are placed (arranged) over the semiconductor chip CPL with the bonding material BM1 in-between. Part of the gate terminal TGL and part of the source terminal TSL planarly overlap with the semiconductor chip CPL. (Refer to FIG. 9 and the like.) More specific description will be given. Part of the gate terminal TGL planarly overlaps with the gate pad electrode PDGL of the semiconductor chip CPL. In this overlap area, the gate terminal TGL and the gate pad electrode PDGL of the semiconductor chip CPL are joined together through the bonding material BM1. Part of the source terminal TSL planarly overlaps with the source pad electrode PDSL of the semiconductor chip CPL. In this overlap area, the source terminal TSL and the source pad electrode PDSL of the semiconductor chip CPL are joined together through the bonding material BM1.

The gate terminal TGL is drawn from the lateral surface of the encapsulation resin portion MR corresponding to the side SD1 to outside the encapsulation resin portion MR and is bent. The gate terminal TGH is drawn from the lateral surface of the encapsulation resin portion MR corresponding to the side SD3 to outside the encapsulation resin portion MR and is bent. The source terminal TSL is drawn from the lateral surface of the encapsulation resin portion MR corresponding to the side SD1 and the lateral surface thereof corresponding to the side SD3 to outside the encapsulation resin portion MR and is bent. The source-drain terminal TSD is drawn from the lateral surface of the encapsulation resin portion MR corresponding to the side SD1 and the lateral surface thereof corresponding to the side SD3 to outside the encapsulation resin portion MR and is bent. The source terminal TSL is drawn from the lateral surface of the encapsulation resin portion MR corresponding to the side SD1 to outside the encapsulation resin portion MR and is bent. The source terminal TSL is drawn at two points so that the outer lead portion of the gate terminal TGL is sandwiched between the two drawn parts thereof. The source-drain terminal TSD is drawn from the lateral surface of the encapsulation resin portion MR corresponding to the side SD3 to outside the encapsulation resin portion MR and is bent. The source-drain terminal TSD is drawn so that the outer lead portion of the gate terminal TGH is sandwiched between the two drawn parts thereof.

The gate terminal TGL and the source terminal TSL are drawn from the lateral surface of the encapsulation resin portion MR to outside the encapsulation resin portion MR at the same height position. The gate terminal TGH and the source-drain terminal TSD are drawn from the lateral surface of the encapsulation resin portion MR to outside the encapsulation resin portion MR at the same height position. However, the gate terminal TGL and the source terminal TSL are drawn from the lateral surface of the encapsulation resin portion MR to outside the encapsulation resin portion MR at a height position different from that of the gate terminal TGH and source-drain terminal TSD. More specific description will be given. The gate terminal TGH and the source-drain terminal TSD are drawn from the lateral surface of the encapsulation resin portion MR to outside the encapsulation resin portion MR at the following position: at a position lower than the height position at which the gate terminal TGL and the source terminal TSL are drawn to outside the encapsulation resin portion MR. The drain terminal TDH is located at a position lower than the height position at which the gate terminal TGH and the source-drain terminal TSD are drawn to outside the encapsulation resin portion MR.

In the encapsulation resin portion MR, the gate terminal TGL and source terminal TSL in the same layer (the same height position) do not planarly overlap with each other; and the gate terminal TGH and source-drain terminal TSD in the same layer (the same height position) do not overlap with each other. This is intended to implement the following in the encapsulation resin portion MR: the gate terminal TGL and source terminal TSL in the same layer are electrically separated from each other and the gate terminal TGH and source-drain terminal TSD in the same layer are electrically separated from each other.

In the encapsulation resin portion MR, part of each of the source terminal TSL and the gate terminal TGL planarly overlaps with the source-drain terminal TSD positioned thereunder. The reason for this is as follows: to join the entire back surface drain electrode BEL of the semiconductor chip CPL to the source-drain terminal TSD through the bonding material BM1, the semiconductor chip CPL is so arranged that it is planarly embraced in the source-drain terminal TSD; the source terminal TSL is so arranged that it planarly overlaps with the source pad electrode PDSL of the semiconductor chip CPL; and the gate terminal TGL is so arranged that it planarly overlaps with the gate pad electrode PDGL of the semiconductor chip CPL. In the encapsulation resin portion MR, for this reason, the source terminal TSL and the gate terminal TGL are opposed to (that is, planarly overlap with) the source-drain terminal TSD with the semiconductor chip CPL in-between.

Outside the encapsulation resin portion MR, meanwhile, the source terminal TSL, gate terminal TGL, source-drain terminal TSD, and gate terminal TGH do not planarly overlap with one another. (Refer to FIG. 6 and the like.) Short-circuiting between terminals can be easily prevented outside the encapsulation resin portion MR by ensuring that the source terminal TSL, gate terminal TGL, source-drain terminal TSD, and gate terminal TGH do not overlap with one another outside the encapsulation resin portion MR.

<Features of Semiconductor Device>

A more detailed description will be given of the features of the semiconductor device SM1 in this embodiment.

The semiconductor chip CPH and the semiconductor chip CPL could be individually packaged unlike this embodiment. In this case, however, a semiconductor package obtained by packaging the semiconductor chip CPH and a semiconductor package obtained by packaging the semiconductor chip CPL are individually required. This increases the mounting area (area required for mounting a semiconductor package) in a mounting board over which both the semiconductor packages are mounted. Further, since the parasitic inductance of the wiring of the mounting board is increased, power supply efficiency is degraded.

Instead of vertically stacking, the semiconductor chip CPH and the semiconductor chip CPL could be laterally arranged and packaged unlike this embodiment. In this case, however, one semiconductor package is formed for two semiconductor chips CPH, CPL but the plane area of the entire semiconductor package is increased. This increases the mounting area (area required for mounting a semiconductor package) in a mounting board over which the semiconductor packages are mounted. Since the wiring parasitic inductance in the semiconductor packages is increased, power supply efficiency is degraded.

In the semiconductor device SM1 in this embodiment, meanwhile, the semiconductor chip CPL and the semiconductor chip CPH are vertically stacked. For this reason, the plane area of the semiconductor device SM1 in this embodiment can be reduced as compared with cases where the semiconductor chip CPH and the semiconductor chip CPL are laterally arranged and packaged unlike this embodiment. This makes it possible to reduce the mounting area (area required for mounting the semiconductor device SM1) in a mounting board over which the semiconductor device SM1 is mounted. Thus an electronic device (the non-isolated DC-DC converter 1) using the semiconductor device SM1 can be reduced in size (area). In this embodiment, further, the semiconductor chip CPL and the semiconductor chip CPH are vertically stacked. Then the back surface drain electrode BEL of the semiconductor chip CPL and the source pad electrode PDSH of the semiconductor chip CPH are electrically coupled together through the source-drain terminal TSD positioned between the semiconductor chip CPL and the semiconductor chip CPH. This makes it possible to reduce the wiring parasitic inductance in the semiconductor device SM1. Therefore, it is possible to enhance the performance of the semiconductor device SM1 and an electronic device (the non-isolated DC-DC converter 1) using it and to achieve frequency enhancement and efficiency enhancement. Consequently, the characteristics of the semiconductor device SM1 can be enhanced.

In the semiconductor device SM1 in this embodiment, two semiconductor chips CPH, CPL are vertically laminated. However, the back surface drain electrode BEL is formed in the entire back surface of the semiconductor chip CPL positioned above and the gate pad electrode PDGH and the source pad electrode PDSH are formed in the front surface CPHa of the semiconductor chip CPH positioned underneath. Therefore, the electrodes of the semiconductor chips CPH, CPL and the terminals cannot be favorably coupled just by vertically stacking the semiconductor chip CPH and the semiconductor chip CPL. More specific description will be given. If the semiconductor chip CPL is stacked over the gate pad electrode PDGH of the semiconductor chip CPH unlike this embodiment, the following would take place: the gate terminal TGH joined to the gate pad electrode PDGH of the semiconductor chip CPH through the bonding material BM1 is brought into contact with the back surface drain electrode BEL of the semiconductor chip CPL and is electrically coupled thereto. However, it is required that the gate terminal TGH should be electrically coupled to the gate pad electrode PDGH of the semiconductor chip CPH but should not be electrically coupled to the back surface drain electrode BEL of the semiconductor chip CPL.

In the semiconductor device SM1 in this embodiment, consequently, the semiconductor chip CPL and the semiconductor chip CPH are vertically arranged so that the following is implemented: the semiconductor chip CPL is prevented from overlapping with the area positioned directly above (planarly overlapping with) the gate pad electrode PDGH of the semiconductor chip CPH. That is, the semiconductor chip CPL is prevented from being positioned directly above the gate pad electrode PDGH of the semiconductor chip CPH. (Refer to FIG. 7 and the like.)

As mentioned above, the semiconductor chip CPL does not overlap with the area positioned directly above the gate pad electrode PDGH of the semiconductor chip CPH. (That is, the semiconductor chip CPL does not exist directly above the gate pad electrode PDGH of the semiconductor chip CPH.) This makes it possible to arrange the gate terminal TGH so that it planarly overlaps with the gate pad electrode PDGH of the semiconductor chip CPH but does not planarly overlap with the semiconductor chip CPL. For this reason, the gate terminal TGH can be placed over the gate pad electrode PDGH of the semiconductor chip CPH so that it is not in contact with the semiconductor chip CPL (especially, the back surface drain electrode BEL). Therefore, it is possible to electrically couple the gate terminal TGH to the gate pad electrode PDGH of the semiconductor chip CPH but not to electrically couple it with the back surface drain electrode BEL of the semiconductor chip CPL.

As mentioned above, the semiconductor chip CPL is so arranged that it does not overlap with the area positioned directly above the gate pad electrode PDGH of the semiconductor chip CPH. (That is, the semiconductor chip CPL is so arranged that it does not exist directly above the gate pad electrode PDGH of the semiconductor chip CPH.) For this purpose, the semiconductor chip CPH and the semiconductor chip CPL are so arranged that their respective centers are displaced from each other. (Refer to FIG. 7, FIG. 8, and the like.)

In this embodiment, as mentioned above, the semiconductor chip CPL is so arranged that it does not overlap with the area positioned directly above the gate pad electrode PDGH of the semiconductor chip CPH. However, it is desirable that the semiconductor chip CPL and the semiconductor chip CPH should partly planarly overlap with each other, not that they should not planarly overlap with each other at all. The reason for this is as follows:

When the semiconductor chip CPL overlaps with the area positioned directly above the gate pad electrode PDGH of the semiconductor chip CPH, a problem of coupling of the gate terminal TGH arises as mentioned above. Conversely, when the semiconductor chip CPL and the semiconductor chip CPH do not planarly overlap with each other at all, the plane area of the semiconductor device SM1 is increased. In addition, the resistance (inductance) between the back surface drain electrode BEL of the semiconductor chip CPL and the source pad electrode PDSH of the semiconductor chip CPH is increased.

In this embodiment, meanwhile, the semiconductor chip CPL is so arranged that it does not overlap with the area positioned directly above the gate pad electrode PDGH of the semiconductor chip CPH. Preferably, the semiconductor chip CPL and the semiconductor chip CPH are so arranged that they partly planarly overlap with each other. This makes it possible to prevent the gate terminal TGH from being electrically coupled to the back surface drain electrode BEL of the semiconductor chip CPL and to electrically couple it to the gate pad electrode PDGH of the semiconductor chip CPH. Further, the plane area of the semiconductor device SM1 can be reduced by the amount equivalent to the overlap between the semiconductor chip CPH and the semiconductor chip CPL. In addition, the back surface drain electrode BEL of the semiconductor chip CPL and the source pad electrode PDSH of the semiconductor chip CPH can be electrically coupled together through the shortest path, or the source-drain terminal TSD sandwiched therebetween from above and below. Therefore, the wiring parasitic inductance in the semiconductor device SM1 can be further reduced. This is advantageous to the enhancement of the performance, for example, frequency enhancement and efficiency enhancement, of the semiconductor device SM1 and an electronic device (non-isolated DC-DC converter 1) using it.

In this embodiment, it is desirable that the following measure should be taken: the semiconductor chip CPL and the semiconductor chip CPH are made identical in size (dimensions); and the source pad electrode PDSH and gate pad electrode PDGH in the semiconductor chip CPH are made identical with the source pad electrode PDSL and gate pad electrode PDGL in the semiconductor chip CPL in shape and arrangement. That is, it is desirable to use semiconductor chips of the same configuration both for the semiconductor chip CPL and for the semiconductor chip CPH.

When the semiconductor chip CPH and the semiconductor chip CPL are individually packaged unlike this embodiment, it is desirable to take the following measure: with respect to the chip size of each of the semiconductor chips CPH, CPL, its circuitry is optimized; and the semiconductor chip CPL in which the power MOS QL1 for low side is formed is made larger than the semiconductor chip CPH in which the power MOS QH1 for high side is formed. This is because a larger current flows in the power MOS QL1 for low side than in the power MOS QH1 for high side. This is the same with cases where the semiconductor chip CPH and the semiconductor chip CPL are laterally arranged and packaged unlike this embodiment.

Since the semiconductor chip CPL and the semiconductor chip CPH are vertically stacked and arranged in this embodiment, however, a problem arises when the semiconductor chip CPL and the semiconductor chip CPH are different from each other in chip size. Especially, with a configuration in which a larger semiconductor chip is placed over a smaller semiconductor chip, the package structure is unbalanced and this make it difficult to carry out an assembling step (manufacturing process) for semiconductor devices.

In this embodiment, consequently, the semiconductor chip CPL in which the power MOS QL1 for low side is formed and the semiconductor chip CPH in which the power MOS QH1 for high side is formed are preferably made identical in size (dimensions). When the semiconductor chip CPL and the semiconductor chip CPH are made identical in size, a larger semiconductor chip is prevented from being placed over a smaller semiconductor chip. As a result, the package structure of the semiconductor device SM1 is favorably balanced and this facilitates an assembling step (manufacturing process) for the semiconductor device SM1.

In addition to making the semiconductor chip CPL and the semiconductor chip CPH identical in size (dimensions), in this embodiment, it is desirable that the following measure should be taken: the shape and arrangement of the source pad electrode PDSH and gate pad electrode PDGH in the semiconductor chip CPH are made identical with the shape and arrangement of the source pad electrode PDSL and gate pad electrode PDGL in the semiconductor chip CPL. That is, it is desirable to use semiconductor chips of the same configuration as the semiconductor chip CPL and the semiconductor chip CPH. This makes it possible to use common semiconductor chips both for the semiconductor chip CPL and for the semiconductor chip CPH and reduce the cost of the semiconductor device SM1. Because of circuitry, a larger current flows in the power MOS QL1 for low side than in the power MOS QH1 for high side. Therefore, it is desirable to take the following measure: a semiconductor chip in optimal size is prepared for the semiconductor chip CPL in which the power MOS QL1 for low side is formed and this semiconductor chip is used not only for the semiconductor chip CPL but also for the semiconductor chip CPH.

When the semiconductor chip CPL and the semiconductor chip CPH are made identical in size, it is important to take the following measure to prevent the semiconductor chip CPL from overlapping with the area positioned directly above the gate pad electrode PDGH of the semiconductor chip CPH: the semiconductor chip CPH and the semiconductor chip CPL are so arranged that their respective centers are displaced from each other.

When the semiconductor chip CPL and semiconductor chip CPH which are the same size are arranged so that their respective centers are in agreement with each other unlike this embodiment, the following takes place. (That is, when the semiconductor chips are so arranged that the center of the back surface of the semiconductor chip CPL is positioned directly above the center of the front surface CPHa of the semiconductor chip CPH, the following takes place.) The semiconductor chip CPH and the semiconductor chip CPL planarly completely agree with each other; therefore, the semiconductor chip CPL overlaps with the area positioned directly above the gate pad electrode PDGH of the semiconductor chip CPH.

Meanwhile, when the semiconductor chip CPL and semiconductor chip CPH which are the same size are arranged so that their respective centers are displaced from each other as in this embodiment, the following can be implemented: the semiconductor chip CPL can be prevented from overlapping with the area directly above the gate pad electrode PDGH of the semiconductor chip CPH. This makes it possible to electrically couple the gate terminal TGH to the gate pad electrode PDGH of the semiconductor chip CPH and not to electrically couple it to the back surface drain electrode BEL of the semiconductor chip CPL. (Refer to FIG. 7 and the like.)

The center of the semiconductor chip CPH corresponds to the following: the center of the front surface CPHa of the semiconductor chip CPH; the center of the back surface of the semiconductor chip CPH; or an axis (central axis) coupling the center of the front surface CPHa of the semiconductor chip CPH and the center of the back surface of the semiconductor chip CPH. The center of the semiconductor chip CPL corresponds to the following: the center of the front surface CPLa of the semiconductor chip CPL; the center of the back surface of the semiconductor chip CPL; or an axis (central axis) coupling the center of the front surface CPLa of the semiconductor chip CPL and the center of the back surface of the semiconductor chip CPL.

For this reason, when the semiconductor chip CPH and the semiconductor chip CPL are so arranged that their respective centers are displaced from each other, the following takes place: the center of the back surface of the semiconductor chip CPL is not positioned directly above the center of the front surface CPHa of the semiconductor chip CPH. As a result, the central axis of the semiconductor chip CPH and the central axis of the semiconductor chip CPL do not agree with each other and are displaced from each other. (The central axis of the semiconductor chip CPH is an axis coupling the center of the front surface CPHa of the semiconductor chip CPH and the center of the back surface of the semiconductor chip CPH.) (The central axis of the semiconductor chip CPL is an axis coupling the center of the front surface CPLa of the semiconductor chip CPL and the center of the back surface of the semiconductor chip CPL.)

As mentioned above, the semiconductor chip CPL and semiconductor chip CPH of the same size are so arranged that their respective centers are displaced from each other; and the semiconductor chip CPL is thereby prevented from overlapping with the area positioned directly above the gate pad electrode PDGH of the semiconductor chip CPH. Even in this case, it is desirable that the semiconductor chip CPL and semiconductor chip CPH of the same size should partly planarly overlap with each other as mentioned above. As a result, it is possible to electrically couple the gate terminal TGH to the gate pad electrode PDGH of the semiconductor chip CPH without electrically coupling it to the back surface drain electrode BEL of the semiconductor chip CPL. Further, it is possible to reduce the plane area of the semiconductor device SM1. In addition, it is possible to further reduce the wiring parasitic inductance in the semiconductor device SM1 and this is advantageous to the enhancement of the performance, for example, frequency enhancement and efficiency enhancement, of the semiconductor device SM1 and an electronic device (non-isolated DC-DC converter 1) using it.

In this embodiment, the semiconductor chip CPL and semiconductor chip CPH of the same size and identical with each other in the shape and arrangement of the source pad electrode and the gate pad electrode are vertically arranged so that the following is implemented: their respective centers are displaced from each other. As seen from comparison of FIG. 14 with FIG. 16, however, it is desirable that the arrangement of the semiconductor chip CPL should correspond to the arrangement obtained by rotating the semiconductor chip CPH by 180°. That is, it is desirable that the orientation of the semiconductor chip CPL should be identical with that obtained by rotating the semiconductor chip CPH by 180°. (Specifically, this rotation is 180°-rotation in a plane parallel to the front surface CPHa or back surface of the semiconductor chip CPH.) In other words, two semiconductor chips of the same configuration are used for the semiconductor chip CPL and the semiconductor chip CPH and are vertically arranged so that their respective centers are displaced from each other; however, the two semiconductor chips are not identical in orientation and one of them is placed as the semiconductor chip CPH and the other is placed as the semiconductor chip CPL in the orientation obtained by rotating it by 180°. The semiconductor chip CPH and the semiconductor chip CPL are so oriented that they are rotated by 180° relative to each other. At this time, the semiconductor chip CPL and the semiconductor chip CPH are displaced so that the following is implemented: the gate pad electrode PDGH of the semiconductor chip CPH and the gate pad electrode PDGL of the semiconductor chip CPL are away from each other as compared with the following cases: cases where the center of the semiconductor chip CPH and that of the semiconductor chip CPL agree with each other. This makes it possible to prevent the semiconductor chip CPL from overlapping with the area positioned directly above the gate pad electrode PDGH of the semiconductor chip CPH even in the following cases: cases where the amount of displacement between the semiconductor chip CPL and the semiconductor chip CPH is small (that is, the area of overlap between the semiconductor chips CPL, CPH is large). Therefore, it is possible to further reduce the plane area of the semiconductor device SM1.

As mentioned above, prevention of the semiconductor chip CPL from planarly overlapping with the gate pad electrode PDGH of the semiconductor chip CPH is required to implement the following: the gate terminal TGH is electrically coupled to the gate pad electrode PDGH of the semiconductor chip CPH without electrically coupling it to the back surface drain electrode BEL of the semiconductor chip CPL. The gate terminal TGL electrically coupled to the gate pad electrode PDGL of the semiconductor chip CPL is drawn to outside the encapsulation resin portion MR without contact with other terminals (source terminal TSL, source-drain terminal TSD, and gate terminal TGH). To do this, it is desirable that the semiconductor chip CPH should not planarly overlap with the gate pad electrode PDGL of the semiconductor chip CPL. As mentioned above, the semiconductor chips CPL, CPH identical in chip size and in the shape and arrangement of the source pad electrode and the gate pad electrode are arranged so that the following is implemented: they are placed in orientations rotated by 180° from each other and their respective centers are displaced from each other. In this case, the semiconductor chip CPH inevitably does not planarly overlap with the gate pad electrode PDGL of the semiconductor chip CPL unless the semiconductor chip CPL planarly overlaps with the gate pad electrode PDGH of the semiconductor chip CPH. Prevention of the semiconductor chip CPH from planarly overlapping with the gate pad electrode PDGL of the semiconductor chip CPL also brings the following effect: it is made easier to prevent contact between terminals and draw the gate terminal TGL to outside the encapsulation resin portion MR.

It is desirable that the thickness T1 of the drain terminal TDH should be larger than the following thicknesses: the thickness T2 of the gate terminal TGH, the thickness T3 of the source-drain terminal TSD, the thickness T4 of the gate terminal TGL, and the thickness T5 of the source terminal TSL (that is, T1>T2, T3, T4, T5). The reason for this will be described below. The thicknesses T1 to T5 are defined in FIG. 7 and FIG. 8.

Heat from the semiconductor chips CPH, CPL is radiated mainly from the drain terminal TDH, gate terminal TGH, source-drain terminal TSD, gate terminal TGL, and source terminal TSL to outside the semiconductor device SM1. (The heat is radiated to, for example, the mounting board over which the semiconductor device SM1 is mounted.) Of these terminals, the drain terminal TDH exposed in the main surface MRb of the encapsulation resin portion MR contributes most to heat radiation. For this reason, the heat radiation characteristics of the semiconductor device SM1 can be enhanced (that is, the thermal resistance of the semiconductor device SM1 can be reduced) by increasing the thickness T1 of the drain terminal TDH.

Meanwhile, the gate terminal TGH, source-drain terminal TSD, gate terminal TGL, and source terminal TSL are bent outside the encapsulation resin portion MR. If the thicknesses T2, T3, T4, T5 are too large, their moldability is degraded and it is difficult to bend them. If all the drain terminal TDH, gate terminal TGH, source-drain terminal TSD, gate terminal TGL, and source terminal TSL are thickened, increase in the size (thickness) of the semiconductor device is incurred.

For this reason, the following can be implemented by making the thickness T2, T3, T4, T5 of each of the gate terminal TGH, source-drain terminal TSD, gate terminal TGL, and source terminal TSL smaller than the thickness T1 of the drain terminal TDH: it can be made easier to mold (bend) the gate terminal TGH, source-drain terminal TSD, gate terminal TGL, and source terminal TSL. Since the drain terminal TDH is flat and is not bent, no processing problem arises even when it is thicker than the gate terminal TGH, source-drain terminal TSD, gate terminal TGL, and source terminal TSL. As mentioned above, the following can be implemented by making the drain terminal TDH thicker than the gate terminal TGH, source-drain terminal TSD, gate terminal TGL, and source terminal TSL: both enhancement of the heat radiation characteristics of the semiconductor device SM1 and ease of terminal processing can be achieved. In addition, the size (thickness) of the semiconductor device SM1 can be reduced.

In consideration of ease of processing of a lead frame (corresponding to the lead frames LF1, LF2, LF3 described later) for the manufacture of the semiconductor device SM1, it is desirable to take the following measure: the thickness T2 of the gate terminal TGH and the thickness T3 of the source-drain terminal TSD are made equal to each other (that is, T2=T3). Further, it is desirable that the thickness T4 of the gate terminal TGL and the thickness T5 of the source terminal TSL should be equal to each other (T4=T5).

As an example of the thickness T1 to T5 of each terminal, the following measure can be taken: the thickness T1 of the drain terminal TDH is set to, for example, 0.4 mm or so; and the thickness T2, T3, T4, T5 of each of the gate terminal TGH, source-drain terminal TSD, gate terminal TGL, and source terminal TSL is set to, for example, 0.2 mm or so.

In the encapsulation resin portion MR, the source terminal TSL is placed in a layer (height position) different from that of the gate terminal TGH and the source-drain terminal TSD. Therefore, the source terminal TSL could also be provided so that it planarly overlaps with the gate pad electrode PDGH of the semiconductor chip CPH; however, it is desirable that the source terminal TSL should not planarly overlap with the gate pad electrode PDGH of the semiconductor chip CPH. (Refer to FIG. 7 and the like.) As a result, the following can be implemented when the semiconductor device SM1 is manufactured (assembled): until the stage prior to the formation of the encapsulation resin portion MR after the gate terminal TGH is joined to the gate pad electrode PDGH of the semiconductor chip CPH through the bonding material BM1, the source terminal TSL does not interfere; and the state of junction between the gate terminal TGH and the gate pad electrode PDGH of the semiconductor chip CPH through the bonding material BM1 can be observed (appearance inspection). In addition, the source terminal TSL does not interfere and the state of junction between the source-drain terminal TSD and the source pad electrode PDSH of the semiconductor chip CPH through the bonding material BM1 can be observed (appearance inspection). For this reason, the reliability of the semiconductor device SM1 can be enhanced.

To facilitate this observation (appearance inspection), it is more desirable that the following state should be established as illustrated in FIG. 13 to FIG. 15: part of each of the gate pad electrode PDGH and source pad electrode PDSH of the semiconductor chip CPH does not planarly overlap with the gate terminal TGH, source-drain terminal TSD, source terminal TSL, or gate terminal TGL. That is, it is more desirable that the following state should be established: part (most part) of the gate pad electrode PDGH of the semiconductor chip CPH planarly overlaps with the gate terminal TGH but the remaining part does not planarly overlap with the gate terminal TGH, source-drain terminal TSD, source terminal TSL, or gate terminal TGL. Further, it is more desirable that the following state should be established: part (most part) of the source pad electrode PDSH of the semiconductor chip CPH planarly overlaps with the source-drain terminal TSD but the remaining part does not planarly overlap with the gate terminal TGH, source-drain terminal TSD, source terminal TSL, or gate terminal TGL.

The following widths outside the encapsulation resin portion MR will be set as follows: the widths of the outer lead portions of the source-drain terminal TSD are W1 and W2; the widths of the outer lead portions of the source terminal TSL are W3, W4; the width of the outer lead portion of the gate terminal TGH is W5; and the width of the outer lead portion of the gate terminal TGL is W6. At this time, it is desirable that the widths W1, W2, W3, W4 are larger than the widths W5, W6 (that is, W1, W2, W3, W4>W5, W6). Each width W1 to W6 is defined in FIG. 5. As a result, it is possible to reduce the on-resistance of the power MOS QL1 for low side and power MOS QH1 for high side incorporated in the semiconductor device SM1. Further, it is possible to enhance the heat radiation characteristics of the semiconductor device SM1 (that is, reduce the thermal resistance of the semiconductor device SM1).

<Manufacturing Process for Semiconductor Device>

Figure 17:
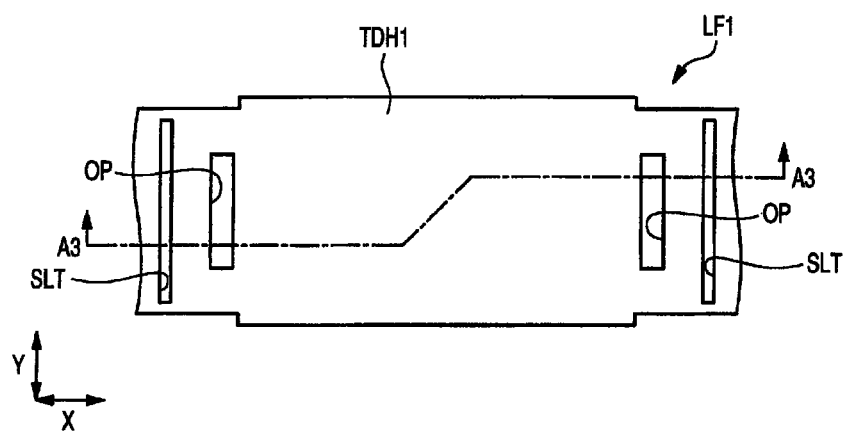
FIG. 17 is a substantial part plan view of a lead frame used in a manufacturing process for a semiconductor device in an embodiment of the invention.
Figure 18:
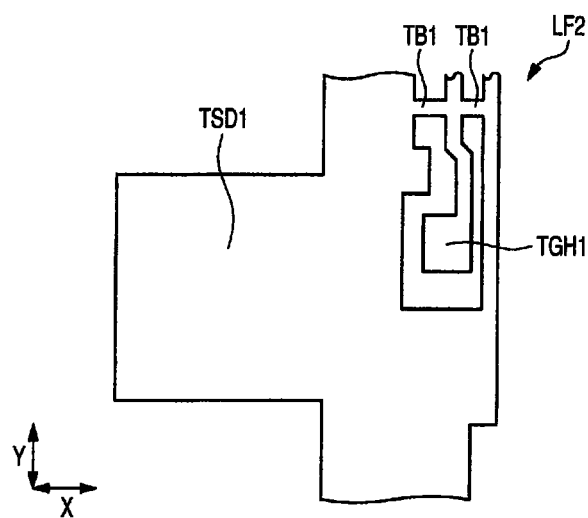
FIG. 18 is a substantial part plan view of a lead frame used in a manufacturing process for a semiconductor device in an embodiment of the invention.
Figure 19:
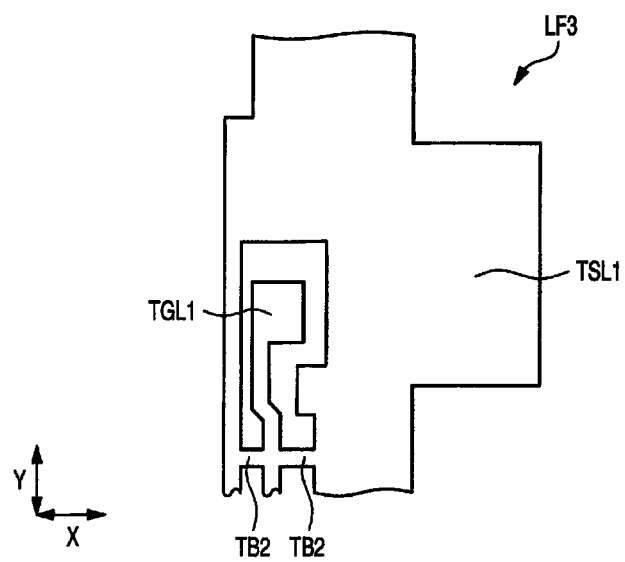
FIG. 19 is a substantial part plan view of a lead frame used in a manufacturing process for a semiconductor device in an embodiment of the invention.
Figure 20:
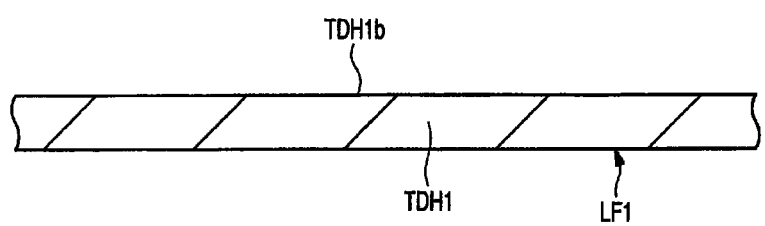
FIG. 20 is a substantial part sectional view of a lead frame used in a manufacturing process for a semiconductor device in an embodiment of the invention.
Figure 21:
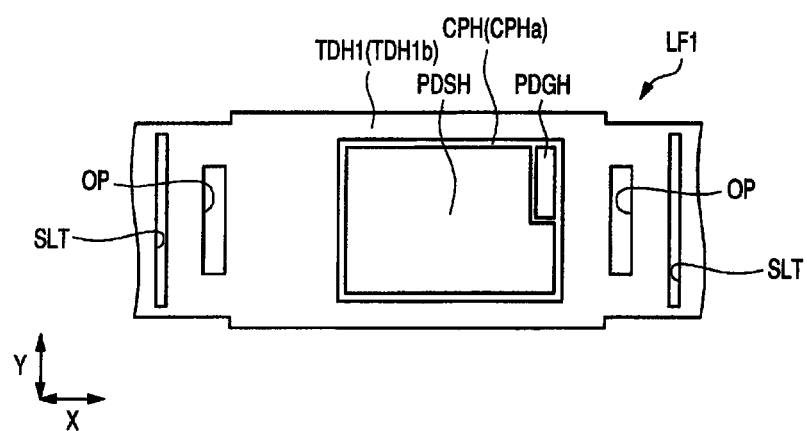
FIG. 21 is a plan view of a semiconductor device in an embodiment of the invention in a manufacturing process.
Figure 22:
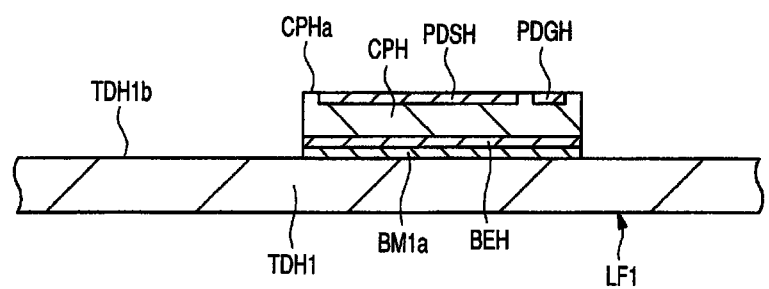
FIG. 22 is a sectional view of the same semiconductor device as in FIG. 21 in a manufacturing process.
Figure 23:
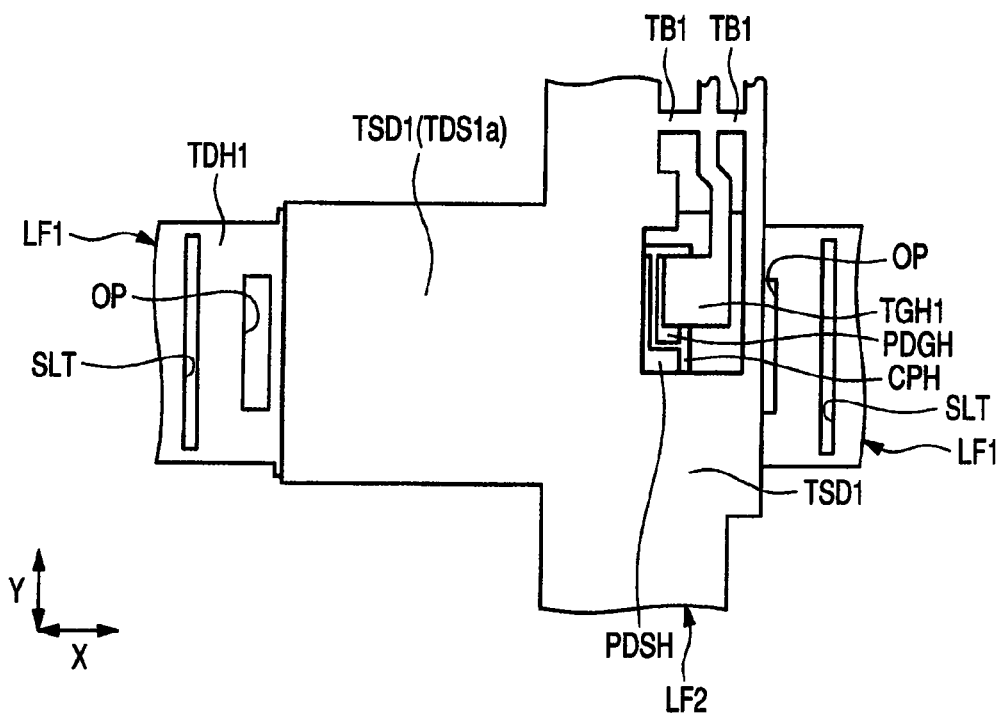
FIG. 23 is a plan view of the semiconductor device in a manufacturing process, following FIG. 21.
Figure 24:
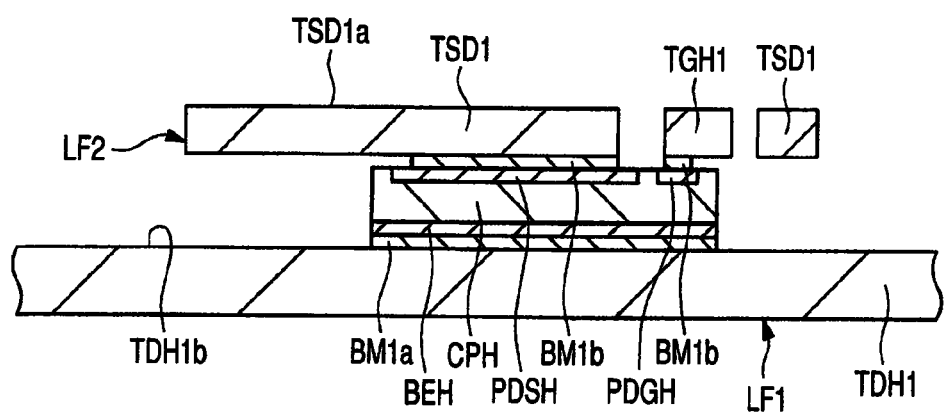
FIG. 24 is a sectional view of the same semiconductor device as in FIG. 23 in a manufacturing process.
Figure 25:
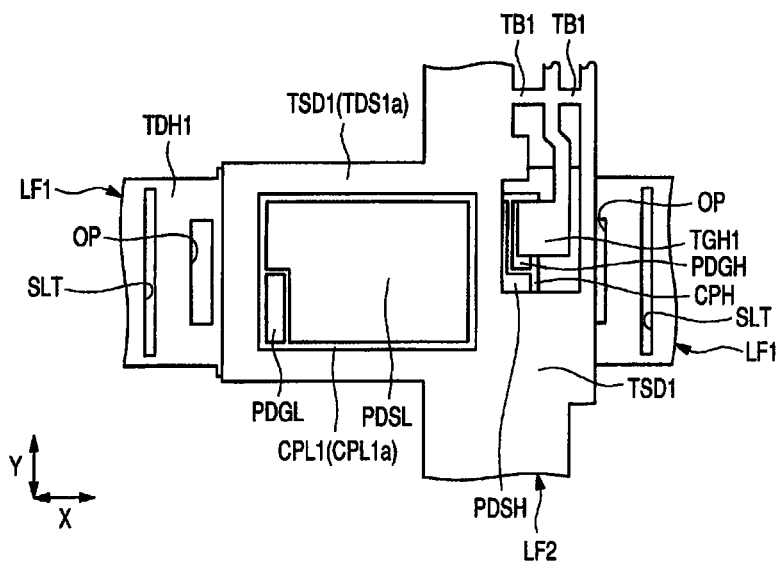
FIG. 25 is a plan view of the semiconductor device in a manufacturing process, following FIG. 23.
Figure 26:
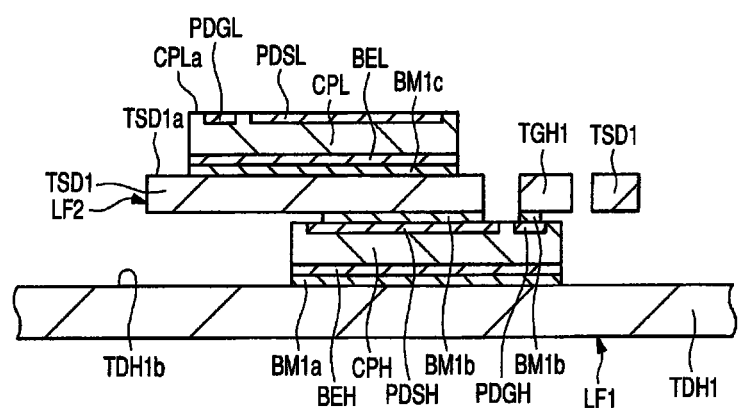
FIG. 26 is a sectional view of the same semiconductor device as in FIG. 25 in a manufacturing process.
Figure 27:
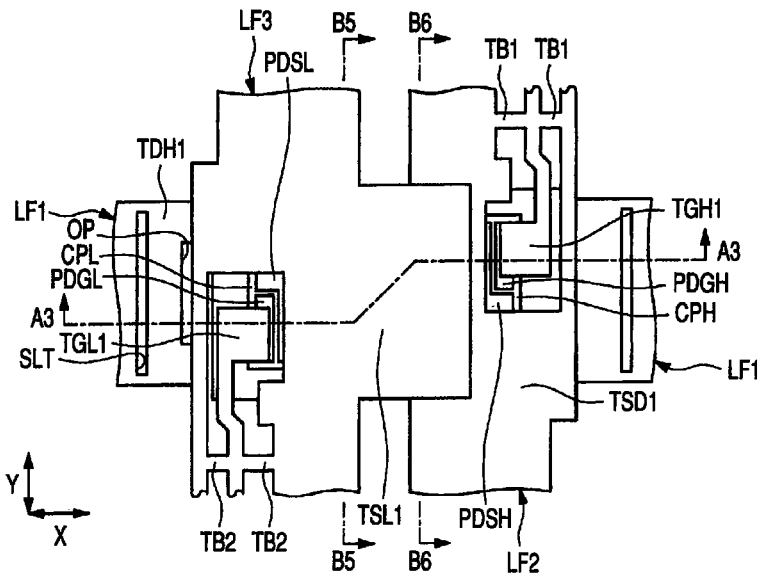
FIG. 27 is a plan view of the semiconductor device in a manufacturing process, following FIG. 25.
Figure 28:
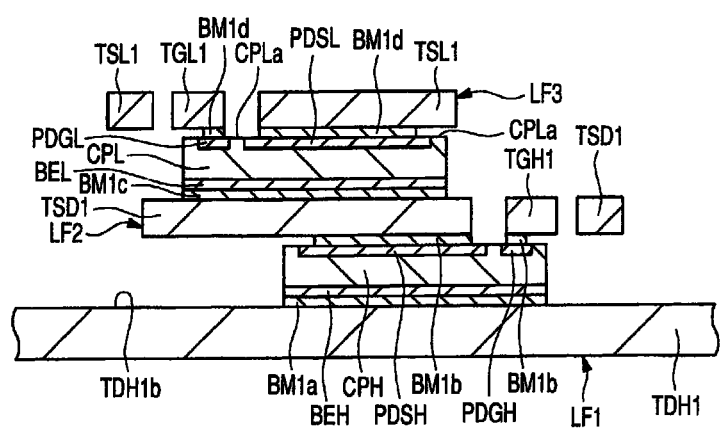
FIG. 28 is a sectional view of the same semiconductor device as in FIG. 27 in a manufacturing process.
Figure 31:
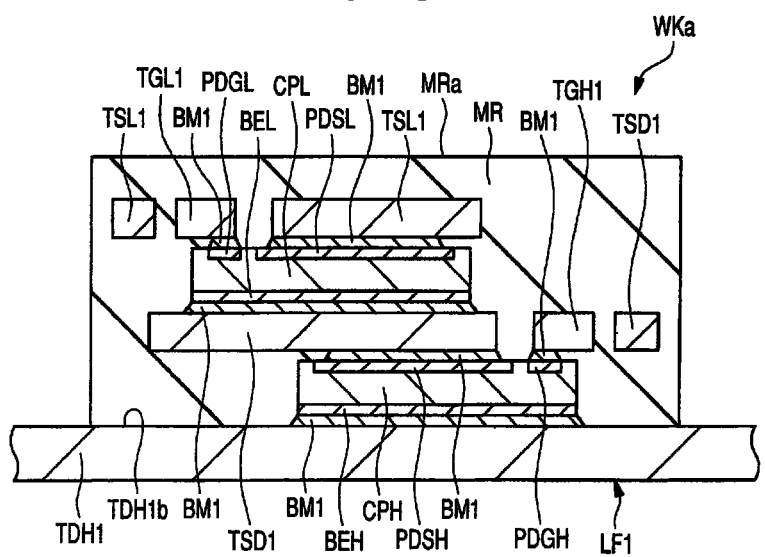
FIG. 31 is a sectional view of the same semiconductor device as in FIG. 30 in a manufacturing process.
Figure 32:
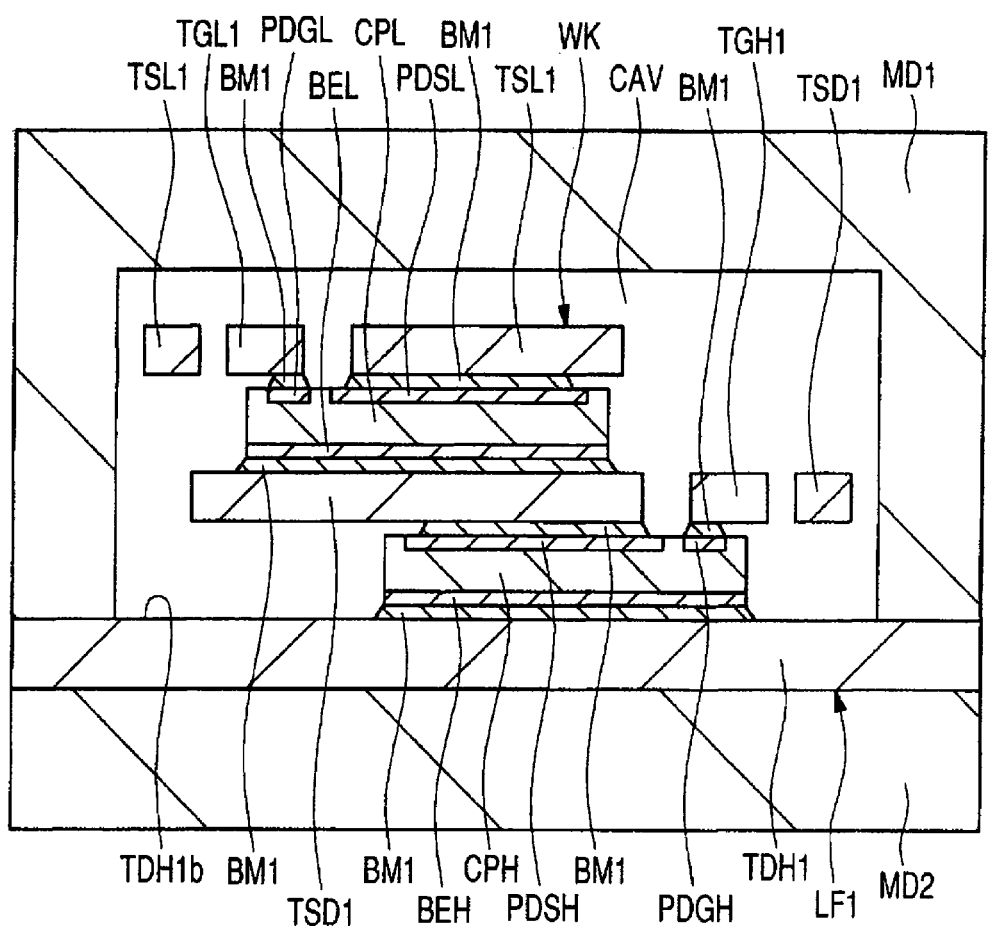
FIG. 32 is an explanatory drawing of a molding step.
Figure 33:
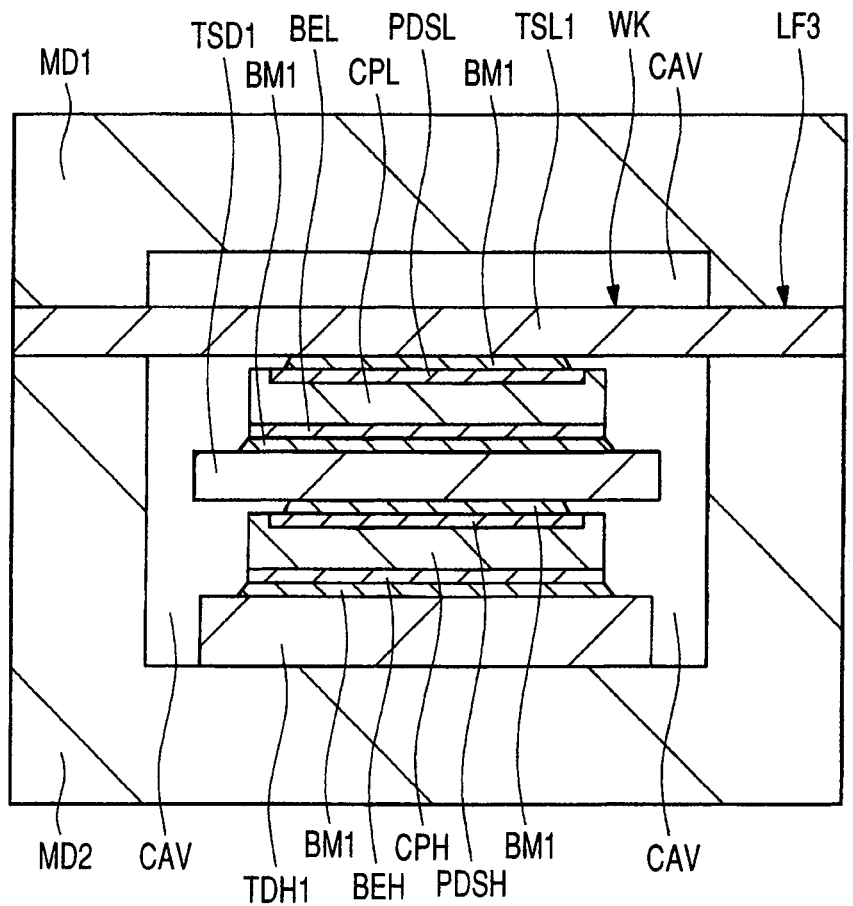
FIG. 33 is an explanatory drawing of a molding step.
Figure 34:
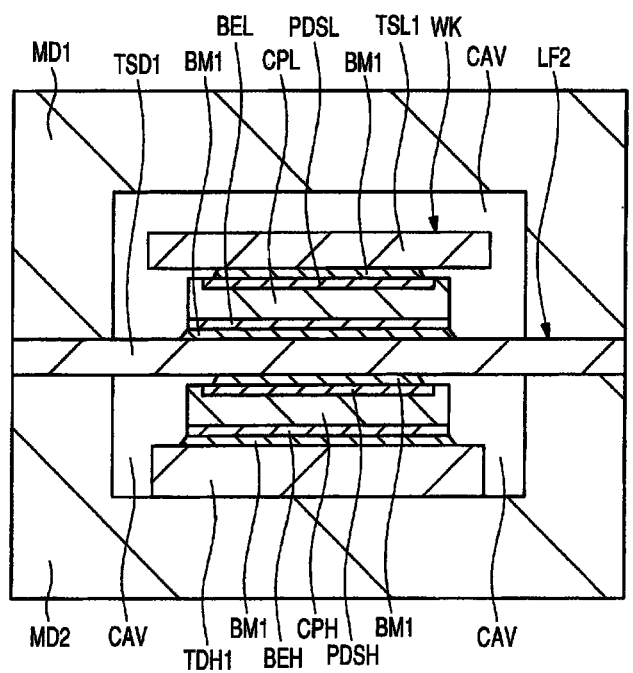
FIG. 34 is an explanatory drawing of a molding step.

FIG. 17 to FIG. 19 are substantial part plan views of lead frames LF1, LF2, LF3 used in a manufacturing process for the semiconductor device SM1 in this embodiment; and FIG. 20 is a substantial part sectional view of the lead frame LF1. FIG. 21 to FIG. 31 are plan views (substantial part plan views) or sectional views (substantial part sectional views) of the semiconductor device SM1 in this embodiment in manufacturing process. Of FIG. 21 to FIG. 31, FIG. 21, FIG. 23, FIG. 25, FIG. 27, and FIG. 30 are plan views (substantial part plan views); and FIG. 22, FIG. 24, FIG. 26, FIG. 28, FIG. 29, and FIG. 31 are sectional views (substantial part sectional views). FIG. 21 and FIG. 22 correspond to the same process step; FIG. 23 and FIG. 24 correspond to the same process step; FIG. 25 and FIG. 26 correspond to the same process step; FIG. 27 and FIG. 28 correspond to the same process step; and FIG. 30 and FIG. 31 correspond to the same process step. FIG. 22, FIG. 24, FIG. 26, FIG. 28, FIG. 29, and FIG. 31 depict the same planar area and the sectional views in FIG. 22, FIG. 24, FIG. 26, FIG. 28, FIG. 29, and FIG. 31 substantially correspond to the section taken in the position of line A3-A3 of FIG. 17 and FIG. 27. FIG. 32 to FIG. 34 are explanatory drawings of a molding step.

First, the semiconductor chips CPH, CPL and the lead frames LF1, LF2, LF3 illustrated in FIG. 17 to FIG. 20 are prepared. In this embodiment, two semiconductor chips CPH, CPL are used to manufacture one semiconductor device SM1. As mentioned above, the semiconductor chip CPH has the source pad electrode PDSH and the gate pad electrode PDGH in its front surface CPHa and the back surface drain electrode BEH in its entire back surface; and the semiconductor chip CPL has the source pad electrode PDSL and the gate pad electrode PDGL in its front surface CPLa and the back surface drain electrode BEL in its entire back surface.

As illustrated in FIG. 17, the lead frame LF1 has a drain terminal portion TDH1 that becomes the drain terminal TDH later. As illustrated in FIG. 18, the lead frame LF2 has a source-drain terminal portion TSD1 that becomes the source-drain terminal TSD later and a gate terminal portion TGH1 that becomes the gate terminal TGH later. As illustrated in FIG. 19, the lead frame LF3 has a source terminal portion TSL1 that becomes the source terminal TSL later and a gate terminal portion TGL1 that becomes the gate terminal TGL later. Not only the drain terminal portion TDH1 of the lead frame LF1 but also the source-drain terminal portion TSD1, gate terminal portions TGH1, TGL1, and source terminal portion TSL1 of the lead frames LF2, LF3 are flat and unbent. In the lead frame LF2, the gate terminal portion TGH1 is coupled with the source-drain terminal portion TSD1 through a tie bar TB1 in an area outside the encapsulation resin portion MR to be formed later. In the lead frame LF3, the gate terminal portion TGL1 is coupled with the source terminal portion TSL1 through a tie bar TB2 in an area outside the encapsulation resin portion MR to be formed later.

The lead frame LF1 illustrated in FIG. 17 is provided with slits SLT in planned cutting positions (positions in which the drain terminal TDH is separated from the lead frame LF1 after the formation of the encapsulation resin portion MR).

This makes it easier to cut the lead frame LF1 after the formation of the encapsulation resin portion MR. The lead frames LF2, LF3 may also be provided with slits in planned cutting positions (located in areas not shown in FIG. 18 or FIG. 19). FIG. 20 is a sectional view of the lead frame LF1 substantially corresponding to line A3-A3 of FIG. 17; in FIG. 20, however, the slits SLT in the lead frame LF1 and the above-mentioned openings OP are omitted to facilitate visualization. This is the same with FIG. 22, FIG. 24, FIG. 26, FIG. 28, FIG. 29, and FIG. 31. Meanwhile, in the sectional views in FIG. 7 and FIG. 8, the openings OP are depicted.

FIG. 17 to FIG. 19 substantially depict an area in the lead frames LF1, LF2, LF3 where one semiconductor device SM1 is formed. The drain terminal portion TDH1 is integrally coupled to the frame (not shown) of the lead frame LF1; the source-drain terminal portion TSD1 and the gate terminal portion TGH1 are integrally coupled to the frame (not shown) of the lead frame LF2; and the source terminal portion TSL1 and the gate terminal portion TGL1 are integrally coupled to the frame (not shown) of the lead frame LF3. The lead frames LF1, LF2, LF3 can be fabricated by processing a metal plate (copper plate or the like) into a predetermined shape by, for example, molding (press work), etching, or the like.

It is desirable that the thickness of the lead frame LF1 (corresponding to the thickness T1 of the drain terminal TDH) should be lager than the following thicknesses: the thickness of the lead frame LF2 (corresponding to the thickness T2 of the gate terminal TGH and the thickness T3 of the source-drain terminal TSD); and the thickness of the lead frame LF3 (corresponding to the thickness T4 of the gate terminal TGL and the thickness T5 of the source terminal TSL). The reason for this is as described with respect to the relation between the thicknesses T1 to T5.

After the preparation of the semiconductor chips CPH, CPL and the lead frames LF1, LF2, LF3, the following processing is carried out as illustrated in FIG. 21 (plan view) and FIG. 22 (sectional view): a conductive bonding material BM1$a$ is placed over (applied to) the main surface (upper surface) TDH1$b$ of the drain terminal portion TDH1 of the lead frame LF1 and then the semiconductor chip CPH is placed (mounted). The main surface TDH1$b$ of the drain terminal portion TDH1 corresponds to the main surface of the drain terminal TDH on the opposite side to the main surface TDH$a$. As a result, the semiconductor chip CPH is placed (mounted) over the main surface TDH1$b$ of the drain terminal portion TDH1 of the lead frame LF1 with the bonding material BM1$a$ in-between; and it is temporarily fixed by the adhesiveness (adhesion) of the bonding material BM1$a$. The bonding material BM1$a$ is, for example, solder paste or silver paste. The semiconductor chip CPH is mounted so that the back surface drain electrode BEH is opposed to the main surface (upper surface) TDH1$b$ of the drain terminal portion TDH1 of the lead frame LF1.

Subsequently, the following processing is carried out as illustrated in FIG. 23 (plan view) and FIG. 24 (sectional view): a conductive bonding material BM1$b$ is placed over (applied to) the source pad electrode PDSH and gate pad electrode PDGH in the front surface CPHa of the semiconductor chip CPH; and then the lead frame LF2 is placed over the front surface CPHa of the semiconductor chip CPH. At this time, the lead frame LF2 is placed over the lead frame LF1 and the semiconductor chip CPH so that the following is implemented: the source-drain terminal portion TSD1 of the lead frame LF2 is placed over the source pad electrode PDSH of the semiconductor chip CPH; and the gate terminal portion TGH1 of the lead frame LF2 is placed over the gate pad electrode PDGH of the semiconductor chip CPH. As a result, the following is implemented: the source-drain terminal portion TSD1 of the lead frame LF2 is placed over the source pad electrode PDSH of the semiconductor chip CPH with the bonding material BM1$b$ in-between; the gate terminal portion TGH1 of the lead frame LF2 is placed over the gate pad electrode PDGH of the semiconductor chip CPH with the bonding material BM1$b$ in-between; and they are temporarily fixed by the adhesiveness (adhesion) of the bonding material BM1$b$. The bonding material BM1$b$ is, for example, solder paste or silver paste and is desirably the same bonding material as the bonding material BM1$a$.

Subsequently, the following processing is carried out as illustrated in FIG. 25 (plan view) and FIG. 26 (sectional view): a conductive bonding material BM1$c$ is placed over (applied to) the main surface (upper surface) TSD1$a$ of the source-drain terminal portion TSD1 of the lead frame LF2 and then the semiconductor chip CPL is placed (mounted). As a result, the following is implemented: the semiconductor chip CPL is placed (mounted) over the main surface TSD1$a$ of the source-drain terminal portion TSD1 of the lead frame LF2 with the bonding material BM1$c$ in-between and is temporarily fixed by the adhesiveness (adhesion) of the bonding material BM1$c$. The bonding material BM1$c$ is, for example, solder paste or silver paste and is desirably the same bonding material as the bonding materials BM1$a$, BM1$b$. The main surface TSD1$a$ of the source-drain terminal portion TSD1 of the lead frame LF2 is the main surface on the opposite side to the side where it is opposed to the semiconductor chip CPH. The semiconductor chip CPL is so mounted that the back surface drain electrode BEL is opposed to the main surface (upper surface) TSD1$a$ of the source-drain terminal portion TSD1 of the lead frame LF2.

As seen from FIG. 21 to FIG. 26, the source-drain terminal portion TSD1 of the lead frame LF2 is so arranged that it does not planarly overlap with the gate pad electrode PDGH of the semiconductor chip CPH; and the semiconductor chip CPL is placed over this source-drain terminal portion TSD1 of the lead frame LF2. For this reason, the semiconductor chip CPL is placed in a position displaced from the semiconductor chip CPH as viewed in a plane. Therefore, the back surface drain electrode BEL of the semiconductor chip CPL is not in contact with the gate terminal portion TGH1 of the lead frame LF2.

Subsequently, the same processing as carried out on the semiconductor chip CPH is carried out as illustrated in FIG. 27 (plan view) and FIG. 28 (sectional view): a conductive bonding material BM1$d$ is placed over (applied to) the source pad electrode PDSL and gate pad electrode PDGL in the front surface CPLa of the semiconductor chip CPL; and then the lead frame LF3 is placed over the front surface CPLa of the semiconductor chip CPL. At this time, the lead frame LF3 is so placed that the following is implemented: the source terminal portion TSL1 of the lead frame LF3 is placed over the source pad electrode PDSL of the semiconductor chip CPL; and the gate terminal portion TGL1 of the lead frame LF3 is placed over the gate pad electrode PDGL of the semiconductor chip CPL. As a result, the following is implemented: the source terminal portion TSL1 of the lead frame LF3 is placed over the source pad electrode PDSL of the semiconductor chip CPL with the bonding material BM1$d$ in-between; the gate terminal portion TGL1 of the lead frame LF3 is placed over the gate pad electrode PDGL of the semiconductor chip CPL with the bonding material BM1$d$ in-between; and they are temporarily fixed by the adhesiveness (adhesion) of the bonding material BM1$d$. The bonding material BM1$d$ is, for example, solder paste or silver paste and is desirably the same bonding material as the bonding materials BM1a, BM1b, BM1c.

In FIG. 27, the position corresponding to line A3-A3 of FIG. 17 is indicated by an alternate long and short dash line representing line A3-A3. Therefore, the sectional view taken along line A3-A3 of FIG. 27 substantially corresponds to FIG. 28.

Subsequently, the bonding materials BM1a, BM1b, BM1c, BM1d are cured. As a result, the bonding materials BM1a, BM1b, BM1c, BM1d are cured and turned into the bonding material BM1. When the bonding materials BM1a, BM1b, BM1c, BM1d are solder paste, the bonding materials BM1a, BM1b, BM1c, BM1d comprised of solder paste are melted and solidified (resolidified) by solder reflow and they are turned into the bonding material BM1 comprised of solder. When the bonding materials BM1a, BM1b, BM1c, BM1d are silver paste, the bonding materials BM1a, BM1b, BM1c, BM1d comprised of silver paste are cured by heat treatment or the like and are turned into the bonding material BM1 comprised of cured silver paste.

Figure 29:
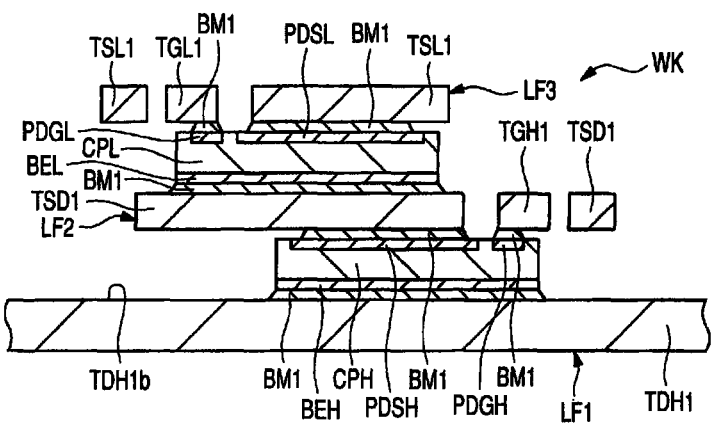
FIG. 29 is a sectional view of the semiconductor device in a manufacturing process, following FIG. 28.

As the result of the step of curing the bonding materials BM1a to BM1d, the following is implemented as illustrated in FIG. 29: the back surface drain electrode BEH of the semiconductor chip CPH and the drain terminal portion TDH1 of the lead frame LF1 are joined and electrically coupled together through the bonding material BM1 (cured bonding material BM1a); the source pad electrode PDSH of the semiconductor chip CPH and the source-drain terminal portion TSD1 of the lead frame LF2 are joined and electrically coupled together through the bonding material BM1 (cured bonding material BM1b); the gate pad electrode PDGH of the semiconductor chip CPH and the gate terminal portion TGH1 of the lead frame LF2 are joined and electrically coupled together through the bonding material BM1 (cured bonding material BM1b); the back surface drain electrode BEL of the semiconductor chip CPL and the source-drain terminal portion TSD1 of the lead frame LF2 are joined and electrically coupled together through the bonding material BM1 (cured bonding material BM1c); the source pad electrode PDSL of the semiconductor chip CPL and the source terminal portion TSL1 of the lead frame LF3 are joined and electrically coupled together through the bonding material BM1 (cured bonding material BM1d); and the gate pad electrode PDGL of the semiconductor chip CPL and the gate terminal portion TGL1 of the lead frame LF3 are joined and electrically coupled together through the bonding material BM1 (cured bonding material BM1d). As a result, an assembly (work) WK comprised of the lead frames LF1 to LF3 and the semiconductor chips CPH, CPL joined between them is obtained. The plan view obtained in the stage in which the bonding materials BM1a to BM1d are cured (the same process step as in FIG. 29) is the same as FIG. 27.

When the source terminal portion TSL1 of the lead frame LF3 covers the gate pad electrode PDGH of the semiconductor chip CPH from above unlike this embodiment, the source terminal portion TSL1 interferes. This makes it difficult to observe the state of junction between the gate terminal portion TGH1 of the lead frame LF2 and the gate pad electrode PDGH of the semiconductor chip CPH through the bonding material BM1 (appearance inspection).

In this embodiment, meanwhile, (the source terminal portion TSL1 or the gate terminal portion TGL1 of) the lead frame LF3 is not located over the gate pad electrode PDGH of the semiconductor chip CPH in the assembly WK. That is, the source terminal portion TSL1 or gate terminal portion TGL1 of the lead frame LF3 does not planarly overlap with the gate pad electrode PDGH of the semiconductor chip CPH. For this reason, the source terminal portion TSL1 or gate terminal portion TGL1 of the lead frame LF3 does not interfere after the bonding materials BM1a to BM1d are cured and before the encapsulation resin portion MR is formed. Therefore, it is possible to observe the state of junction between the gate terminal portion TGH1 of the lead frame LF2 and the gate pad electrode PDGH of the semiconductor chip CPH through the bonding material BM1 from above (appearance inspection). (The above cited here means above the gate terminal portion TGH1 of the lead frame LF2.) Further, it is also possible to observe the state of junction between the source-drain terminal portion TSD1 of the lead frame LF2 and the source pad electrode PDSH of the semiconductor chip CPH through the bonding material BM1 from above (appearance inspection). As a result, it is possible to enhance the reliability of the manufactured semiconductor device SM1 (the reliability of coupling of terminals).

To facilitate this observation (appearance inspection), it is more desirable to take the following measure as illustrated in FIG. 27: part of each of the gate pad electrode PDGH and source pad electrode PDSH of the semiconductor chip CPH is prevented from planarly overlapping with the gate terminal portion TGH1, source-drain terminal portion TSD1, source terminal portion TSL1, or gate terminal portion TGL1. That is, it is more desirable that the following state should be established: part (most part) of the gate pad electrode PDGH of the semiconductor chip CPH planarly overlaps with the gate terminal portion TGH1; but the remaining part does not planarly overlap with the gate terminal portion TGH1, source-drain terminal portion TSD1, source terminal portion TSL1, or gate terminal portion TGL1 of the lead frames LF2, LF3. Further, it is more desirable that the following state should be established: part (most part) of the source pad electrode PDSH of the semiconductor chip CPH planarly overlaps with the source-drain terminal portion TSD1 of the lead frame LF2; but the remaining part does not planarly overlap with the gate terminal portion TGH1, source-drain terminal portion TSD1, source terminal portion TSL1, or gate terminal portion TGL1 of the lead frames LF2, LF3.

In this embodiment, any other terminal portion is not placed over the gate terminal portion TGL1 of the lead frame LF3 in the assembly WK. For this reason, the following can be implemented after the bonding materials BM1a to BM1d are cured and before the encapsulation resin portion MR is formed: the state of junction between the gate terminal portion TGL1 of the lead frame LF3 and the gate pad electrode PDGL of the semiconductor chip CPL through the bonding material BM1 can be observed from above (appearance inspection). (The above cited here means above the gate terminal portion TGL1 of the lead frame LF3.) Further, the state of junction between the source terminal portion TSL1 of the lead frame LF3 and the source pad electrode PDSL of the semiconductor chip CPL through the bonding material BM1 can also be observed from above (appearance inspection). As a result, it is possible to enhance the reliability of the manufactured semiconductor device SM1 (the reliability of coupling of terminals). To facilitate this observation (appearance inspection), it is more desirable to take the following measure as illustrated in FIG. 27: part of each of the gate pad electrode PDGL and source pad electrode PDSL of the semiconductor chip CPL is prevented from planarly overlapping with the source terminal portion TSL1 or the gate terminal portion TGL1. That is, it is more desirable that the following state should be established: part (most part) of the gate pad electrode PDGL of the semiconductor chip CPL planarly overlaps with the gate terminal portion TGL1; but the remaining part does not planarly overlap with the source terminal portion TSL1 or gate terminal portion TGL1 of the lead frame LF3. Further, it is more desirable that the following state should be established: part (most part) of the source pad electrode PDSL of the semiconductor chip CPL planarly overlaps with the source terminal portion TSL1; but the remaining part does not planarly overlap with the source terminal portion TSL1 or gate terminal portion TGL1 of the lead frame LF3.

When the above observation (appearance inspection) is carried out in cases where the bonding material BM1 is solder, an especially profound effect is obtained. This is because the state of junction through the solder (bonding material BM1) can be observed by observing the state of solder (bonding material BM1) sucking up to the side wall of each terminal portion.

Figure 30:
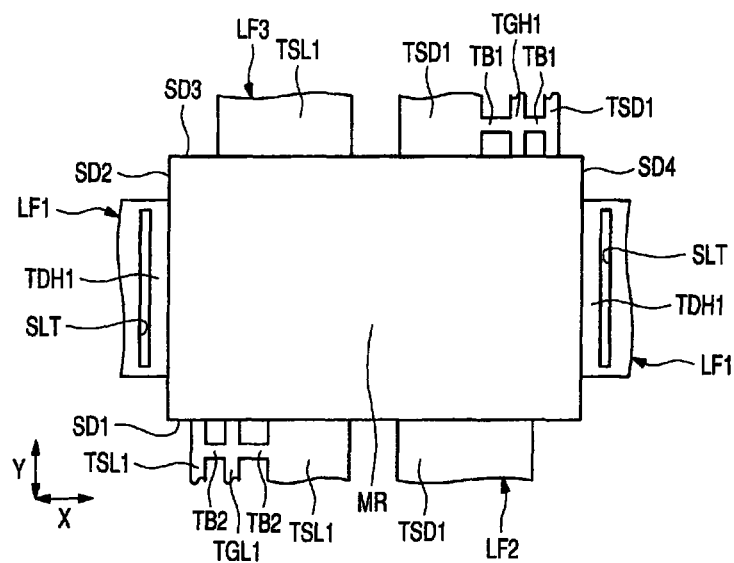
FIG. 30 is a plan view of the semiconductor device in a manufacturing process, following FIG. 29.

Subsequently, a molding step (resin sealing step, for example, transfer molding step) is carried out to form the encapsulation resin portion MR as illustrated in FIG. 30 (plan view) and FIG. 31 (sectional view). The semiconductor chips CPH, CPL are thereby sealed with the encapsulation resin portion MR. Description will be given of this molding step with reference to FIG. 32 to FIG. 34.

FIG. 32 to FIG. 34 illustrate the assembly WK fixed in molding dies MD1, MD2 (upper die MD1 and lower die MD2) at this molding step. FIG. 32 shows the section taken in the position corresponding to line A3-A3 of FIG. 27 (that is, the section corresponding to FIG. 29). FIG. 33 shows the section taken in the position corresponding to line B5-B5 of FIG. 27. (Line B5-B5 of FIG. 27 substantially corresponds to line B2-B2 of FIG. 13.) FIG. 34 shows the section taken in the position corresponding to line B6-B6 of FIG. 27. (Line B6-B6 of FIG. 27 substantially corresponds to line B3-B3 of FIG. 13.)

To carry out the molding step, first, the assembly WK is fixed in the molding dies MD1, MD2. That is, as illustrated in FIG. 32 to FIG. 34, the lead frames LF1 to LF3 are sandwiched and clamped (fixed) between the molding dies MD1, MD2 so that the following is implemented: the semiconductor chips CPH, CPL are placed in the cavity CAV formed by the under surface of the upper die MD1 and the upper surface of the lower die MD2.

At this time, the following state is established to expose the main surface TDHa of the drain terminal TDH from the encapsulation resin portion MR as illustrated in FIG. 32 to FIG. 34: the under surface of the drain terminal portion TDH1 of the lead frame LF1 (the main surface on the opposite side to the side where the semiconductor chip CPH is mounted) is in contact with the upper surface of the lower die MD2. The source-drain terminal portion TSD1 and gate terminal portion TGH1 of the lead frame LF2 are so arranged that the following is implemented: their portions to be positioned outside the encapsulation resin portion MR are sandwiched between (the under surface of) the upper die MD1 and (the upper surface of) the lower die MD2; and their portions to be positioned inside the encapsulation resin portion MR (portions opposed to the semiconductor chips CPH, CPL) are placed in the cavity CAV. The source terminal portion TSL1 and gate terminal portion TGL1 of the lead frame LF3 are so arranged that the following is implemented: their portions to be positioned outside the encapsulation resin portion MR is sandwiched between (the under surface of) the upper die MD1 and (the upper surface of) the lower die MD2; and their portions to be positioned inside the encapsulation resin portion MR (portions opposed to the semiconductor chip CPL) are placed in the cavity CAV.

After the lead frames LF1 to LF3 are fixed and clamped between the molding dies MD1, MD2 as illustrated in FIG. 32 to FIG. 34, the following processing is carried out: encapsulation resin material as the material for the formation of the encapsulation resin portion MR is injected (introduced, filled) into the cavity CAV in the molding dies MD1, MD2. Then the injected encapsulation resin material is cured to form the encapsulation resin portion MR. The encapsulation resin material for the formation of the encapsulation resin portion MR is comprised of resin material or the like, for example, thermosetting resin material or the like, and may contain filler or the like. For example, epoxy resin or the like containing filler can be used. When the encapsulation resin material is comprised of thermosetting resin material, the encapsulation resin material can be heated and cured (turned into the cured encapsulation resin portion MR) by taking the following procedure: after the injection of encapsulation resin material into the cavity CAV of the molding dies MD1, MD2, the molding dies MD1, MD2 are heated up to a predetermined temperature. When the bonding material BM1 is solder, it is desirable that the temperature of the encapsulation resin material at the time of curing should be less than the melting point of the solder configuring the bonding material BM1. This makes it possible to prevent the solder from being melted while the encapsulation resin material is cured. Thus the encapsulation resin portion MR is formed.

Subsequently, the assembly WK (that is, assembly WKa) with the encapsulation resin portion MR formed thereon is released from the molding dies MD1, MD2 and any flash and the like are removed from the encapsulation resin portion MR. Thus the assembly (work) WKa illustrated in FIG. 30 and FIG. 31 is obtained. The assembly WKa is obtained by forming the encapsulation resin portion MR on the assembly WK.

At the molding step, there is hardly a gap between the under surface of the drain terminal portion TDH1 of the lead frame LF1 and the upper surface of the molding die MD2. Therefore, the encapsulation resin portion MR is hardly formed on the under surface of the drain terminal portion TDH1. For this reason, the following state is established in the assembly WKa: the under surface (corresponding to the main surface TDHa) of the drain terminal portion TDH1 of the lead frame LF1 is exposed from the back surface (corresponding to the main surface MRb) of the encapsulation resin portion MR. Even though any flash of the encapsulation resin portion MR is formed on the under surface of the drain terminal portion TDH1, it can be removed by the deflashing step subsequent to the molding step.

Subsequently, plating is carried out as required to form a plating layer (not shown) over the portions of the lead frames LF1 to LF3 exposed from the encapsulation resin portion MR. Solder plating can be carried out using, for example, lead-free solder.

Subsequently, the lead frames LF1, LF2, LF3 are cut in predetermined positions. That is, the tie bar TB1 is cut to separate the gate terminal portion TGH1 and the source-drain terminal portion TSD1 from each other; and the tie bar TB2 is cut to separate the gate terminal portion TGL1 and the source terminal portion TSL1 from each other. Thereafter, the drain terminal portion TDH1, source-drain terminal portion TSD1, gate terminal portion TGH1, source terminal portion TSL1, and gate terminal portion TGL1 are cut off (separated) from (the frames of) the lead frames LF1, LF2, LF3.

Subsequently, the portions of the source-drain terminal portion TSD1, gate terminal portion TGH1, source terminal portion TSL1, and gate terminal portion TGL1 protruded from the lateral surface of the encapsulation resin portion MR are bent. Thus the semiconductor device SM1 in this embodiment illustrated in FIG. 3 to FIG. 16 is manufactured.

The drain terminal portion TDH1 of the lead frame LF1 becomes the drain terminal TDH of the semiconductor device SM1; the source-drain terminal portion TSD1 of the lead frame LF2 becomes the source-drain terminal TSD of the semiconductor device SM1; and the gate terminal portion TGH1 of the lead frame LF2 becomes the gate terminal TGH of the semiconductor device SM1. In addition, the source terminal portion TSL1 of the lead frame LF3 becomes the source terminal TSL of the semiconductor device SM1 and the gate terminal portion TGL1 of the lead frame LF3 becomes the gate terminal TGL of the semiconductor device SM1.

<Configuration of Semiconductor Chip>

Description will be given of an example of the configuration of the semiconductor chips CPH, CPL used in the semiconductor device SM1 in this embodiment.

The semiconductor chips CPH, CPL used in this embodiment are power MOSFET chips (semiconductor chips in which a power MOSFET is formed) and are specifically semiconductor chips in which a vertical MOSFET is formed. The vertical MOSFET cited here corresponds to a MOSFET in which a source-drain current flows in the direction of the thickness of a semiconductor substrate (direction substantially perpendicular to the main surface of the semiconductor substrate). As mentioned above, a semiconductor chip in which a vertical MOSFET is formed is used for the semiconductor chips CPH, CPL. This is also intended to couple the semiconductor chip CPH (power MOS QH1) and the semiconductor chip CPL (power MOS QL1) in series so that the following is implemented: the semiconductor chip CPH is sandwiched between the drain terminal TDH and the source-drain terminal TSD and gate terminal TGH; and the semiconductor chip CPL is sandwiched between the source-drain terminal TSD and the source terminal TSL and gate terminal TGL.

Figure 35:
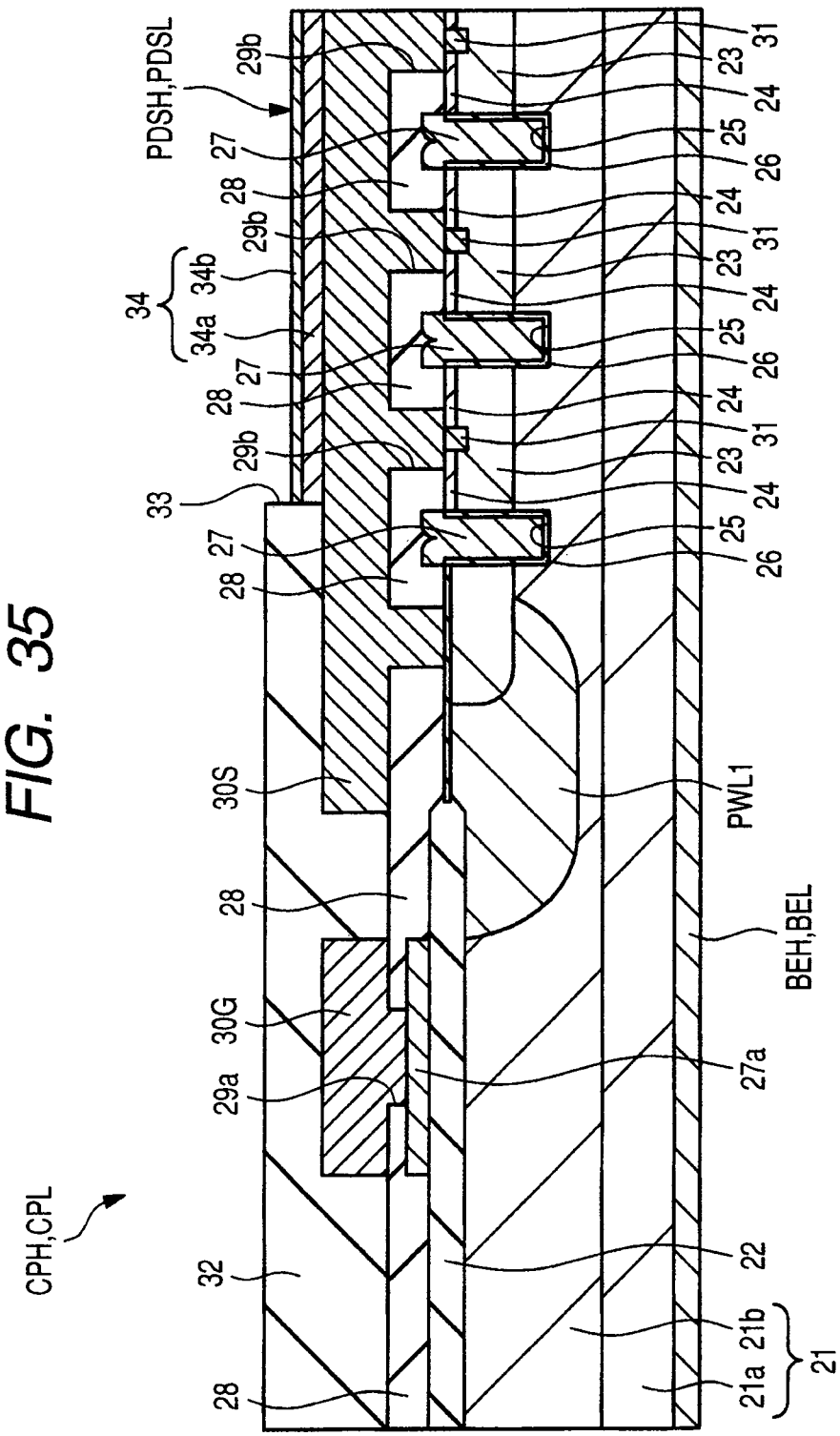
FIG. 35 is a substantial part sectional view of a semiconductor chip used in a semiconductor device in an embodiment of the invention.

Description will be given of an example of the configuration of the semiconductor chips CPH, CPL with reference to FIG. 35. FIG. 35 is a substantial part sectional view illustrating an example of the configuration of the semiconductor chips CPH, CPL. The power MOS QH1 is formed in the main surface of the semiconductor substrate (hereafter, simply referred to as substrate) 21 comprising the semiconductor chip CPH; and the power MOS QL1 is formed in the main surface of the substrate 21 comprising the semiconductor chip CPL.

As illustrated in FIG. 35, the substrate 21 includes: a substrate body (semiconductor substrate, semiconductor wafer) 21a comprised of $n^+$-type single crystal silicon or the like doped with, for example, arsenic (As); and an epitaxial layer (semiconductor layer) 21b comprised of, for example, a $n^-$-type silicon single crystal formed over the main surface of the substrate body 21a. For this reason, the substrate 21 is a so-called epitaxial wafer. In the main surface of this epitaxial layer 21b, there is formed a field insulating film (element isolation region) 22 comprised of, for example, silicon oxide or the like.

In cases where the semiconductor chip illustrated in FIG. 35 is the semiconductor chip CPH, multiple unit transistor cells comprising the power MOS QH1 are formed in the active region encircled with the field insulating film. 22 and a p-type well PWL1 positioned thereunder. The power MOS QH1 is formed by coupling these unit transistor cells in parallel. In cases where the semiconductor chip illustrated in FIG. 35 is the semiconductor chip CPL, multiple unit transistor cells comprising the power MOS QL1 are formed in the active region encircled with the field insulating film 22 and the p-type well PWL1 positioned thereunder. The power MOS QL1 is formed by coupling these unit transistor cells in parallel. Each unit transistor cell is formed of an n-channel power MOSFET with, for example, a trench gate structure.

The substrate body 21a and the epitaxial layer 21b function as the drain region of the unit transistor cells.

In cases where the semiconductor chip illustrated in FIG. 35 is the semiconductor chip CPH, the back surface drain electrode BEH is formed in the back surface of the substrate 21 (semiconductor chip CPH). In cases where the semiconductor chip illustrated in FIG. 35 is the semiconductor chip CPL, the back surface drain electrode BEL is formed in the back surface of the substrate 21 (semiconductor chip CPL). The back surface drain electrodes BEH, BEL are formed by, for example, stacking a titanium (Ti) layer, a nickel (Ni) layer, and a gold (Au) layer over the back surface of the substrate 21 in this order.

A p-type semiconductor region 23 formed in the epitaxial layer 21b functions as the channel formation region of the unit transistor cells. A $n^+$-type semiconductor region 24 formed at the upper part of the p-type semiconductor region 23 functions as the source region of the unit transistor cells. Therefore, the semiconductor region 24 is a semiconductor region for the source.

In the substrate 21, further, there are formed trenches 25 extended from its main surface in the direction of the thickness of the substrate 21. The trenches 25 are so formed that they are extended from the upper surface of the $n^+$-type semiconductor region 24, penetrate the $n^+$-type semiconductor region 24 and the p-type semiconductor region 23, and are terminated in the epitaxial layer 21b positioned thereunder. Over the bottom surface and lateral surface of each trench 25, there is formed a gate insulating film 26 comprised of, for example, silicon oxide. Each trench 25 is filled with a gate electrode 27 with the gate insulating film 26 in-between. The gate electrode 27 is comprised of, for example, a polycrystalline silicon film with an added n-type impurity (for example, phosphorus). The gate electrode 27 functions as the gate electrode of the unit transistor cells. Also over part of the field insulating film 22, there is formed a wiring portion 27a for gate extraction comprised of a conductive film in the same layer as the gate electrode 27. The gate electrodes 27 and the wiring portion 27a for gate extraction are integrally formed and electrically coupled to each other. In an area not shown in the sectional view in FIG. 35, the gate electrodes 27 and the wiring portion 27a for gate extraction are integrally coupled together. The wiring portion 27a for gate extraction is electrically coupled with gate wiring 30G through a contact hole 29a formed in an insulating film 28 covering it.

Meanwhile, source wiring 30S is electrically coupled with the $n^+$-type semiconductor region 24 for the source through contact holes 29b formed in the insulating film 28. The source wiring 30S is electrically coupled to $p^+$-type semiconductor regions 31 formed between the $n^+$-type semiconductor regions 24 at the upper part of the p-type semiconductor region 23 and electrically coupled with the p-type semiconductor region 23 for channel formation therethrough. The gate wiring 30G and the source wiring 30S can be formed by: forming a metal film, for example, an aluminum film (or an aluminum alloy film) over the insulating film 28 with the contact holes 29a, 29b formed therein so that the contact holes 29a, 29b are filled therewith; and patterning this metal film (aluminum film or aluminum alloy film). For this reason, the gate wiring 30G and the source wiring 30S are comprised of an aluminum film, an aluminum alloy film, or the like.

The gate wiring 30G and the source wiring 30S are covered with a protective film (insulating film) 32 comprised of polyimide resin or the like. This protective film 32 is the film (insulating film) in the uppermost layer of the semiconductor chips CPH, CPL.

In part of the protective film 32, there is formed an opening 33 exposing part of the gate wiring 30G and source wiring 30S positioned thereunder. In case of the semiconductor chip CPH, the portion of the gate wiring 30G exposed from the opening 33 is the gate pad electrode PDGH and the portion of the source wiring 30S exposed from the opening 33 is the source pad electrode PDSH. In case of the semiconductor chip CPL, the portion of the gate wiring 30G exposed from the opening 33 is the gate pad electrode PDGL and the portion of the source wiring 30S exposed from the opening 33 is the source pad electrode PDSL.

A metal layer 34 may be formed on the front surfaces of the source pad electrodes PDSH, PDSL and gate pad electrodes PDGH, PDGL by plating or the like. (That is, a metal layer 34 may be formed over the portions of the gate wiring 30G and source wiring 30S exposed at the bottom of the opening 33). This metal layer 34 is formed of a laminated film of a metal layer 34a formed over the gate wiring 30G and the source wiring 30S and a metal layer 34b formed thereover. The lower metal layer 34a is comprised of, for example, nickel (Ni) and functions mainly to suppress or prevent oxidation of aluminum in the gate wiring 30G and source wiring 30S as its base. The upper metal layer 34b is comprised of, for example, gold (Au) and functions mainly to suppress or prevent oxidation of nickel in the metal layer 34a as its base.

In the thus configured semiconductor chips CPH, CPL, the operating current of each unit transistor of the power MOSs QH1, QL1 flows between the epitaxial layer 21b for drain and the $n^+$-type semiconductor region 24 for source. At this time, it flows in the direction of the thickness of the substrate 21 along the lateral surface of each gate electrode 27 (that is, the lateral surface of each trench 25). That is, channels are formed along the direction of the thickness of the semiconductor chips CPH, CPL.

<Mounting of Semiconductor Device>

Figure 36:
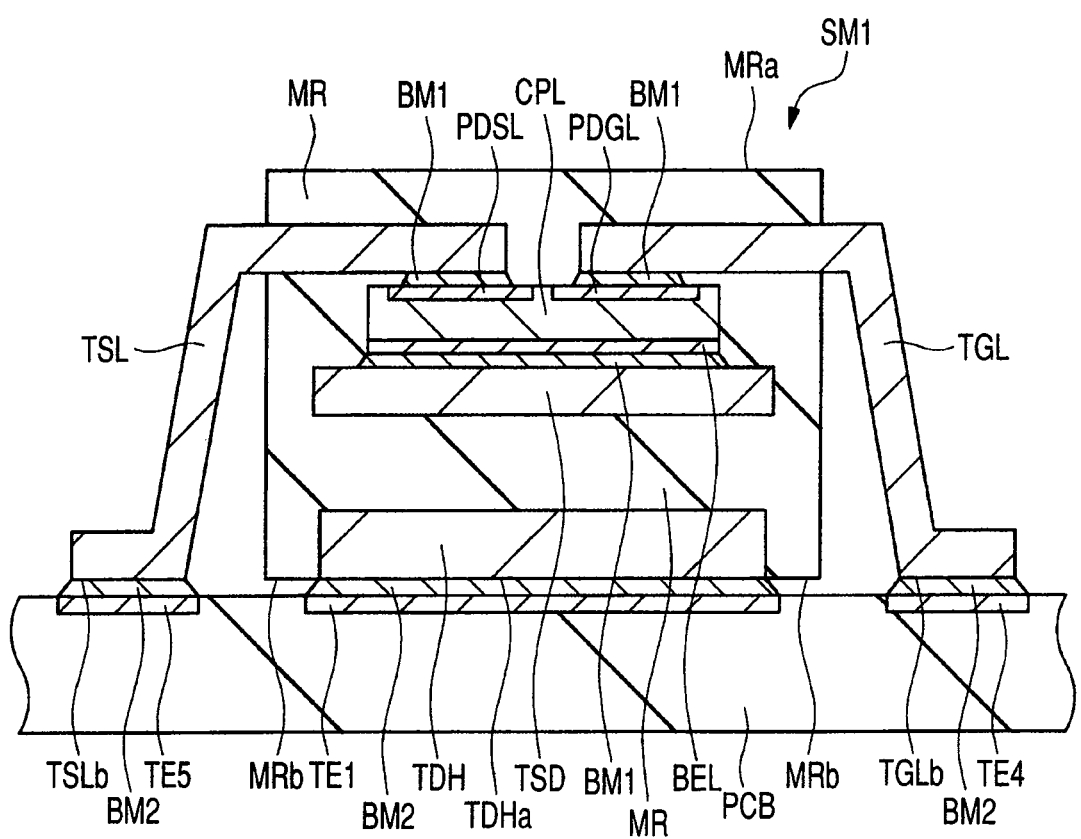
FIG. 36 is a substantial part sectional view illustrating a semiconductor device in an embodiment of the invention as is mounted over a mounting board.
Figure 37:
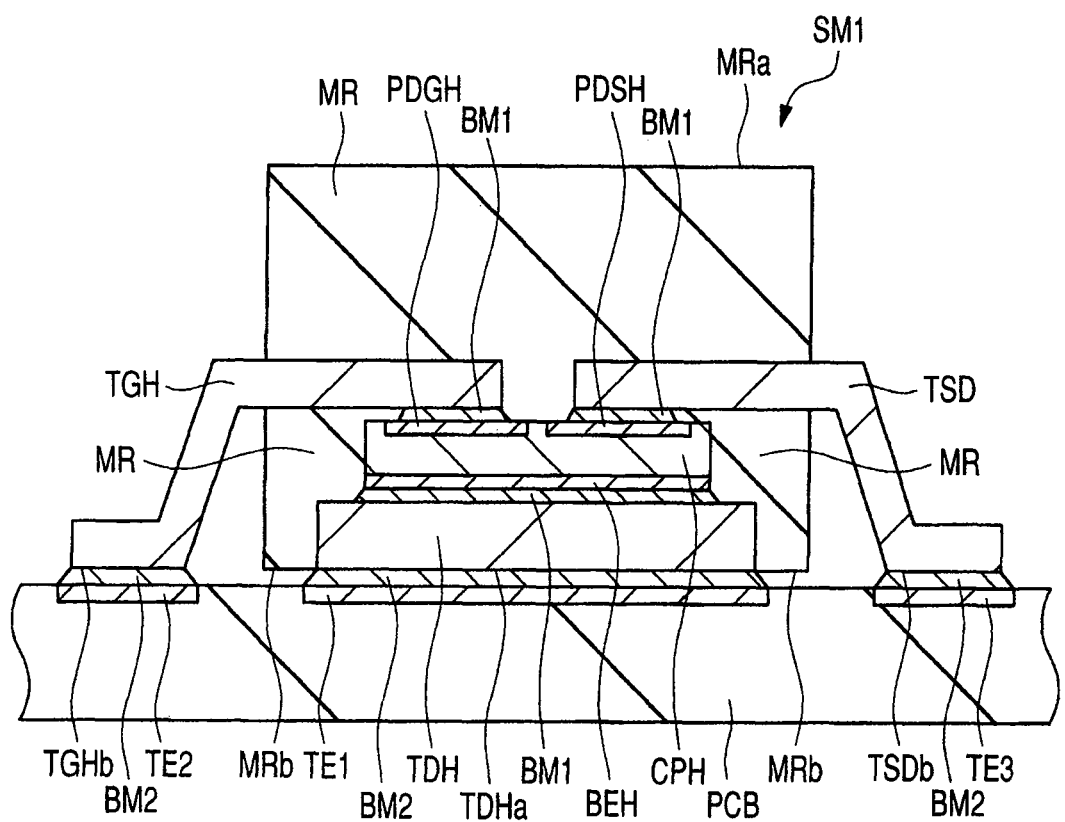
FIG. 37 is a substantial part sectional view illustrating a semiconductor device in an embodiment of the invention as is mounted over a mounting board.

FIG. 36 and FIG. 37 are substantial part sectional views of the semiconductor device SM1 in this embodiment mounted over a mounting board (wiring substrate) PCB. FIG. 36 shows the section corresponding to FIG. 9 and FIG. 37 shows the section corresponding to FIG. 12.

As illustrated in FIG. 36 and FIG. 37, the semiconductor device SM1 is mounted over the mounting board (wiring substrate) PCB. At this time, the back surface side of the semiconductor device SM1 (that is, the main surface MRb side of the encapsulation resin portion MR) is used as the mounting surface for mounting to the mounting board PCB. (The main surface TDHa of) the drain terminal TDH exposed in the main surface MRb of the encapsulation resin portion MR is joined with a terminal TE1 of the mounting board PCB through a conductive bonding material BM2 and electrically coupled thereto. (The under surface TGHb of) the outer lead portion of the gate terminal TGH is joined with a terminal TE2 of the mounting board PCB through the conductive bonding material BM2 and electrically coupled thereto. (The under surface TSDb of) the outer lead portion of the source-drain terminal TSD is joined with a terminal TE3 of the mounting board PCB through the conductive bonding material BM2 and electrically coupled thereto. (The under surface TGLb of) the outer lead portion of the gate terminal TGL is joined with a terminal TE4 of the mounting board PCB through the conductive bonding material BM2 and electrically coupled thereto. (The under surface TSLb of) the outer lead portion of the source terminal TSL is joined with a terminal TE5 of the mounting board PCB through the conductive bonding material BM2 and electrically coupled thereto. The conductive bonding material BM2 is comprised of, for example, solder.

Second Embodiment

With respect to the second embodiment, description will be given of another manufacturing method for the semiconductor device SM1 in the first embodiment.

Figure 38:
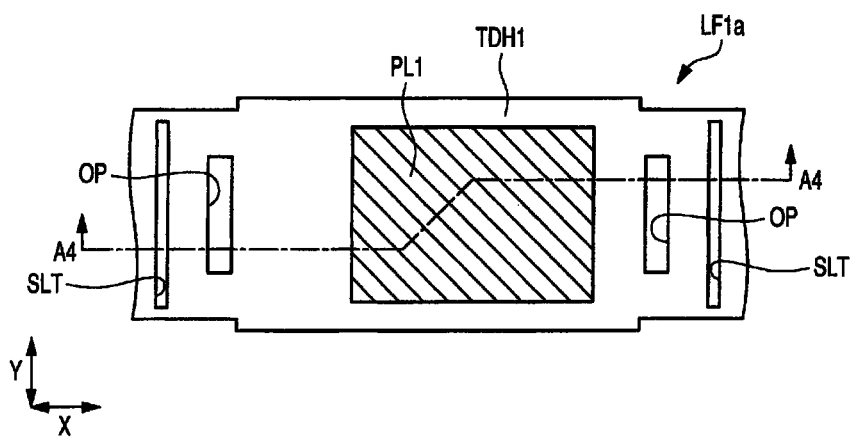
FIG. 38 is a substantial part plan view of a lead frame used in a manufacturing process for a semiconductor device in another embodiment of the invention.
Figure 39:
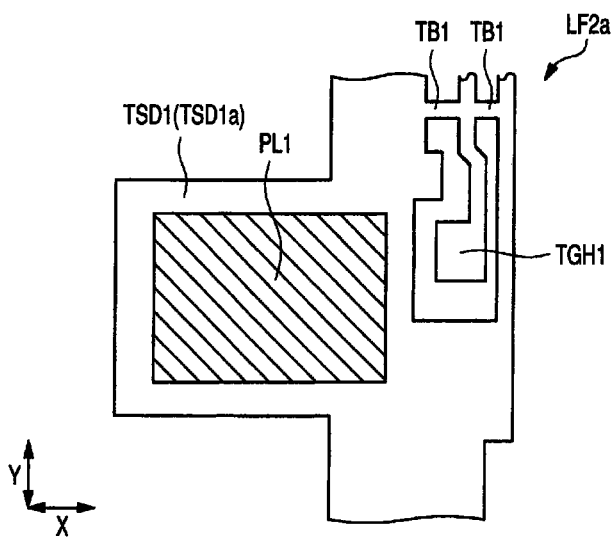
FIG. 39 is a substantial part plan view of a lead frame used in a manufacturing process for a semiconductor device in another embodiment of the invention.
Figure 40:
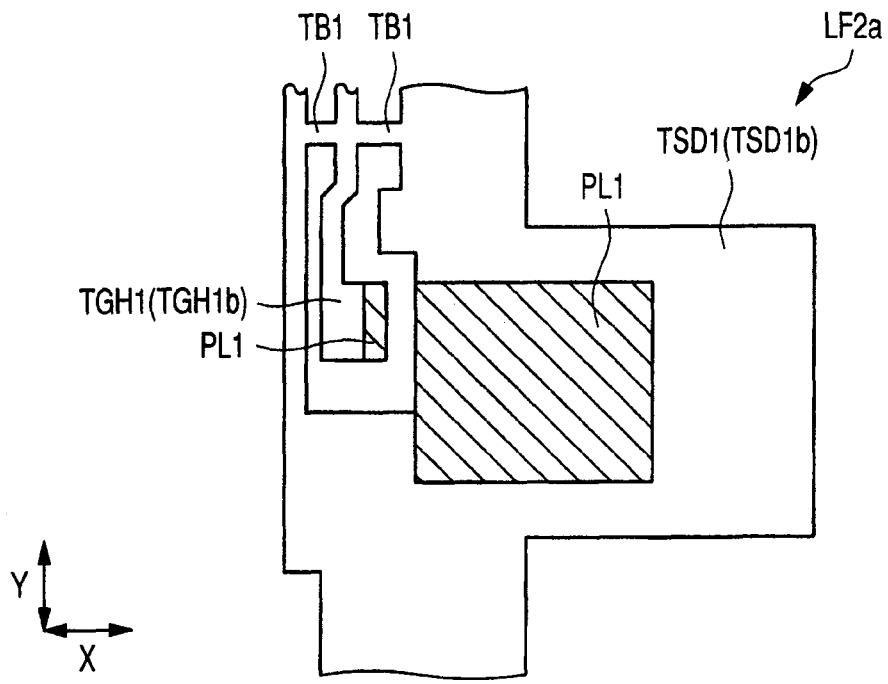
FIG. 40 is a substantial part plan view of a lead frame used in a manufacturing process for a semiconductor device in another embodiment of the invention.
Figure 41:
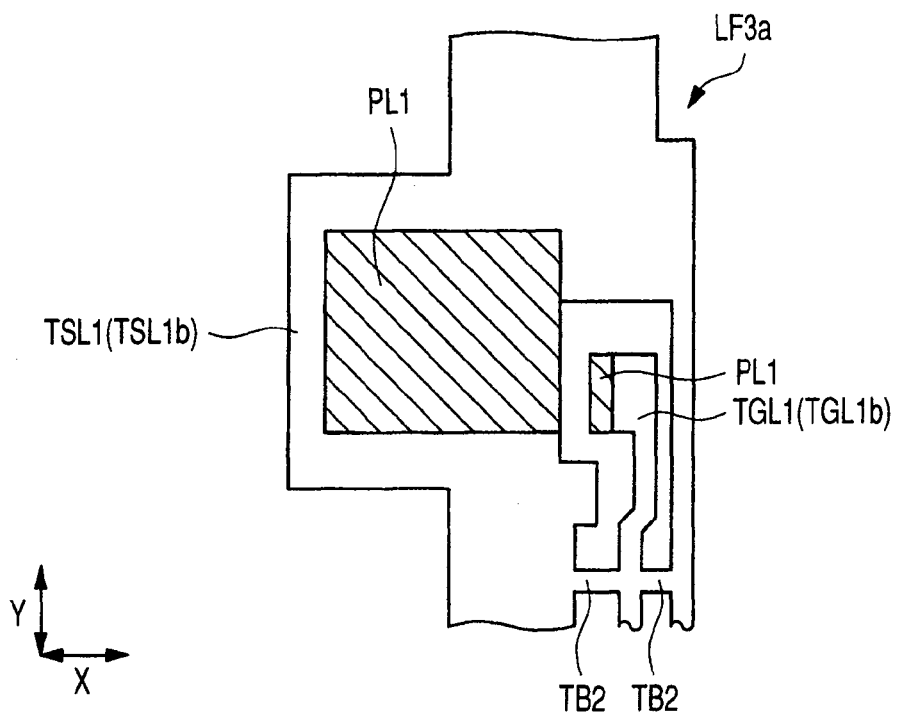
FIG. 41 is a substantial part plan view of a lead frame used in a manufacturing process for a semiconductor device in another embodiment of the invention.
Figure 42:
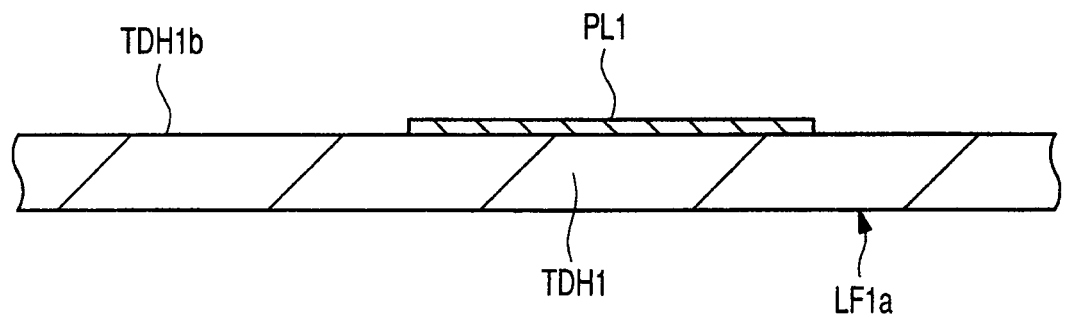
FIG. 42 is a substantial part sectional view of a lead frame used in a manufacturing process for a semiconductor device in another embodiment of the invention.
Figure 43:
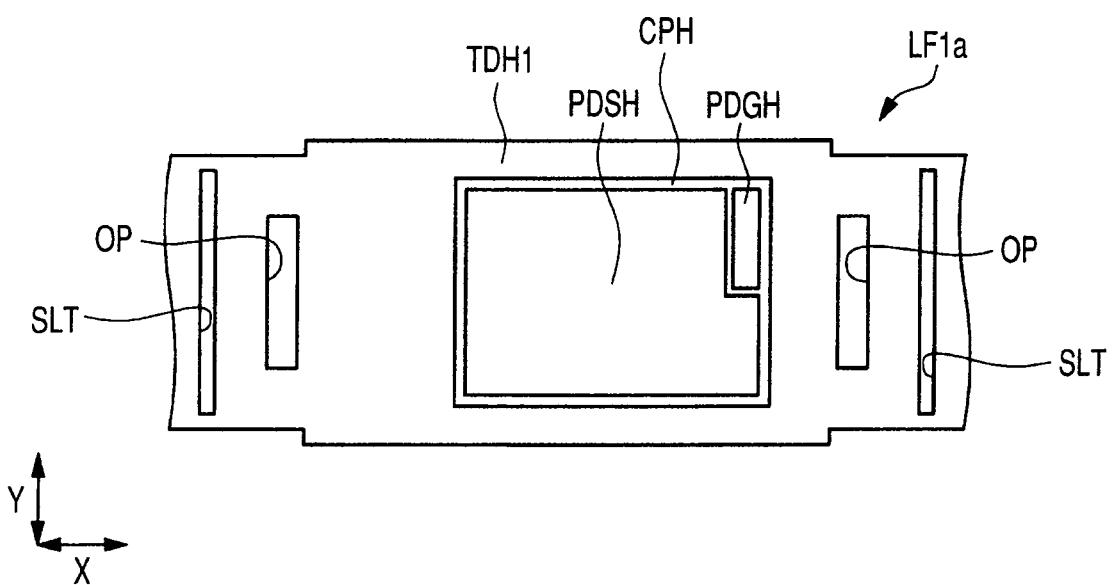
FIG. 43 is a plan view of a semiconductor device in another embodiment of the invention in a manufacturing process.
Figure 44:
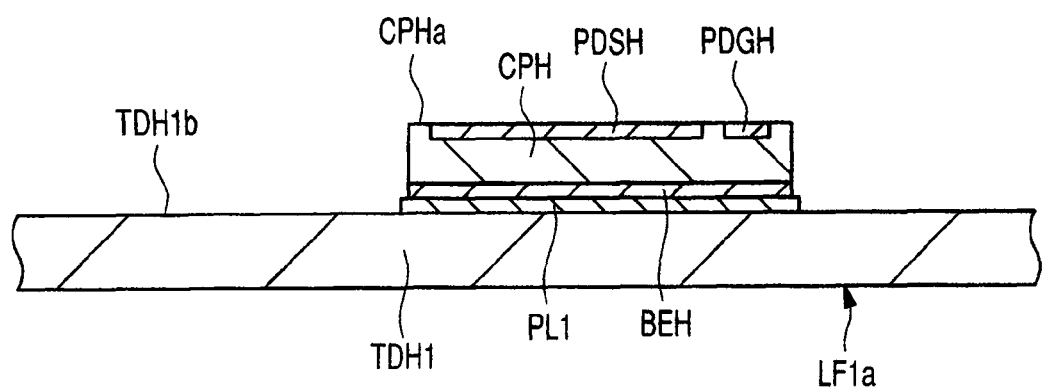
FIG. 44 is a sectional view of the same semiconductor device as in FIG. 43 in a manufacturing process.
Figure 45:
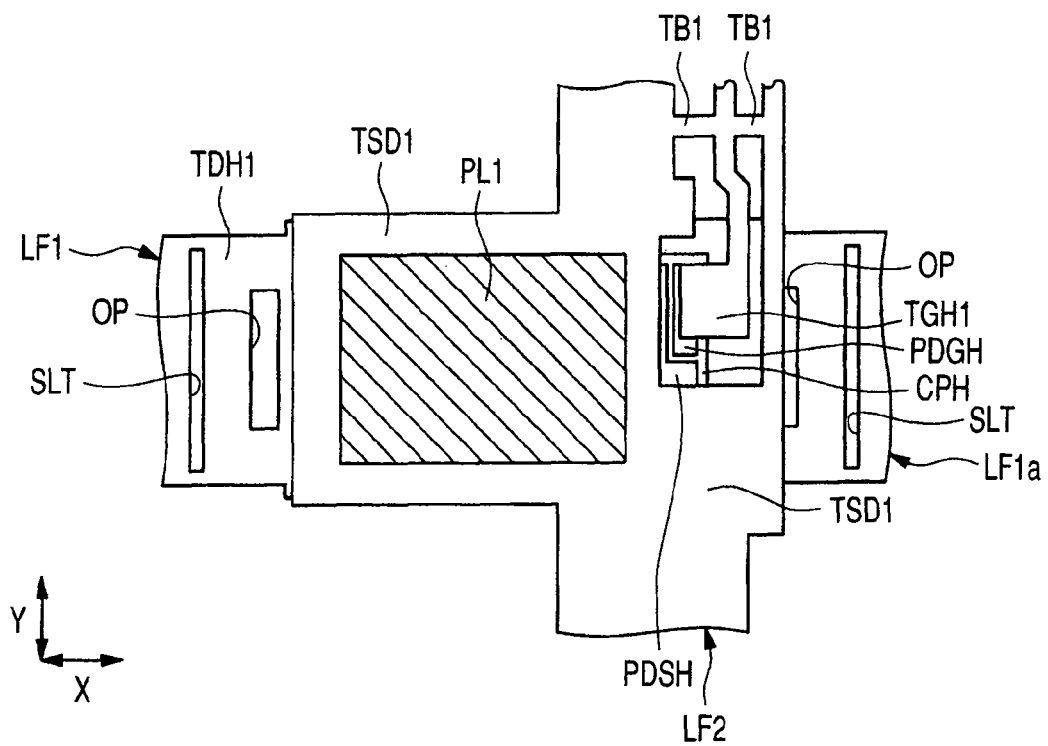
FIG. 45 is a plan view of the semiconductor device in a manufacturing process, following FIG. 43.
Figure 46:
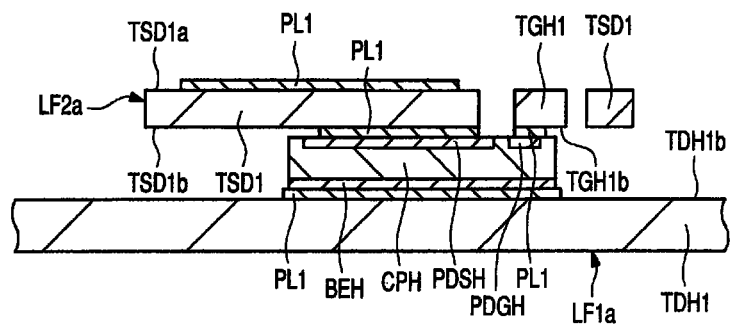
FIG. 46 is a sectional view of the same semiconductor device as in FIG. 45 in a manufacturing process.
Figure 47:
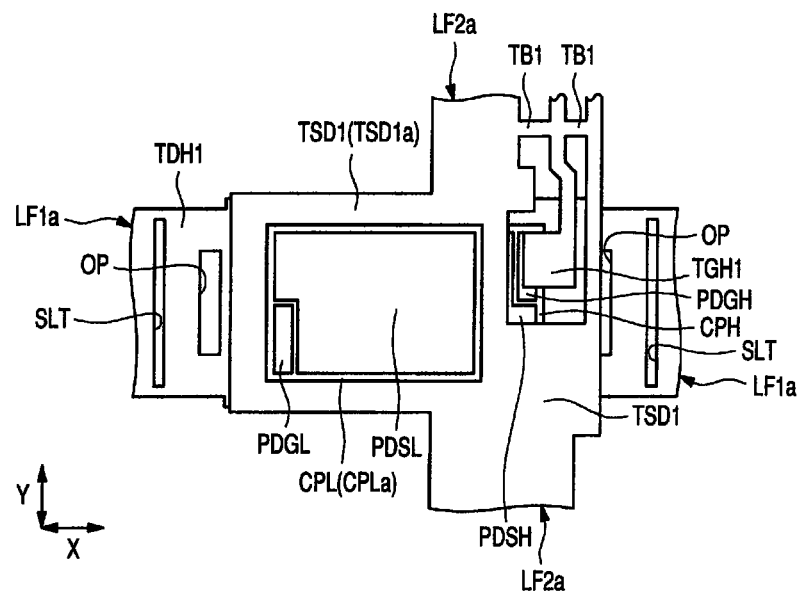
FIG. 47 is a plan view of the semiconductor device in a manufacturing process, following FIG. 45.
Figure 48:
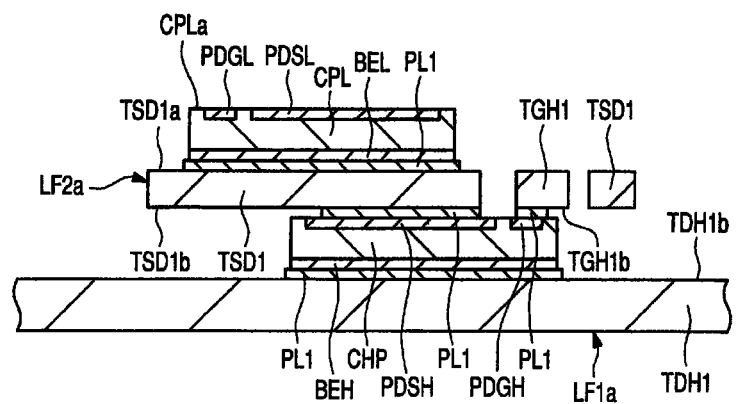
FIG. 48 is a sectional view of the same semiconductor device as in FIG. 47 in a manufacturing process.

FIG. 38 to FIG. 41 are substantial part plan views of lead frames LF1a, LF2a, LF3a used in the manufacturing process for the semiconductor device SM1 in this embodiment; FIG. 42 is a substantial part sectional view of the lead frame LF1a; and FIG. 43 to FIG. 51 are plan views (substantial part plan views) or sectional views (substantial part sectional views) of the semiconductor device SM1 in manufacturing process. FIG. 38 illustrates the upper surface (main surface on the side where the semiconductor chip CPH is placed) of the lead frame LF1a; FIG. 39 illustrates the upper surface (main surface on the side where the semiconductor chip CPL is placed) of the lead frame LF2a; FIG. 40 illustrates the under surface of the lead frame LF2a (main surface on the side where it is opposed to the semiconductor chip CPH); and FIG. 41 illustrates the under surface of the lead frame LF3a (main surface on the side where it is opposed to the semiconductor chip CPL). Though FIG. 38 to FIG. 41 are plan views, the areas where a solder plating layer PL1 is formed in the lead frames LF1a, LF2a, LF3a are hatched to facilitate visualization. FIG. 42 is a sectional view of the lead frame LF1a substantially corresponding to line A4-A4 of the FIG. 38. (Line A4-A4 of FIG. 38 and line A3-A3 of FIG. 17 correspond to substantially the same position.) However, also in FIG. 42 as well as FIG. 20 related to the first embodiment, the slits SLT and openings OP in the lead frame LF1a are omitted to facilitate visualization. This is the same with FIG. 44, FIG. 46, FIG. 48, FIG. 50, and FIG. 51. Of FIG. 43 to FIG. 51, FIG. 43, FIG. 45, FIG. 47, and FIG. 49 are plan views (substantial part plan views) and FIG. 44, FIG. 46, FIG. 48, FIG. 50, and FIG. 51 are sectional views (substantial part sectional views). FIG. 43 and FIG. 44 correspond to the same process step; FIG. 45 and FIG. 46 correspond to the same process step; FIG. 47 and FIG. 48 correspond to the same process step; and FIG. 49 and FIG. 50 correspond to the same process step. FIG. 43, FIG. 45, FIG. 47, and FIG. 49 show the same planar area and the sectional views in FIG. 44, FIG. 46, FIG. 48, FIG. 50, and FIG. 51 substantially correspond to the section taken in the position corresponding to line A3-A3 of FIG. 38 and FIG. 49.

As illustrated in FIG. 38 to FIG. 41, the following measure is taken in the lead frames LF1a, LF2a, LF3a used in this embodiment: a solder plating layer PL1 is formed beforehand in areas where the source pad electrodes PDSH, PDSL, gate pad electrodes PDGH, PDGL, and back surface drain electrodes BEH, BEL of the semiconductors chips CPH, CPL are to be joined. The lead frames LF1a, LF2a, LF3a have the same configuration as the lead frames LF1, LF2, LF3 used in the first embodiment, except that the solder plating layer PL1 is formed. Therefore, the description thereof will be omitted here and description will be given of the solder plating layer PL1.

The solder plating layer PL1 may be of single layer structure of, for example, a Pb—Sn alloy plating layer or may be of laminated structure of a Pb—Sn alloy plating layer and a Sn plating layer positioned thereover. When the superficial portion of the solder plating layer PL1 is a Sn plating layer, solder wettability can be enhanced. The thickness of this Sn plating layer may be smaller than that of the Pb—Sn alloy plating layer.

When lead-free solder, for example, Sn—Ag lead-free solder is used for the solder plating layer PL1, the solder plating layer PL1 can be provided with laminated structure. In this laminated structure, a Sn plating layer, an Ag plating layer, and a Sn plating layer are placed from the bottom in this order. The thickness of each plating layer can be adjusted based on the thickness of solder required of products and the composition ratio of Sn and Ag.

The solder plating layer PL1 can be formed by electrolytic plating. For example, the lead frames LF1, LF2, LF3 used in the first embodiment are prepared. Then a film member or a resist layer (photoresist layer) is formed over each lead frame LF1, LF2, LF3. This film member or resist layer exposes areas where the solder plating layer PL1 should be formed and covers areas where the solder plating layer PL1 should not be formed. Thereafter, the solder plating layer PL1 is formed over (the areas exposed from the film member or resist layer of) the lead frames LF1, LF2, LF3 by electrolytic plating. This makes it possible to turn the lead frames LF1, LF2, LF3 into the lead frames LF1a, LF2a, LF3a with the solder plating layers PL1 formed thereover.

In the lead frame LF1a, as illustrated in FIG. 38 and FIG. 42, the solder plating layer PL1 is formed in the area in the main surface (upper surface) TDH1b of the drain terminal portion TDH1 where the semiconductor chip CPH is to be placed. (In other words, this area is the area where the back surface drain electrode BEH of the semiconductor chip CPH is joined later.)

In the lead frame LF2a, as illustrated in FIG. 39, the solder plating layer PL1 is formed in the area in the main surface (upper surface) TSD1a of the source-drain terminal portion TSD1 where the semiconductor chip CPL is to be placed. (In other words, this area is the area where the back surface drain electrode BEL of the semiconductor chip CPL is joined later.) In the lead frame LF2a, as illustrated in FIG. 40, the solder plating layer PL1 is also formed in the following areas: the area in the main surface (under surface) TSD1b of the source-drain terminal portion TSD1 that is to be joined to the source pad electrode PDSH of the semiconductor chip CPH; and the area in the main surface (under surface) TGH1b of the gate terminal portion TGH1 that is to be joined to the gate pad electrode PDGH of the semiconductor chip CPH. The main surface (upper surface) TSD1a and main surface (under surface) TSD1b of the source-drain terminal portion TSD1 are main surfaces positioned on the opposite side to each other. The main surface (upper surface) TSD1a of the source-drain terminal portion TSD1 is the main surface on the side where the semiconductor chip CPL is placed. The main surface (under surface) TSD1b of the source-drain terminal portion TSD1 is the main surface on the side where it is opposed to the semiconductor chip CPH. The main surface (under surface) TGH1b of the gate terminal portion TGH1 is the surface on the same side as the main surface (under surface) TSD1b of the source-drain terminal portion TSD1 and is the main surface on the side where it is opposed to the semiconductor chip CPH.

In the lead frame LF3a, as illustrated in FIG. 41, the solder plating layer PL1 is formed in the following areas: the area in the main surface (under surface) TSL1b of the source terminal portion TSL1 that is to be joined to the source pad electrode PDSL of the semiconductor chip CPL; and the area in the main surface (under surface) TGL1b of the gate terminal portion TGL1 that is to be joined to the gate pad electrode PDGL of the semiconductor chip CPL. The main surface (under surface) TSL1b of the source terminal portion TSL1 is the main surface on the side where it is opposed to the semiconductor chip CPL. The main surface (under surface) TGL1b of the gate terminal portion TGL1 is the surface on the same side as the main surface (under surface) TSL1b of the source terminal portion TSL1 and is the main surface on the side where it is opposed to the semiconductor chip CPL.

After the preparation of the semiconductor chips CPH, CPL and the lead frames LF1a, LF2a, LF3a, the following processing is carried out as illustrated in FIG. 43 (plan view) and FIG. 44 (sectional view): the semiconductor chip CPH is placed (mounted) over the solder plating layer PL1 in the main surface (upper surface) TDH1b of the drain terminal portion TDH1 of the lead frame LF1a. At this time, it is desirable to take the following procedure: flux is applied onto the solder plating layer PL1 in the main surface TDH1b of the drain terminal portion TDH1 of the lead frame LF1a; and then the semiconductor chip CPH is placed (mounted) over this solder plating layer PL1. When highly viscous flux is used, it is also possible to temporarily fix the semiconductor chip CPH by the adhesion of the flux. The semiconductor chip CPH is mounted so that its back surface drain electrode BEH is opposed to (the solder plating layer PL1 in) the main surface (upper surface) TDH1b of the drain terminal portion TDH1 of the lead frame LF1a.

Subsequently, the lead frame LF2a is placed over the front surface CPHa of the semiconductor chip CPH as illustrated in FIG. 45 (plan view) and FIG. 46 (sectional view). Specifically, the lead frame LF2a is placed over the lead frame LF1a and the semiconductor chip CPH so that the following is implemented: the source-drain terminal portion TSD1 of the lead frame LF2a is placed over the source pad electrode PDSH of the semiconductor chip CPH; and at the same time, the gate terminal portion TGH1 of the lead frame LF2a is placed over the gate pad electrode PDGH of the semiconductor chip CPH. At this time, it is desirable to take the following procedure: flux is applied onto the source pad electrode PDSH and gate pad electrode PDGH in the front surface CPHa of the semiconductor chip CPH; and then the lead frame LF2a is placed over the front surface CPHa of the semiconductor chip CPH. When highly viscous flux is used, it is also possible to temporarily fix the lead frame LF2a by the adhesion of the flux.

As a result, the solder plating layer PL1 in the main surface (under surface) TSD1b of the source-drain terminal portion TSD1 of the lead frame LF2a is placed over the source pad electrode PDSH of the semiconductor chip CPH; and at the same time, the solder plating layer PL1 in the main surface (under surface) TGH1b of the gate terminal portion TGH1 of the lead frame LF2a is placed over the gate pad electrode PDGH of the semiconductor chip CPH. In other words, when the lead frame LF2a is placed over the front surface CPHa of the semiconductor chip CPH, the solder plating layer PL1 is provided beforehand on the following portions: the portion of the source-drain terminal portion TSD1 opposed to the source pad electrode PDSH of the semiconductor chip CPH; and the portion of the gate terminal portion TGH1 opposed to the gate pad electrode PDGH of the semiconductor chip CPH. Subsequently, the following processing is carried out as illustrated in FIG. 47 (plan view) and FIG. 48 (sectional view): the semiconductor chip CPL is placed (mounted) over the solder plating layer PL1 in the main surface (upper surface) TSD1a of the source-drain terminal portion TSD1 of the lead frame LF2a. At this time, it is desirable to take the following procedure: flux is applied onto the solder plating layer PL1 in the main surface (upper surface) TSD1a of the source-drain terminal portion TSD1 of the lead frame LF2a; and then the semiconductor chip CPL is placed (mounted) over this solder plating layer PL1. When highly viscous flux is used, it is also possible to temporarily fix the semiconductor chip CPL by the adhesion of the flux. The main surface TSD1a of the source-drain terminal portion TSD1 of the lead frame LF2a is the main surface on the opposite side to the side where it is opposed to the semiconductor chip CPH. The semiconductor chip CPL is so mounted that its back surface drain electrode BEL is opposed to the main surface (upper surface) TSD1a of the source-drain terminal portion TSD1 of the lead frame LF2a.

Also in this embodiment as in the first embodiment, the source-drain terminal portion TSD1 of the lead frame LF2a is so placed that it does not planarly overlap with the gate pad electrode PDGH of the semiconductor chip CPH as seen from FIG. 43 to FIG. 46 as well. The semiconductor chip CPL is placed over (the solder plating layer PL1 in) the source-drain terminal portion TSD1 of this lead frame LF2a. For this reason, the semiconductor chip CPL is placed in a position displaced from the semiconductor chip CPH as viewed in a plane. Therefore, the back surface drain electrode BEL of the semiconductor chip CPL is not brought into contact with the gate terminal portion TGH1 of the lead frame LF2a.

Figure 49:
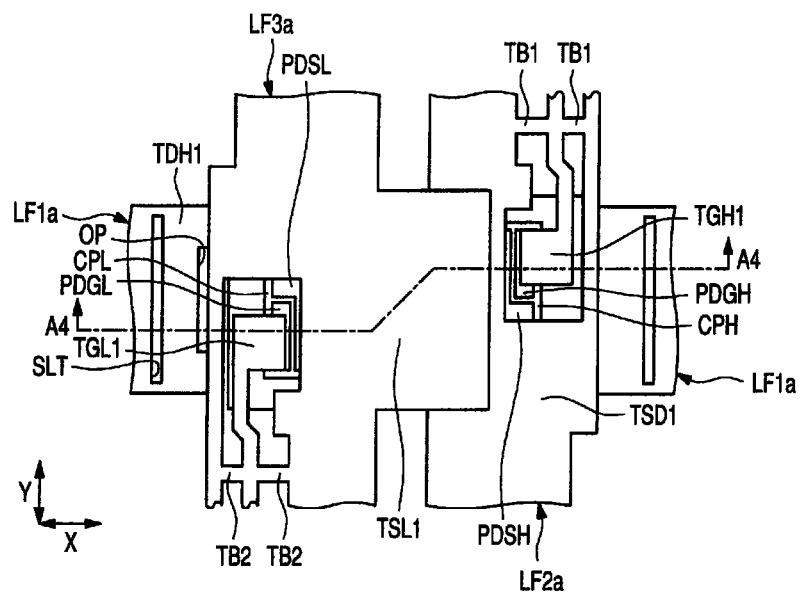
FIG. 49 is a plan view of the semiconductor device in a manufacturing process, following FIG. 47.
Figure 50:
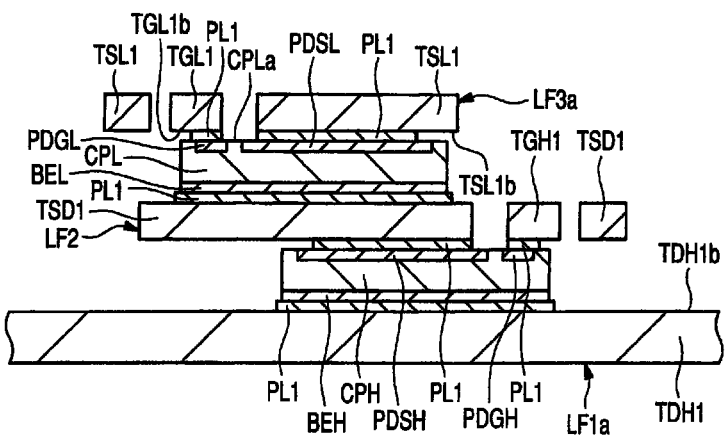
FIG. 50 is a sectional view of the same semiconductor device as in FIG. 49 in a manufacturing process.

Subsequently, the lead frame LF3a is placed over the front surface CPLa of the semiconductor chip CPL as illustrated in FIG. 49 (plan view) and FIG. 50 (sectional view). Specifically, the lead frame LF3a is so placed that the following is implemented: the source terminal portion TSL1 of the lead frame LF3a is placed over the source pad electrode PDSL of the semiconductor chip CPL; and at the same time, the gate terminal portion TGL1 of the lead frame LF3a is placed over the gate pad electrode PDGL of the semiconductor chip CPL. At this time, it is desirable to take the following procedure: flux is applied onto the source pad electrode PDSL and gate pad electrode PDGL in the front surface CPLa of the semiconductor chip CPL; and then the lead frame LF3a is placed over the front surface CPLa of the semiconductor chip CPL. When highly viscous flux is used, it is also possible to temporarily fix the lead frame LF3a by the adhesion of the flux.

As a result, the solder plating layer PL1 in the main surface (under surface) TSL1b of the source terminal portion TSL1 of the lead frame LF3a is placed over the source pad electrode PDSL of the semiconductor chip CPL; and at the same time, the solder plating layer PL1 in the main surface (under surface) TGL1b of the gate terminal portion TGL1 of the lead frame LF3a is placed over the gate pad electrode PDGL of the semiconductor chip CPL. In other words, when the lead frame LF3a is placed over the front surface CPLa of the semiconductor chip CPL, the solder plating layer PL1 is provided beforehand on the following portions: the portion of the source terminal portion TSL1 opposed to the source pad electrode PDSL of the semiconductor chip CPL; and the portion of the gate terminal portion TGL1 opposed to the gate pad electrode PDGL of the semiconductor chip CPL.

In FIG. 49, the position corresponding to line A4-A4 of the FIG. 38 is indicated by alternate long and short dash line representing line A4-A4. Therefore, the sectional view taken along line A4-A4 of FIG. 49 substantially corresponds to FIG. 50.

Figure 51:
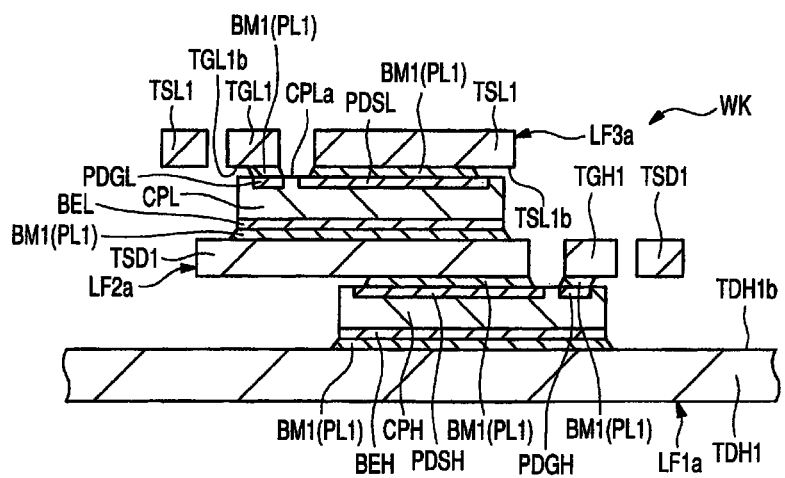
FIG. 51 is a sectional view of the semiconductor device in a manufacturing process, following FIG. 50.

Subsequently, solder reflow processing (heat treatment) is carried out to melt and solidify (resolidify) the solder plating layers PL1 on the lead frames LF1a, LF2a, LF3a. As illustrated in FIG. 51, as a result, the solder plating layers PL1 are turned into the bonding material BM1 comprised of solder.

As illustrated in FIG. 51, as a result, the back surface drain electrode BEH of the semiconductor chip CPH and the drain terminal portion TDH1 of the lead frame LF1a are joined and electrically coupled together through the bonding material BM1. (This bonding material BM1 is obtained by melting and resolidifying the solder plating layer PL1.) The source pad electrode PDSH of the semiconductor chip CPH and the source-drain terminal portion TSD1 of the lead frame LF2a are joined and electrically coupled together through the bonding material BM1. (This bonding material BM1 is obtained by melting and resolidifying the solder plating layer PL1.) The gate pad electrode PDGH of the semiconductor chip CPH and the gate terminal portion TGH1 of the lead frame LF2a are joined and electrically coupled together through the bonding material BM1. (This bonding material BM1 is obtained by melting and resolidifying the solder plating layer PL1.) The back surface drain electrode BEL of the semiconductor chip CPL and the source-drain terminal portion TSD1 of the lead frame LF2a are joined and electrically coupled together through the bonding material BM1. (This bonding material BM1 is obtained by melting and resolidifying the solder plating layer PL1.) The source pad electrode PDSL of the semiconductor chip CPL and the source terminal portion TSL1 of the lead frame LF3a are joined and electrically coupled together through the bonding material BM1 (obtained by melting and solidifying the solder plating layer PL1); and the gate pad electrode PDGL of the semiconductor chip CPL and the gate terminal portion TGL1 of the lead frame LF3a are joined and electrically coupled together through the bonding material BM1 (obtained by melting and resolidifying the solder plating layer PL1). As a result, the assembly (work) WK comprised of the lead frames LF1a to LF3a and the semiconductor chips CPH, CPL joined therebetween is obtained. The assembly WK in FIG. 51 corresponds to the assembly WK in the first embodiment in FIG. 29. The plan view at this stage (the same process step as in FIG. 51) is the same as FIG. 49.

The subsequent steps are the same as those in the first embodiment. That is, the following steps are carried out as in the first embodiment: an encapsulation resin portion MR formation step, a plating step, a step for cutting the lead frames LF1a, LF2a, LF3a, a step for bending the source-drain terminal portion TSD1, gate terminal portion TGH1, source terminal portion TSL1, and gate terminal portion TGL1, and the like. The diagramatic representation and description thereof will be omitted here.

Also in this embodiment as in the first embodiment, (the source terminal portion TSL1 or gate terminal portion TGL1 of) the lead frame LF3a is not placed over the gate pad electrode PDGH of the semiconductor chip CPH in the assembly WK. That is, the source terminal portion TSL1 or gate terminal portion TGL1 of the lead frame LF3a does not planarly overlap with the gate pad electrode PDGH of the semiconductor chip CPH. For this reason, the lead frame LF3a does not interfere after the solder plating layers PL1 are turned into the bonding material BM1 by the solder reflow processing and before the encapsulation resin portion MR is formed. The state of junction between the gate terminal portion TGH1 of the lead frame LF2a and the gate pad electrode PDGH of the semiconductor chip CPH through the bonding material BM1 can be observed from above (appearance inspection). (The above cited here means above the gate terminal portion TGH1 of the lead frame LF2a). Further, the state of junction between the source-drain terminal portion TSD1 of the lead frame LF2a and the source pad electrode PDSH of the semiconductor chip CPH through the bonding material BM1 can also be observed from above (appearance inspection). As a result, it is possible to enhance the reliability of the manufactured semiconductor device SM1 (the reliability of coupling of terminals). To facilitate this observation (appearance inspection), it is more desirable to take the following measure as illustrated in FIG. 49: part of each of the gate pad electrode PDGH and source pad electrode PDSH of the semiconductor chip CPH is prevented from planarly overlapping with the gate terminal portion TGH1, source-drain terminal portion TSD1, source terminal portion TSL1, or gate terminal portion TGL1.

Also in this embodiment as in the first embodiment, any other terminal portion is not placed over the gate terminal portion TGL1 of the lead frame LF3a in the assembly WK. For this reason, the following can be implemented after the solder plating layers PL1 are turned into the bonding material BM1 by the solder reflow processing and before the encapsulation resin portion MR is formed: it is possible to observe the state of junction between the gate terminal portion TGL1 of the lead frame LF3a and the gate pad electrode PDGL of the semiconductor chip CPL through the bonding material BM1 from above (appearance inspection). (The above cited here means above the gate terminal portion TGL1 of the lead frame LF3a.) Further, the state of junction between the source terminal portion TSL1 of the lead frame LF3a and the source pad electrode PDSL of the semiconductor chip CPL through the bonding material BM1 can also be observed from above (appearance inspection). As a result, it is possible to enhance the reliability of the manufactured semiconductor device SM1 (the reliability of coupling of terminals). To facilitate this observation (appearance inspection), it is more desirable to take the following measure as illustrated in FIG. 49: part of each of the gate pad electrode PDGL and source pad electrode PDSL of the semiconductor chip CPL is prevented from planarly overlapping with the source terminal portion TSL1 or the gate terminal portion TGL1

In this embodiment, furthermore, the lead frames LF1a, LF2a, LF3a with the solder plating layers PL1 formed beforehand thereon are used to manufacture (assemble) the semiconductor device SM1. Therefore, the following effects can be obtained. A certain quantity of solder can be supplied as compared with cases where solder paste is used and solder outflow can be prevented during reflowing; therefore, it is possible to evenly maintain a solder film thickness required of the relevant product. Positional deviation between the semiconductor chips CPH, CPL and the lead frames LF1a, LF2a, LF3a can be suppressed. Since solder paste is not used, solder balls as the chief material of solder paste do not fly part and conductive foreign matter is not produced. In the above assembling method, the lead frames LF1a, LF2a, LF3a and the semiconductor chips CPH, CPL are alternately stacked and this makes it possible to simplify the manufacturing process (assembling step) for semiconductor devices. Even in the process using flux, the quantity of used flux is slight as compared with cases where solder paste is used and this enhances the efficiency of cleaning after reflowing. When reflowing is carried out in a mixed gas atmosphere of hydrogen gas and nitrogen gas, flux is unnecessary and cleaning can be eliminated. As an example of solder plating composition (the composition of the solder plating layer PL1), the front surface of Pb—Sn plate is thinly plated with Sn. As a result, this Sn plating in the superficial layer is diffused into the Pb—Sn plate in the reflow heating stage and starts to diffusion bond with electrode metal on the semiconductor chip side in an early stage. This eliminates a problem of deactivation due to the high temperature of used flux.

As described in relation to the first embodiment, the following can be implemented when the lead frames LF1, LF2, LF3 without the solder plating layer PL1 formed thereon are used to manufacture (assemble) the semiconductor device SM1: the quantity of paste (the quantity of applied paste material for the bonding materials BM1a, BM1b, BM1c, BM1d) can be controlled according to the size of the mounted semiconductor chips CPH, CPL. This is advantageous to standardization of frames (lead frames LF1, LF2, LF3).

Third Embodiment

Figure 52:
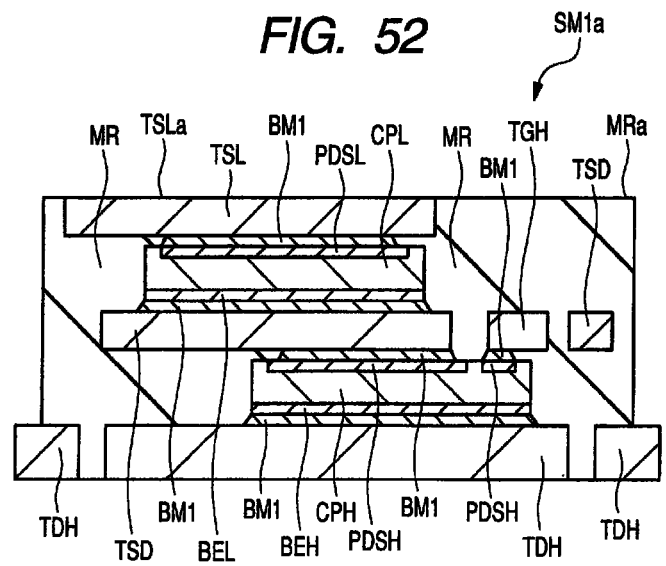
FIG. 52 is a sectional view of a semiconductor device in another embodiment of the invention.
Figure 53:
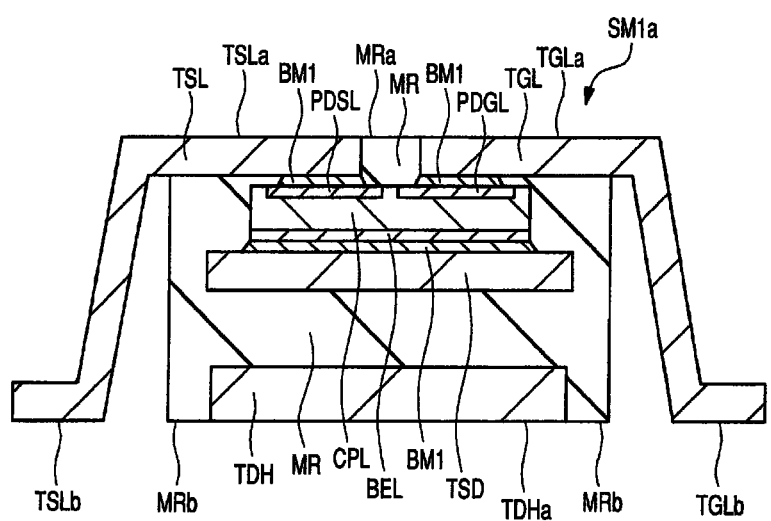
FIG. 53 is a sectional view of a semiconductor device in another embodiment of the invention.

FIG. 52 and FIG. 53 are sectional views of a semiconductor device SM1a in a third embodiment and respectively correspond to FIG. 7 and FIG. 9 related to the first embodiment.

In the semiconductor device SM1 in the first embodiment, the gate terminal TGL or the source terminal TSL is not exposed from the main surface MRa as the upper surface of the encapsulation resin portion MR. In the semiconductor device SM1a in this embodiment, meanwhile, the following main surfaces are exposed from the main surface MRa as the upper surface of the encapsulation resin portion MR as illustrated in FIG. 52 and FIG. 53: the main surface TGLa of the gate terminal TGL and the main surface TSLa of the source terminal TSL. The main surface TGLa of the gate terminal TGL is its main surface on the opposite side to the side where it is opposed to the semiconductor chip CPL. The main surface TSLa of the source terminal TSL is also its main surface on the opposite side to the side where it is opposed to the semiconductor chip CPL. The other respects in the configuration of the semiconductor device SM1a in this embodiment are substantially the same as those of the semiconductor device SM1 in the first embodiment and the description thereof will be omitted.

As an example of manufacturing methods for the semiconductor device SM1a in this embodiment, the following procedure can be taken in the manufacturing process described in relation to the first and second embodiments: after the formation of the encapsulation resin portion MR, the main surface MRa of the encapsulation resin portion MR is polished. The main surface TGLa of the gate terminal TGL (gate terminal portion TGL1) and the main surface TSLa of the source terminal TSL (source terminal portion TSL1) are thereby exposed from the main surface MRa of the encapsulation resin portion MR. This step of polishing the main surface MRa of the encapsulation resin portion MR can be carried out by, for example, liquid honing. The liquid honing is a technique in which such liquid as water and particles (granular or powdered abrasive) are mixed and the obtained mixture (the liquid mixed with or containing the particles) is sprayed (blasted) onto a surface to be polished under high pressure. (In this example, the surface to be polished is the main surface MRa of the encapsulation resin portion MR). Fine abrasive grains (abrasive particles) can be used for the particles (abrasive) mixed into liquid (water) and fine particles of, for example, alumina (aluminum oxide) can be used for this purpose.

In the semiconductor device SM1a in this embodiment, as mentioned above, (the main surface TGLa of) the gate terminal TGL and (the main surface TSLa of) the source terminal TSL are exposed from the main surface MRa of the encapsulation resin portion MR. In addition to the effects obtained by the first and second embodiments, therefore, the heat radiation characteristics of the semiconductor device SM1a can be further enhanced.

Fourth Embodiment

Figure 54:
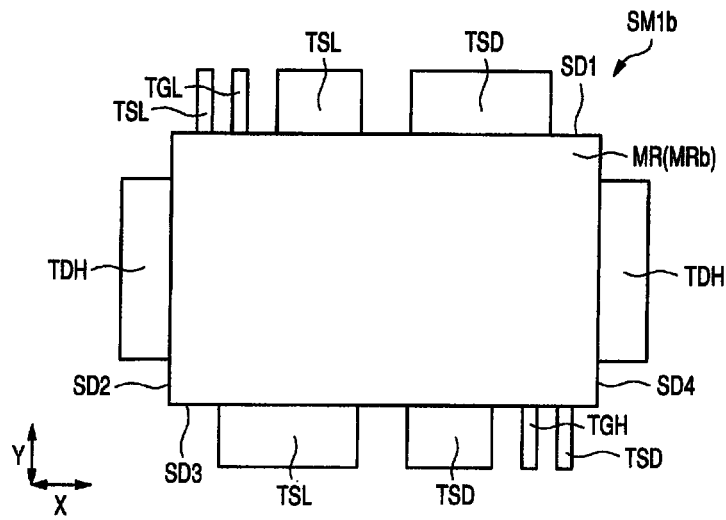
FIG. 54 is a top view of a semiconductor device in another embodiment of the invention.
Figure 55:
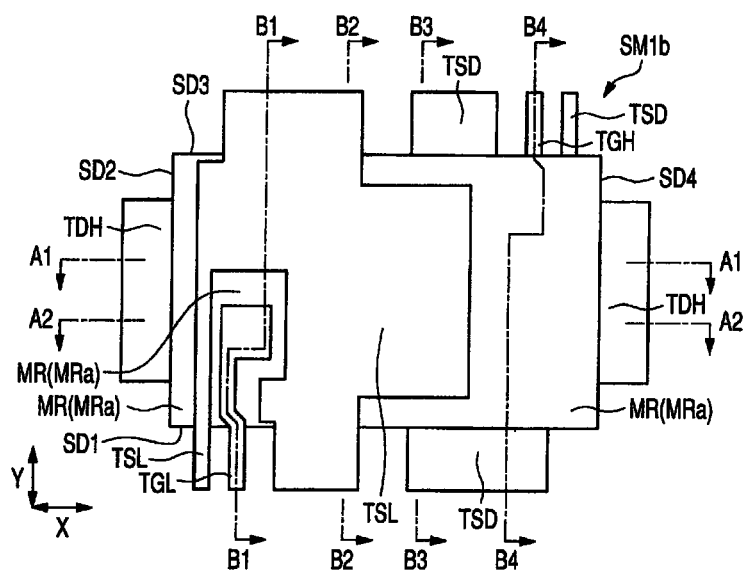
FIG. 55 is a bottom view (back side back view) of a semiconductor device in another embodiment of the invention.

FIG. 54 is a top view (plan view) of a semiconductor device SM1b in a fourth embodiment; FIG. 55 is a bottom view (bottom plan view, back side back view, plan view) of the semiconductor device SM1b; and FIG. 56 to FIG. 61 are sectional views (lateral sectional views) of the semiconductor device SM1b. In FIG. 55, the positions corresponding to line A1-A1, line A2-A2, line B1-B1, line B2-B2, line B3-B3, and line B4-B4 of FIG. 13 related to the first embodiment are marked with line A1-A1, line A2-A2, line B1-B1, line B2-B2, line B3-B3, and line B4-B4. FIG. 56 to FIG. 61 respectively correspond to FIG. 7 to FIG. 12 related to the first embodiment. The section taken along line A1-A1 of FIG. 55 substantially corresponds to FIG. 56; the section taken along line A2-A2 of FIG. 55 substantially corresponds to FIG. 57; the section taken along line B1-B1 of FIG. 55 substantially corresponds to FIG. 58; the section taken along line B2-B2 of FIG. 55 substantially corresponds to FIG. 59; the section taken along line B3-B3 of FIG. 55 substantially corresponds to FIG. 60; and the section taken along line B4-B4 of FIG. 55 substantially corresponds to FIG. 61.

The semiconductor device SM1b in this embodiment illustrated in FIG. 54 to FIG. 61 is different from the semiconductor device SM1 in the first embodiment in the following points:

First, the semiconductor device SM1b in this embodiment is inverted from the semiconductor device SM1 in the first embodiment with respect to top and bottom (front and back). More specific description will be given. In the semiconductor device SM1 in the first embodiment, the main surface MRa of the encapsulation resin portion MR is the upper surface of the encapsulation resin portion MR; and the main surface MRb of the encapsulation resin portion MR is the back surface of the encapsulation resin portion MR (that is, the mounting surface of the semiconductor device SM1). In the semiconductor device SM1b in this embodiment, meanwhile, the main surface MRb of the encapsulation resin portion MR is the upper surface of the encapsulation resin portion MR; and the main surface MRa of the encapsulation resin portion MR is the back surface of the encapsulation resin portion MR (that is, the mounting surface of the semiconductor device SM1). Therefore, while in the semiconductor device SM1 in the first embodiment, the main surface MRb as the back surface of the encapsulation resin portion MR is the mounting surface of the semiconductor device SM1, the following takes place in the semiconductor device SM1b in this embodiment: the main surface MRa as the back surface of the encapsulation resin portion MR is the mounting surface of the semiconductor device SM1b.

In the semiconductor device SM1b in this embodiment, the following surfaces are exposed from the main surface MRa of the encapsulation resin portion MR, or the back surface of the encapsulation resin portion MR: the main surface TGLa of the gate terminal TGL and the main surface TSLa of the source terminal TSL. At the same time, the gate terminal TGL and the source terminal TSL are not bent (that is, do not undergo bending work) and they are flat. The main surface TGLa of the gate terminal TGL is its main surface on the opposite side to the side where it is opposed to the semiconductor chip CPL; and the main surface TSLa of the source terminal TSL is also its main surface on the opposite side to the side where it is opposed to the semiconductor chip CPL.

In the semiconductor device SM1b in this embodiment, the drain terminal TDH is not exposed from the main surface MRb of the encapsulation resin portion MR and the drain terminal TDH need not be provided with the above openings OP. In the semiconductor device SM1b in the this embodiment, the following measure is taken with respect to the drain terminal TDH like the gate terminal TGH and the source-drain terminal TSD: the portion of the drain terminal TDH positioned inside the encapsulation resin portion MR is flat but part (the outer lead portion of the drain terminal TDH) thereof is protruded from the lateral surface of the encapsulation resin portion MR and is bent. That is, in the semiconductor device SM1b in this embodiment, part of each of the drain terminal TDH, gate terminal TGH, and source-drain terminal TSD is processed as follows: they are protruded from the lateral surface (portions of the lateral surface corresponding to the sides SD2, SD4) of the encapsulation resin portion MR and are bent outside the encapsulation resin portion MR. In each of the drain terminal TDH, gate terminal TGH, and source-drain terminal TSD, a portion positioned outside the encapsulation resin portion MR will be designated as an outer lead portion.

In the semiconductor device SM1b in this embodiment, the outer lead portions of the drain terminal TDH, gate terminal TGH, and source-drain terminal TSD are bent in the following direction: the opposite direction to the direction in which the outer lead portions of the gate terminal TGH, source-drain terminal TSD, gate terminal TGL, and source terminal TSL are bent in the semiconductor device SM1 in the first embodiment. More specific description will be given. In the semiconductor device SM1b in this embodiment, the following outer lead portions are formed by bending: the outer lead portion of the gate terminal TGH; the outer lead portion of the source-drain terminal TSD; and the outer lead portion of the drain terminal TDH. The following under surfaces of these outer lead portions are substantially flush with the main surface TGLa of the gate terminal TGL and the main surface TSLa of the source terminal TSL exposed in the main surface MRa of the encapsulation resin portion MR: the under surface TGHc of the outer lead portion of the gate terminal TGH; the under surface TSDc of the outer lead portion of the source-drain terminal TSD; and the under surface TDHc of the outer lead portion of the drain terminal TDH.

In the semiconductor device SM1 in the first embodiment, it is desirable that the thickness T1 of the drain terminal TDH should be larger than the following thicknesses: the thickness T2 of the gate terminal TGH, the thickness T3 of the source-drain terminal TSD, the thickness T4 of the gate terminal TGL, and the thickness T5 of the source terminal TSL. In the semiconductor device SM1b in this embodiment, meanwhile, it is desirable that the thickness T4 of the gate terminal TGL and the thickness T5 of the source terminal TSL should be larger than the following thicknesses: the thickness T1 of the drain terminal TDH, the thickness T2 of the gate terminal TGH, and the thickness T3 of the source-drain terminal TSD (that is, T4>T1, T2, T3 and T5>T1, T2, T3). The reason for this is as follows. The flat terminal on the mounting surface side of a semiconductor device is the drain terminal TDH in the semiconductor device SM1 in the above embodiment. (The mounting surface side of a semiconductor device is the main surface MRb side of the encapsulation resin portion MR in the first embodiment and the main surface MRa side of the encapsulation resin portion MR in this embodiment.) In the semiconductor device SM1b in this embodiment, meanwhile, the flat terminal on the mounting surface side of a semiconductor device is the gate terminal TGL and the source terminal TSL. In this embodiment, the following can be implemented by making the gate terminal TGL and the source terminal TSL thicker than the drain terminal TDH, gate terminal TGH, and source-drain terminal: it is possible to achieve both the enhancement of the heat radiation characteristics of the semiconductor device SM1b and ease of processing of terminals; and it is also possible to reduce the size (thickness) of the semiconductor device SM1b.

In consideration of ease of processing of lead frames for the manufacture of the semiconductor device SM1b, it is desirable that the thickness T2 of the gate terminal TGH and the thickness T3 of the source-drain terminal TSD should be equal to each other (that is, T2=T3). Further, it is desirable that the thickness T4 of the gate terminal TGL and the thickness T5 of the source terminal TSL should be equal to each other (T4=T5). As an example of the thickness T1 to T5 of each terminal in this embodiment, the following measure can be taken: the thickness T4, T5 of each of the gate terminal TGL and the source terminal TSL is set to, for example, 0.4 mm or so; and the thickness T1, T2, T3 of each of the drain terminal TDH, gate terminal TGH, and source-drain terminal TSD is set to, for example, 0.2 mm or so.

The other respects in the configuration of the semiconductor device SM1b in this embodiment are substantially the same as those of the semiconductor device SM1 in the first embodiment and the description thereof will be omitted.

Figure 62:
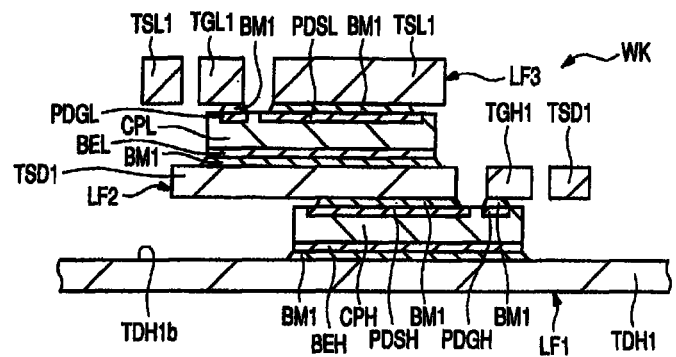
FIG. 62 is a sectional view of a semiconductor device in another embodiment of the invention in a manufacturing process.
Figure 63:
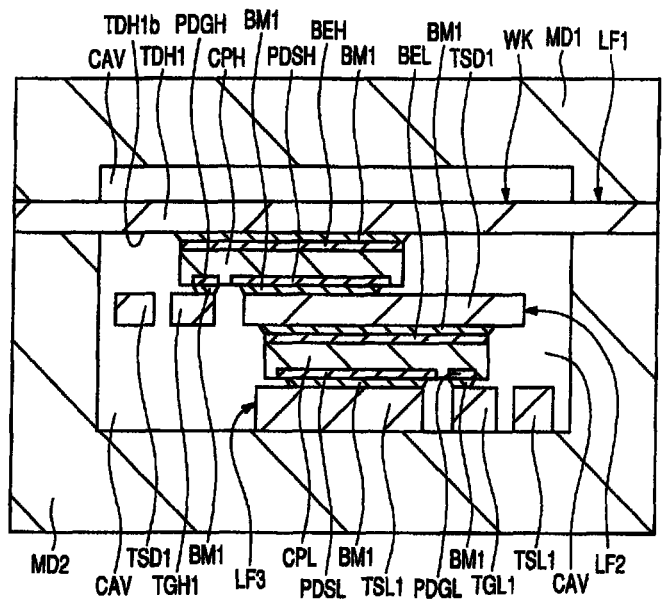
FIG. 63 is a sectional view of the semiconductor device in a manufacturing process, following FIG. 62.

Description will be given of a manufacturing process for the semiconductor device SM1b in this embodiment. FIG. 62 to FIG. 65 are sectional views of the semiconductor device SM1b in manufacturing process. FIG. 62 corresponds to FIG. 29 related to the first embodiment; FIG. 63 corresponds to FIG. 32 related to the first embodiment; and FIG. 64 corresponds to FIG. 31 related to the first embodiment.

First, such an assembly (work) WK as illustrated in FIG. 62 corresponding to FIG. 29 is obtained in the first embodiment or the second embodiment. In the first and second embodiment, however, it is desirable that the lead frames LF1, LF1a should be made thicker than the lead frames LF2, LF3, LF2a, LF3a. In this embodiment, meanwhile, it is desirable that the thickness of each of the lead frames LF3, LF3a should be larger than the thickness of each of the lead frames LF1, LF2, LF1a, LF2a. (The thickness of each of the lead frames LF3, LF3a corresponds to the thickness T4 of the gate terminal TGL and the thickness T5 of the source terminal TSL.) (The thickness of each of the lead frames LF1, LF2, LF1a, LF2a corresponds to the thickness T1 of the drain terminal TDH, the thickness T2 of the gate terminal TGH, and the thickness T3 of the source-drain terminal TSD.) The other respects are substantially the same as the manufacturing process in the first embodiment or the second embodiment until immediately before a molding step for forming the encapsulation resin portion MR is carried out and the description thereof will be omitted.

The assembly WK in FIG. 62 has substantially the same configuration as the assembly WK in FIG. 29 related to the first embodiment or the assembly WK in FIG. 51 related to the second embodiment. However, the above-mentioned relation of thickness between the lead frames LF1, LF2, LF3 (or LF1a, LF2a, LF3a) is different. FIG. 62 illustrates a case where the assembly WK is formed using the lead frames LF1, LF2, LF3 as in the first embodiment for the sake of convenience.

Subsequently, a molding step (resin sealing step, for example, transfer molding step) is carried out. FIG. 63 shows the assembly WK fixed in molding dies MD1, MD2 (upper die MD1 and lower die MD2) at this molding step.

Though FIG. 63 corresponds to FIG. 32 related to the first embodiment, in this embodiment (FIG. 63), the assembly WK is turned upside down and fixed in the molding dies MD1, MD2 unlike the first embodiment (FIG. 32). In this embodiment, as illustrated in FIG. 63, the following measure is taken to expose the main surfaces TGLa, TSLa of the gate terminal TGL and the source terminal TSL from the encapsulation resin portion MR: the under surface of the gate terminal portion TGL1 of the lead frame LF3 and the under surface of the source terminal portion TSL1 thereof are brought into contact with the upper surface of the lower die MD2. (The under surface of the gate terminal portion TGL1 of the lead frame LF3 is its main surface on the opposite side to the side where it is opposed to the semiconductor chip CPL.) (The under surface of the source terminal portion TSL1 thereof is its main surface on the opposite side to the side where it is opposed to the semiconductor chip CPL.) With respect to the source-drain terminal portion TSD1 and gate terminal portion TGH1 of the lead frame LF2, the following measure is taken: their portions to be positioned outside the encapsulation resin portion MR are sandwiched between (the under surface of) the upper die MD1 and (the upper surface of) the lower die MD2; and their portions to be positioned inside the encapsulation resin portion MR (portions opposed to the semiconductor chips CPH, CPL) are placed in the cavity CAV. With respect to the drain terminal portion TDH1 of the lead frame LF1, the following measure is taken: its portion to be positioned outside the encapsulation resin portion MR is sandwiched between (the under surface of) the upper die MD1 and (the upper surface of) the lower die MD2; and its portion to be positioned inside the encapsulation resin portion MR (potion opposed to the semiconductor chip CPH) is placed in the cavity CAV.

Figure 64:
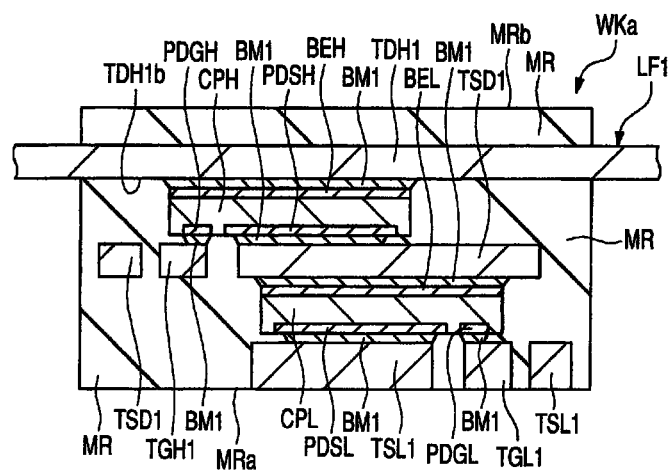
FIG. 64 is a sectional view of the semiconductor device in a manufacturing process, following FIG. 63.

After the lead frames LF1 to LF3 are fixed and clamped in the molding dies MD1, MD2 as illustrated in FIG. 63, the following processing is carried out as in the first embodiment: encapsulation resin material as the material for the formation of the encapsulation resin portion MR is injected into the cavity CAV in the molding dies MD1, MD2; and then the injected encapsulation resin material is cured to form the encapsulation resin portion MR. Subsequently, the assembly WK (that is, assembly WKa) with the encapsulation resin portion MR formed thereon is released from the molding dies MD1, MD2 and any flash and the like are removed from the encapsulation resin portion MR. Thus the assembly (work) WKa illustrated in FIG. 64 is obtained.

At the molding step, there is hardly a gap between the under surfaces of the gate terminal portion TGL1 and source terminal portion TSL1 of the lead frame LF3 and the upper surface of the molding die MD1. (The under surfaces of the gate terminal portion TGL1 and the source terminal portion TSL1 are their main surfaces on the opposite side to the side where they are opposed to the semiconductor chip CPL.) Therefore, the encapsulation resin portion MR is hardly formed on the under surfaces of the gate terminal portion TGL1 and the source terminal portion TSL1 (their main surfaces on the opposite side to the side where they are opposed to the semiconductor chip CPL). For this reason, the following state is established in the assembly WKa: the under surfaces (corresponding to the main surfaces TGLa, TSLa) of the gate terminal portion TGL1 and source terminal portion TSL1 of the lead frame LF3 are exposed from the main surface MRa of the encapsulation resin portion MR. Even though any flash of the encapsulation resin portion MR is formed on the under surface of the gate terminal portion TGL1 or the source terminal portion TSL1, it can be removed by the def lashing step subsequent to the molding step.

Subsequently, plating is carried out as required to form a plating layer (not shown) over the portions (comprised of conductor) of the lead frames LF1 to LF3 exposed from the encapsulation resin portion MR. Solder plating can be carried out using, for example, lead-free solder.

Subsequently, the lead frames LF1, LF2, LF3 are cut in predetermined positions. That is, the tie bar TB1 is cut to separate the gate terminal portion TGH1 and the source-drain terminal portion TSD1 from each other; and the tie bar TB2 is cut to separate the gate terminal portion TGL1 and the source terminal portion TSL1 from each other. Thereafter, the drain terminal portion TDH1, source-drain terminal portion TSD1, gate terminal portion TGH1, source terminal portion TSL1, and gate terminal portion TGL1 are cut off (separated) from (the frames of) the lead frames LF1, LF2, LF3.

Figure 65:
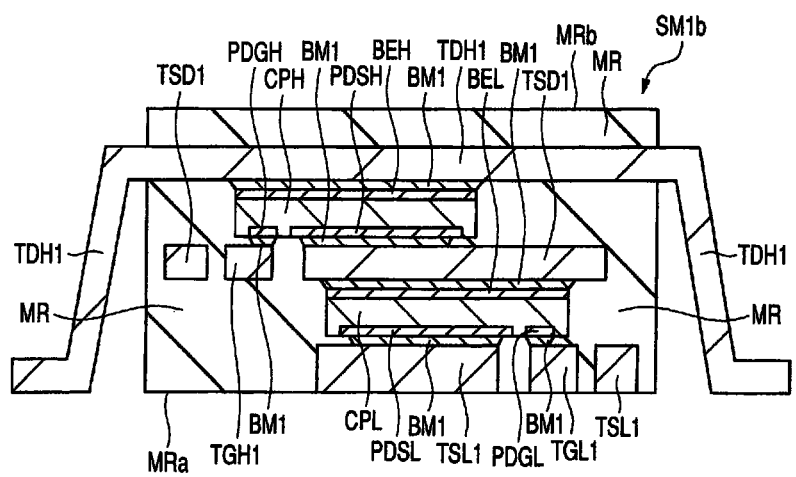
FIG. 65 is a sectional view of the semiconductor device in a manufacturing process, following FIG. 64.

As illustrated in FIG. 65, subsequently, the portions of the drain terminal portion TDH1, source-drain terminal portion TSD1, and gate terminal portion TGH1 protruded from the lateral surface of the encapsulation resin portion MR are bent. In this embodiment, the drain terminal portion TDH1, source-drain terminal portion TSD1, and gate terminal portion TGH1 are bent in the following direction: the opposite direction to the direction in which the source-drain terminal portion TSD1, gate terminal portion TGH1, source terminal portion TSL1, and gate terminal portion TGL1 are bent in the first embodiment. Thus the semiconductor device SM1$b$ in this embodiment illustrated in FIG. 54 to FIG. 61 is manufactured.

The drain terminal portion TDH1 of the lead frame LF1 becomes the drain terminal TDH of the semiconductor device SM1$b$; the source-drain terminal portion TSD1 of the lead frame LF2 becomes the source-drain terminal TSD of the semiconductor device SM1$b$; and the gate terminal portion TGH1 of the lead frame LF2 becomes the gate terminal TGH of the semiconductor device SM1$b$. Further, the source terminal portion TSL1 of the lead frame LF3 becomes the source terminal TSL of the semiconductor device SM1$b$; and the gate terminal portion TGL1 of the lead frame LF3 becomes the gate terminal TGL of the semiconductor device SM1$b$.

Figure 66:
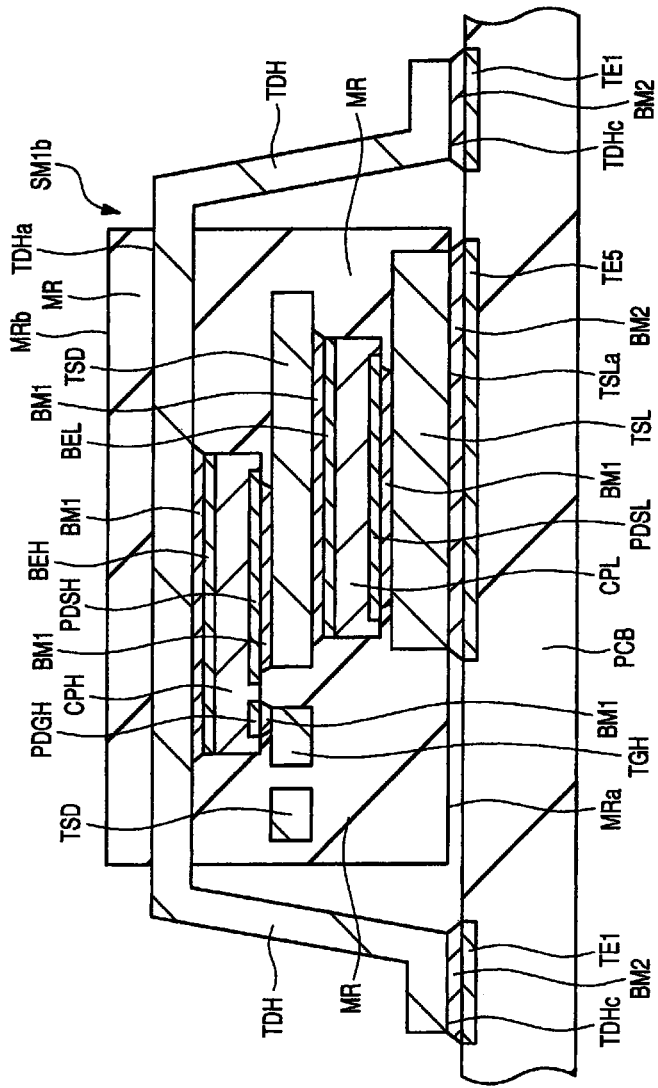
FIG. 66 is a substantial part sectional view of a semiconductor device in another embodiment of the invention as is mounted over a mounting board.
Figure 67:
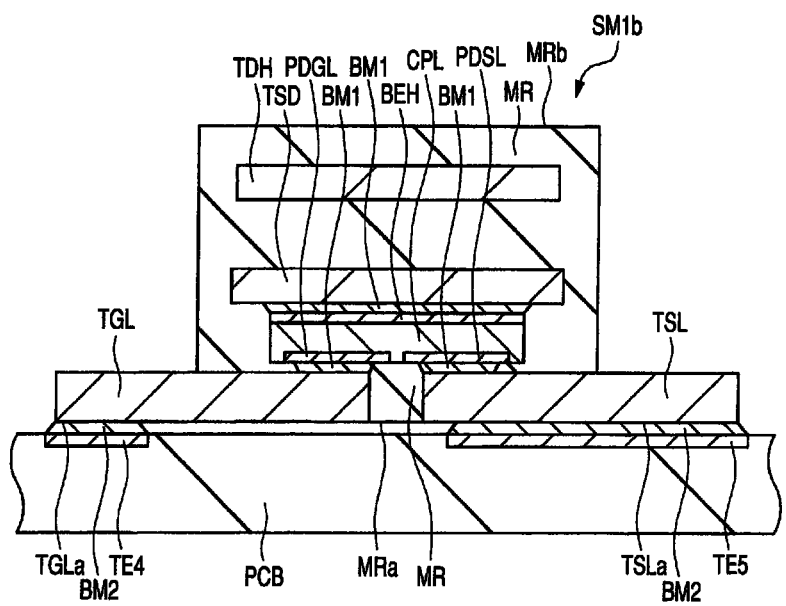
FIG. 67 is a substantial part sectional view of a semiconductor device in another embodiment of the invention as is mounted over a mounting board.
Figure 68:
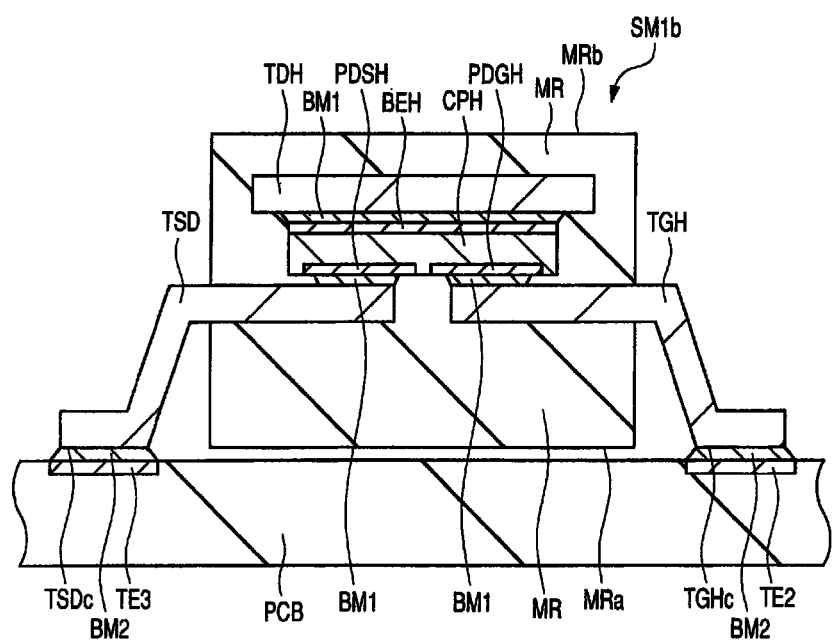
FIG. 68 is a substantial part sectional view of a semiconductor device in another embodiment of the invention as is mounted over a mounting board.

FIG. 66 to FIG. 68 are substantial part sectional views illustrating the semiconductor device SM1$b$ in this embodiment mounted over a mounting board (wiring substrate) PCB. FIG. 66 shows the section corresponding to FIG. 56; FIG. 67 shows the section corresponding to FIG. 58; and FIG. 68 shows the section corresponding to FIG. 61.

As illustrated in FIG. 66 to FIG. 68, the semiconductor device SM1$b$ is mounted over the mounting board (wiring substrate) PCB. At this time, the back surface side of the semiconductor device SM1$b$ (that is, the main surface MRa side of the encapsulation resin portion MR) is used as the mounting surface for mounting to the mounting board PCB. (The under surface TDHc of) the outer lead portion of the drain terminal TDH is joined with a terminal TE1 of the mounting board PCB through a conductive bonding material BM2 and electrically coupled thereto. (The under surface TGHc of) the outer lead portion of the gate terminal TGH is joined with a terminal TE2 of the mounting board PCB through the conductive bonding material BM2 and electrically coupled thereto. (The under surface TSDc of) the outer lead portion of the source-drain terminal TSD is joined with a terminal TE3 of the mounting board PCB through the conductive bonding material BM2 and electrically coupled thereto. The main surface TGLa of the gate terminal TGL is joined with a terminal TE4 of the mounting board PCB through the conductive bonding material BM2 and electrically coupled thereto. The main surface TSLa of the source terminal TSL is joined with a terminal TE5 of the mounting board PCB through the conductive bonding material BM2 and electrically coupled thereto. The conductive bonding material BM2 is comprised of, for example, solder.

In this embodiment, the effects described below can be obtained in addition to the effects obtained in the first embodiment. When the semiconductor chip CPH with the power MOSFET QH1 formed therein and the semiconductor chip CPL with the power MOSFET QL1 formed therein are compared with each other, the semiconductor chip CPL is higher in heat release value. For this reason, when the semiconductor chip CPL higher in heat release value is placed on the mounting surface side (that is, the lower side) of the semiconductor device SM1$b$ like the semiconductor device SM1$b$ in this embodiment, the following advantage is obtained: it is possible to easily radiate heat from the semiconductor chip CPL to outside the semiconductor device SM1$b$ (to the mounting board PCB side). A heat producing portion in the semiconductor chip CPL is the front surface side (the side of the gate pad electrode PDGL and source pad electrode PDSL formation surface). This front surface facing toward the mounting surface of the semiconductor device SM1$b$ is also advantageous to heat radiation. For this reason, it is possible to further enhance the heat radiation characteristics of the semiconductor device SM1$b$ (that is, further reduce its thermal resistance).

In case of the semiconductor device SM1 in the first embodiment, the following takes place in the main surface MRb of the encapsulation resin portion MR as the mounting surface of the semiconductor device SM1: only the drain terminal TDH is exposed and any of the other terminals is not exposed. Therefore, it is more superior in terms of the mountability of semiconductor devices (ease of mounting to a mounting board PCB and the level of mounting reliability). Specifically, when the drain terminal TDH having a wider area is soldered to a mounting board PCB, it is possible to maintain (enhance) the strength of coupling. There is not any different terminal in the main surface MRb of the encapsulation resin portion MR as the mounting surface of the semiconductor device SM1 (only the drain terminal TDH is exposed); therefore, there is no possibility of short-circuiting due to a solder bridge.

Fifth Embodiment

Figure 56:
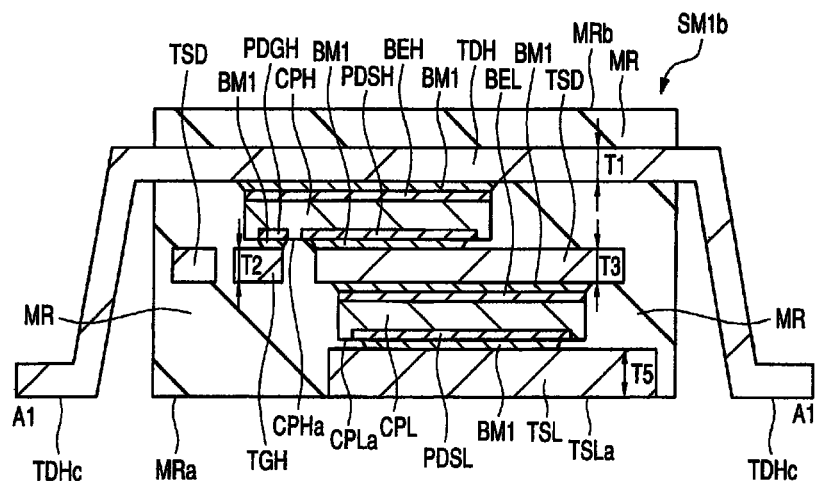
FIG. 56 is a sectional view of a semiconductor device in another embodiment of the invention.
Figure 57:
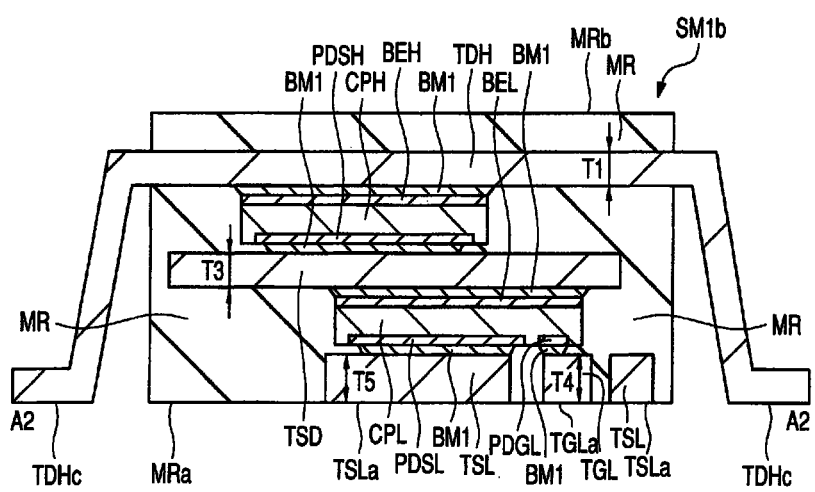
FIG. 57 is a sectional view of a semiconductor device in another embodiment of the invention.
Figure 58:
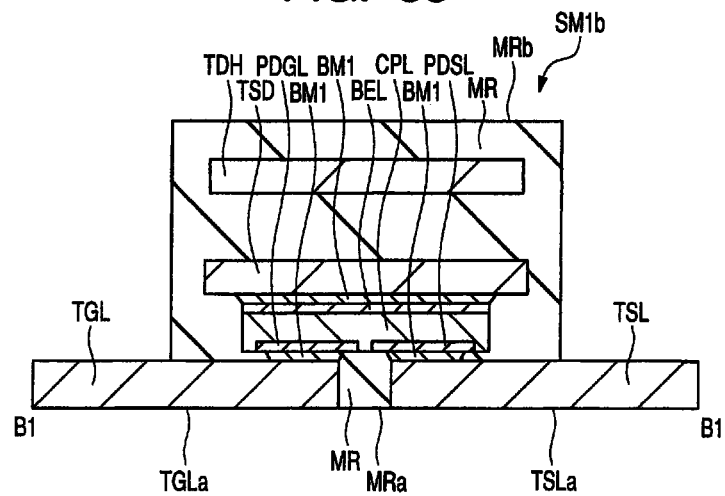
FIG. 58 is a sectional view of a semiconductor device in another embodiment of the invention.
Figure 59:
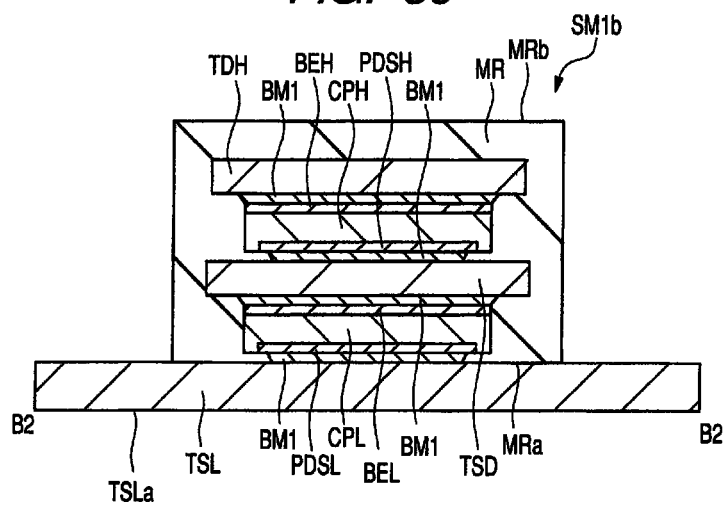
FIG. 59 is a sectional view of a semiconductor device in another embodiment of the invention.
Figure 60:
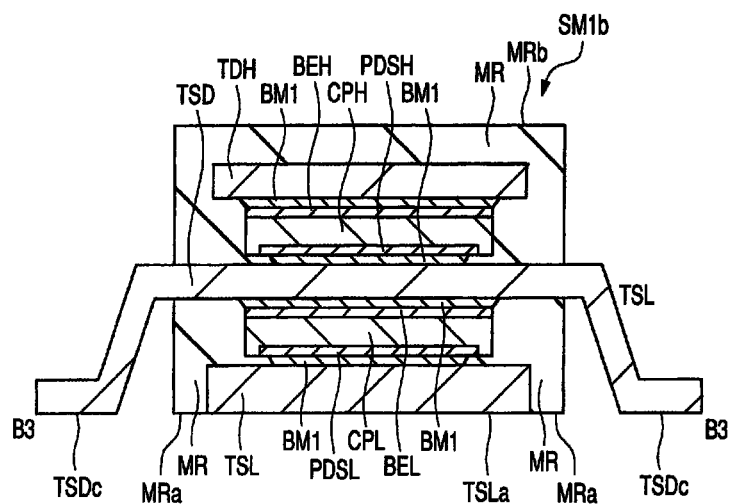
FIG. 60 is a sectional view of a semiconductor device in another embodiment of the invention.
Figure 61:
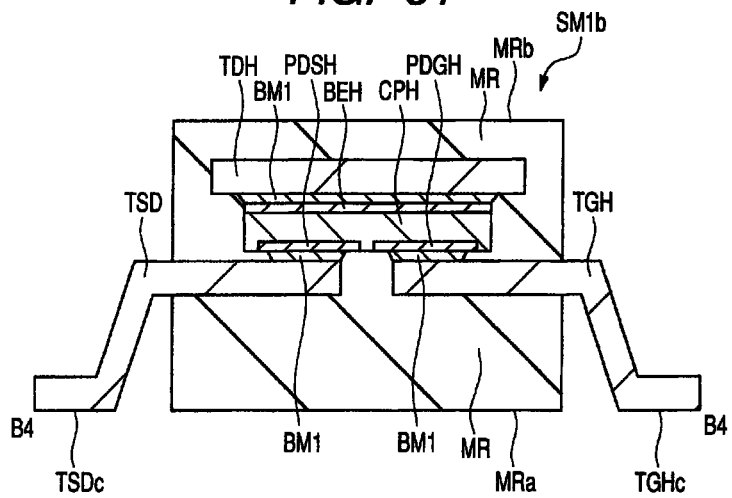
FIG. 61 is a sectional view of a semiconductor device in another embodiment of the invention.
Figure 69:
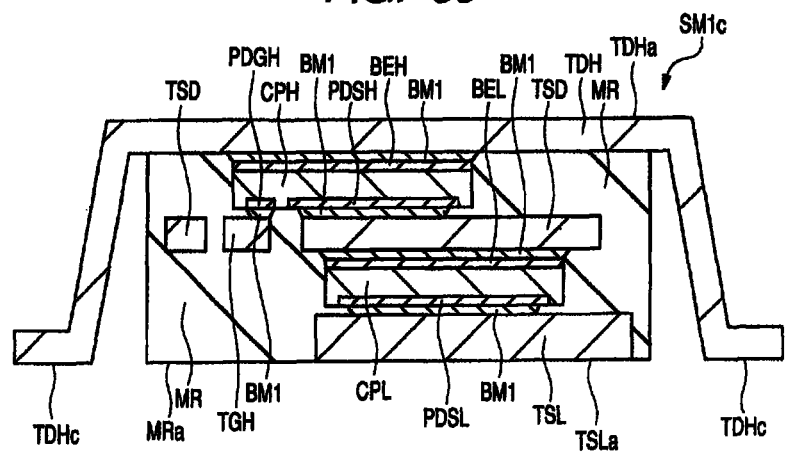
FIG. 69 is a sectional view of a semiconductor device in another embodiment of the invention.
Figure 70:
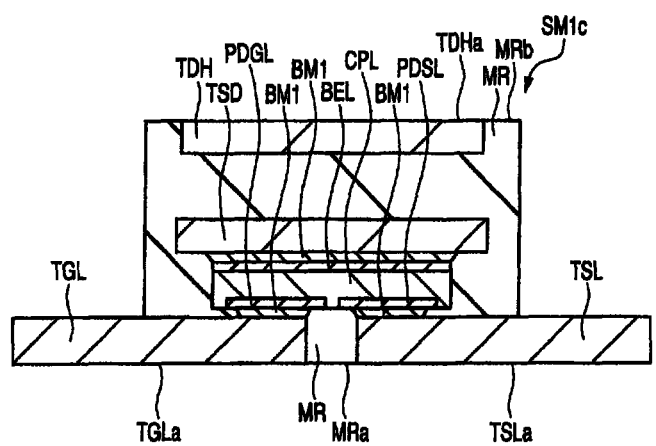
FIG. 70 is a sectional view of a semiconductor device in another embodiment of the invention.

FIG. 69 and FIG. 70 are sectional views of a semiconductor device SM1$c$ in a fifth embodiment and respectively correspond to FIG. 56 and FIG. 58 related to the fourth embodiment.

In the semiconductor device SM1$b$ in the fourth embodiment, the drain terminal TDH is not exposed from the main surface MRb as the upper surface of the encapsulation resin portion MR. In the semiconductor device SM1$c$ in this embodiment, meanwhile, the following measure is taken as illustrated in FIG. 69 and FIG. 70: the main surface TDHa of the drain terminal TDH is exposed from the main surface MRb as the upper surface of the encapsulation resin portion MR. The main surface TDHa of the drain terminal TDH is its main surface on the opposite side to the side where it is opposed to (the back surface of) the semiconductor chip CPH. The other respects in the configuration of the semiconductor device SM1$c$ in this embodiment are substantially the same as those of the semiconductor device SM1$b$ in the fourth embodiment and the description thereof will be omitted.

As an example of manufacturing methods for the semiconductor device SM1$c$ in this embodiment, the following procedure can be taken in the manufacturing process described in relation to the third embodiment: after the formation of the encapsulation resin portion MR, the main surface MRb of the encapsulation resin portion MR is polished. The main surface TDHa of the drain terminal TDH (drain terminal portion TDH1) is thereby exposed from the main surface MRb of the encapsulation resin portion MR. This step of polishing the main surface MRb of the encapsulation resin portion MR can be carried out similarly with the step of polishing the main surface MRa of the encapsulation resin portion MR described in relation to the second embodiment.

In the semiconductor device SM1$c$ in this embodiment, as mentioned above, (the main surface TDHa of) the drain terminal TDH is exposed from the main surface MRb of the encapsulation resin portion MR. In addition to the effects obtained by the third embodiment, therefore, it is possible to further enhance the heat radiation characteristics of the semiconductor device SM1c.

Up to this point, concrete description has been given to the invention made by the present inventors based on its embodiments. However, the invention is not limited to these embodiments and can be variously modified without departing from its subject matter, needless to add.

What is claimed is:

1. A semiconductor device comprising:
   a drain terminal having a first surface and a second surface opposite the first surface;
   a first semiconductor chip disposed over the first surface of the drain terminal;
   a source-drain terminal and a first gate terminal disposed over the first semiconductor chip;
   a second semiconductor chip disposed over the source-drain terminal;
   a source terminal and a second gate terminal disposed over the second semiconductor chip; and
   an encapsulation resin portion having a first main surface, a second main surface opposite the first main surface, a first side surface extending in a first direction, and a second side surface extending in the first direction and facing the first side surface in a second direction perpendicular to the first direction, the first and second side surfaces are positioned between the first and second main surfaces in a thickness direction of the encapsulation resin portion, the encapsulation resin portion sealing the first and second semiconductor chips, a part of the drain terminal, a part of the source-drain terminal, a part of the first gate terminal, a part of the source terminal, and a part of the second gate terminal,
   wherein the first semiconductor chip includes:
   a first back surface opposed to the drain terminal and having a first back surface drain electrode formed therein; and
   a first main surface positioned on the opposite side to the first back surface and having a first source electrode and a first gate electrode formed therein,
   wherein the second semiconductor chip includes:
   a second back surface opposed to the source-drain terminal and having a second back surface drain electrode formed therein; and
   a second main surface positioned on the opposite side to the second back surface and having a second source electrode and a second gate electrode formed therein,
   wherein the first back surface drain electrode of the first semiconductor chip is electrically coupled with the drain terminal through a conductive bonding material,
   wherein the first gate electrode of the first semiconductor chip is electrically coupled with the first gate terminal through the conductive bonding material,
   wherein the first source electrode of the first semiconductor chip is electrically coupled with the source-drain terminal through the conductive bonding material,
   wherein the second back surface drain electrode of the second semiconductor chip is electrically coupled with the source-drain terminal through the conductive bonding material,
   wherein the second gate electrode of the second semiconductor chip is electrically coupled with the second gate terminal through the conductive bonding material,
   wherein the second source electrode of the second semiconductor chip is electrically coupled with the source terminal through the conductive bonding material,
   wherein the second semiconductor chip is shifted in the first direction and disposed over the first semiconductor chip such that the second semiconductor chip does not overlap with the first gate electrode of the first semiconductor chip in a plan view,
   wherein a part of the source-drain terminal projects from the first and second side surfaces of the encapsulation resin portion in the second direction, and
   wherein a part of the source terminal projects from the first and second side surfaces of the encapsulation resin portion in the second direction.

2. The semiconductor device according to claim 1,
   wherein the first semiconductor chip and the second semiconductor chip are identical in size, and
   wherein the shape and arrangement of the first source electrode and the first gate electrode in the first semiconductor chip are the same as the shape and arrangement of the second source electrode and the second gate electrode in the second semiconductor chip.

3. The semiconductor device according to claim 1,
   wherein the arrangement of the second semiconductor chip corresponds to the arrangement obtained by rotating the first semiconductor chip by 180°.

4. The semiconductor device according to claim 1,
   wherein the second semiconductor chip and the first semiconductor chip partly planarly overlap with each other.

5. The semiconductor device according to claim 1,
   wherein the source terminal does not planarly overlap with the first gate electrode of the first semiconductor chip.

6. The semiconductor device according to claim 1,
   wherein the second surface of the drain terminal is exposed from the first main surface of the encapsulation resin portion.

7. The semiconductor device according to claim 1,
   wherein the drain terminal is thicker than the source-drain terminal, the first gate terminal, the source terminal, and the second gate terminal.

8. The semiconductor device according to claim 7,
   wherein part of each of the first and second gate terminals projects from each of the first and second side surfaces of the encapsulation resin portion in the second direction, respectively, and
   wherein the part of each of the source-drain, source, first gate, and second gate terminals is bent outside the encapsulation resin portion.

9. The semiconductor device according to claim 6,
   wherein the drain terminal is not bent.

10. The semiconductor device according to claim 9,
    wherein the first main surface of the encapsulation resin portion is the mounting surface of the semiconductor device.

11. The semiconductor device according to claim 1,
    wherein a high-side MOSFET of a DC-DC converter is formed in the first semiconductor chip, and
    wherein a low-side MOSFET of the DC-DC converter is formed in the second semiconductor chip.

12. The semiconductor device according to claim 11,
    wherein the first back surface drain electrode, first source electrode, and first gate electrode of the first semiconductor chip are respectively electrically coupled to the drain, source, and gate of the high-side MOSFET, and
    wherein the second back surface drain electrode, second source electrode, and second gate electrode of the second semiconductor chip are respectively electrically coupled to the drain, source, and gate of the low-side MOSFET.

13. The semiconductor device according to claim 1,
wherein a part of each of the first and second gate terminals projects from each of the first and second side surfaces of the encapsulation resin portion in the second direction, respectively.

14. The semiconductor device according to claim 13,
wherein a respective width, in the first direction, of the first and second gate terminals projecting from the encapsulation resin portion is narrower than a respective width, in the first direction, of the source-drain terminal and the source terminal projecting from the encapsulation resin portion.

15. The semiconductor device according to claim 13,
wherein respective parts of the source terminal, the source-drain terminal, and parts of the first and second gate terminals projecting from the encapsulation resin portion are bent.

16. The semiconductor device according to claim 1,
wherein respective parts of the source terminal project from a position higher than each of respective parts of the source-drain terminal in the first and second side surfaces of the encapsulation resin portion.

17. The semiconductor device according to claim 1,
wherein the source-drain terminal is disposed over the first source electrode of the first semiconductor chip such that the source-drain terminal overlaps with the first source electrode of the first semiconductor chip in the plan view, and the source terminal is disposed over the second source electrode of the second semiconductor chip such that the source terminal overlaps with the second source electrode of the second semiconductor chip in the plan view.

18. A semiconductor device comprising:
a first semiconductor chip including a high-side MOSFET of a DC-DC converter, the first semiconductor chip having a first obverse surface and a first reverse surface opposite the first obverse surface, a first source electrode pad and a first gate electrode pad formed on the first obverse surface, and a first drain electrode formed on the first reverse surface;
a second semiconductor chip including a low-side MOSFET of a DC-DC converter, the second semiconductor chip having a second obverse surface and a second reverse surface opposite the second obverse surface, a second source electrode pad and a second gate electrode pad formed on the second obverse surface, and a second drain electrode formed on the second reverse surface;
a first terminal having a first top surface and a first bottom surface opposite the first top surface;
a second terminal having a second top surface and a second bottom surface opposite the second top surface;
a third terminal having a third top surface and a third bottom surface opposite the third top surface;
a fourth terminal having a fourth top surface and a fourth bottom surface opposite the fourth top surface;
a fifth terminal having a fifth top surface and a fifth bottom surface opposite the fifth top surface; and
a sealing body having a top surface, a bottom surface opposite the top surface, a first side surface extending in a first direction between the top and bottom surfaces in a thickness direction of the sealing body, and a second side surface extending in the first direction opposite the first side surface in a second direction perpendicular to the first direction and between the top and bottom surfaces in the thickness direction of the sealing body, the sealing body sealing the first and second semiconductor chips and parts of the first, second, third, fourth, and fifth terminals,
wherein the first semiconductor chip is mounted over the first top surface of the first terminal via a conductive adhesive such that the first reverse surface of the first semiconductor chip faces the first top surface of the first terminal, and the first drain electrode of the first semiconductor chip is electrically connected to the first terminal,
wherein the second terminal is mounted over the first source electrode pad of the first semiconductor chip via the conductive adhesive such that the second terminal does not overlap the first gate electrode pad of the first semiconductor chip in a plan view and the second bottom surface of the second terminal faces the first source electrode pad of the first semiconductor chip, and the second terminal is electrically connected to the first source electrode pad of the first semiconductor chip,
wherein the second semiconductor chip is mounted over the second top surface of the second terminal via the conductive adhesive and shifted in the first direction such that the second semiconductor chip does not overlap the first gate electrode pad of the first semiconductor chip in the plan view and the second reverse surface of the second semiconductor chip faces the second top surface of the second terminal, and the second drain electrode of the second semiconductor chip is electrically connected to the second terminal,
wherein the third terminal is mounted over the second source electrode pad of the second semiconductor chip via the conductive adhesive such that the third terminal does not overlap the second gate electrode pad of the second semiconductor chip in the plan view and the third bottom surface of the third terminal faces the second source electrode pad of the second semiconductor chip, and the third terminal is electrically connected to the second source electrode pad of the second semiconductor chip,
wherein the fourth terminal is mounted over the first gate electrode pad of the first semiconductor chip via the conductive adhesive such that the fourth bottom surface of the fourth terminal faces the first gate electrode pad of the first semiconductor chip, and the fourth terminal is electrically connected to the first gate electrode pad of the first semiconductor chip,
wherein the fifth terminal is mounted over the second gate electrode pad of the second semiconductor chip via the conductive adhesive such that the fifth bottom surface of the fifth terminal faces the second gate electrode pad of the second semiconductor chip, and the fifth terminal is electrically connected to the second gate electrode pad of the second semiconductor chip,
wherein the first bottom surface of the first terminal is exposed from the bottom surface of the sealing body, and
wherein parts of the second, third, and fourth terminals project, in the second direction, from the first side surface of the sealing body, and parts of the second, third, and fifth terminals project, in the second direction, from the second side surface of the sealing body.

19. The semiconductor device according to claim 18,
wherein the sealing body has a rectangular shape, and
wherein, in the plan view, a length of each of the first and second side surfaces in the first direction is longer than a length of other respective side surfaces in the second direction.

20. The semiconductor device according to claim 19, wherein the second and third terminals overlap with the first and second side surfaces of the sealing body in the plan view.

21. The semiconductor device according to claim 20, wherein the fourth terminal overlaps with the first side surface of the sealing body in the plan view, and the fifth terminal overlaps with the second side surface of the sealing body in the plan view.

22. The semiconductor device according to claim 21, wherein the first semiconductor chip is mounted over the first top surface of the first terminal such that the first gate electrode pad of the first semiconductor chip is closer to the first side surface of the sealing body than the second side surface of the sealing body in the plan view, and the second semiconductor chip is mounted over the second top surface of the second terminal such that the second gate electrode pad of the second semiconductor chip is closer to the second side surface of the sealing body than the first side surface of the sealing body in the plan view.

23. The semiconductor device according to claim 18, wherein the second terminal is disposed over the first source electrode pad of the first semiconductor chip such that the second terminal overlaps with the first source electrode pad of the first semiconductor chip in the plan view, and the third terminal is disposed over the second source electrode pad of the second semiconductor chip such that the second terminal overlaps with the second source electrode pad of the second semiconductor chip in the plan view.

* * * * *